US012796532B2

(12) United States Patent
Yeh et al.

(10) Patent No.: US 12,796,532 B2
(45) Date of Patent: Nov. 10, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Der-Chyang Yeh, Hsinchu (TW); Chao-Wen Shih, Zhubei City (TW); Sung-Feng Yeh, Taipei City (TW); Ta Hao Sung, Yilan County (TW); Min-Chien Hsiao, Taichung City (TW); Chun-Chiang Kuo, Kaohsiung (TW); Tsung-Shu Lin, New Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 852 days.

(21) Appl. No.: 17/896,840

(22) Filed: Aug. 26, 2022

(65) Prior Publication Data

US 2023/0378012 A1 Nov. 23, 2023

Related U.S. Application Data

(60) Provisional application No. 63/364,825, filed on May 17, 2022.

(51) Int. Cl.

| | |
|---|---|
| ***H10W 74/01*** | (2026.01) |
| ***H10W 70/09*** | (2026.01) |
| ***H10W 74/10*** | (2026.01) |
| ***H10W 90/00*** | (2026.01) |
| *H10W 70/60* | (2026.01) |

(Continued)

(52) U.S. Cl.

CPC ....... *H10W 74/147* (2026.01); *H10W 74/019* (2026.01); *H10W 74/141* (2026.01); *H10W 90/00* (2026.01); *H10W 70/09* (2026.01); *H10W 70/60* (2026.01); *H10W 72/9415* (2026.01); *H10W 72/942* (2026.01); *H10W 72/944* (2026.01); *H10W 72/952* (2026.01); *H10W 80/327* (2026.01); *H10W 80/333* (2026.01); *H10W 90/722* (2026.01); *H10W 90/792* (2026.01)

(58) Field of Classification Search

CPC ............. H01L 25/0652; H01L 25/0655; H01L 25/0657; H01L 23/562; H01L 23/31; H01L 23/29; H01L 23/28

See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

*Primary Examiner* — Jay C Chang

(74) *Attorney, Agent, or Firm* — Slater Matsil, LLP

(57) ABSTRACT

In an embodiment, a device includes: a first integrated circuit die; a second integrated circuit die; a gap-fill dielectric between a first sidewall of the first integrated circuit die and a second sidewall of the second integrated circuit die; a protective cap overlapping the gap-fill dielectric, the first sidewall of the first integrated circuit die, and the second sidewall of the second integrated circuit die; and an isolation layer around the protective cap, the isolation layer disposed on the first integrated circuit die, and the second integrated circuit die.

20 Claims, 48 Drawing Sheets

(51) Int. Cl.

| | |
|---|---|
| *H10W 72/90* | (2026.01) |
| *H10W 80/00* | (2026.01) |

(56) References Cited

U.S. PATENT DOCUMENTS

| | | | | |
|---|---|---|---|---|
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2016/0324016 | A1* | 11/2016 | Bellman | C03C 17/42 |
| 2021/0118847 | A1* | 4/2021 | Chuang | H01L 24/24 |

* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/364,825, filed on May 17, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
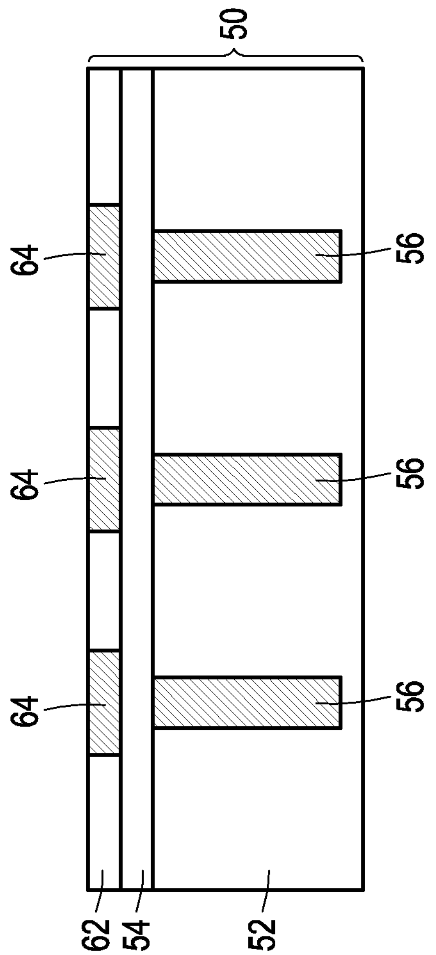
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a die structure includes multiple tiers (or layer) of integrated circuit dies. Gap-filling dielectrics are formed between the integrated circuit dies of each tier. An isolation layer and a protective cap are disposed between two of the tiers, where the protective cap is disposed above and/or below portions of the gap-filling dielectrics. The protective cap is formed of a ductile material that protects the gap-filling dielectrics during processing by absorbing stress, such as stress from mechanical forces or thermal treatments. Protecting the gap-filling dielectrics can reduce the risk of cracks forming and/or propagating in the gap-filling dielectrics, thereby increasing the reliability of the die structure.

FIG. 1 is a cross-sectional view of an integrated circuit die 50. The integrated circuit die 50 will be bonded to other dies in subsequent processing to form a die structure. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (not separately illustrated) are disposed at the active surface of the semiconductor substrate 52. The devices may be active devices (e.g., transistors, diodes, etc.), capacitors, resistors, etc. An interconnect structure 54 is disposed over the active surface of the semiconductor substrate 52. The interconnect structure 54 interconnects the devices to form an integrated circuit. The interconnect structure 54 may be formed of, for example, metallization patterns in dielectric layers. The dielectric layers may be, e.g., low-k dielectric layers. The metallization patterns include metal lines and vias, which may be formed in the dielectric layers by a damascene process, such as a single damascene process, a dual damascene process, or the like. The metallization patterns may be formed of a suitable conductive material, such as copper, tungsten, aluminum, silver, gold, a combination thereof, or the like. The metallization patterns are electrically coupled to the devices.

Optionally, conductive vias 56 extend into the interconnect structure 54 and/or the semiconductor substrate 52. The conductive vias 56 are electrically coupled to the metallization patterns of the interconnect structure 54. As an example to form the conductive vias 56, recesses can be formed in the interconnect structure 54 and/or the semiconductor substrate 52 by, for example, etching, milling, laser techniques, a combination thereof, or the like. A thin barrier layer may be conformally deposited in the recesses, such as by chemical vapor deposition (CVD), atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 54 or the semiconductor substrate 52 by, for example, a chemical-mechanical polish (CMP). The remaining portions of the barrier layer and conductive material in the recesses form the conductive vias 56. After their initial formation, the conductive vias 56 may be buried in the semiconductor substrate 52. The semiconductor substrate 52 may be thinned in subsequent processing to expose the conductive vias 56 at the inactive surface of the semiconductor substrate 52. After the exposure process, the conductive vias 56 are through-substrate vias, such as through-silicon vias.

In this embodiment, the conductive vias 56 are formed by a via-first process, such that the conductive vias 56 extend into the semiconductor substrate 52 but not the interconnect structure 54. The conductive vias 56 formed by a via-first process are connected to a lower metallization pattern of the interconnect structure 54. In another embodiment, the conductive vias 56 are formed by a via-middle process, such that the conductive vias 56 extend through a portion of the interconnect structure 54 and into the semiconductor substrate 52. The conductive vias 56 formed by a via-middle process are connected to a middle metallization pattern of the interconnect structure 54. In yet another embodiment, the conductive vias 56 are formed by a via-last process, such that the conductive vias 56 extend through an entirety of the interconnect structure 54 and into the semiconductor substrate 52. The conductive vias 56 formed by a via-last process are connected to an upper metallization pattern of the interconnect structure 54.

A dielectric layer 62 is over the interconnect structure 54, at the front side of the integrated circuit die 50. The dielectric layer 62 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as polybenzoxazole (PBO), polyimide, a BCB-based polymer, or the like; a combination thereof; or the like. The dielectric layer 62 may be formed, for example, by CVD, spin coating, lamination, or the like. In some embodiments, the dielectric layer 62 is formed of TEOS-based silicon oxide. Optionally, one or more passivation layer(s) (not separately illustrated) are disposed between the dielectric layer 62 and the interconnect structure 54.

Die connectors 64 extend through the dielectric layer 62. The die connectors 64 may include conductive pillars, pads, or the like, to which external connections can be made. In some embodiments, the die connectors 64 include bond pads at the front side of the integrated circuit die 50, and include bond pad vias that connect the bond pads to the upper metallization pattern of the interconnect structure 54. In such embodiments, the die connectors 64 (including the bond pads and the bond pad vias) may be formed by a damascene process, such as a single damascene process, a dual damascene process, or the like. The die connectors 64 can be formed of a conductive material, such as a metal, such as copper, aluminum, or the like, which can be formed by, for example, plating, or the like.

Optionally, solder regions (not separately illustrated) may be disposed on the die connectors 64 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 64. Chip probe testing may be performed on the integrated circuit die 50 to ascertain whether the integrated circuit die 50 is a known good die (KGD). Thus, only integrated circuit dies 50, which are KGDs, undergo subsequent processing are bonded to other dies, and dies which fail the chip probe testing are not bonded to other dies. After testing, the solder regions may be removed. In some embodiments, a planarization process such as a chemical mechanical polish (CMP), an etch-back process, combinations thereof, or the like is utilized.

Optionally, chip probe (CP) testing may be performed on the integrated circuit die 50 to ascertain whether the integrated circuit die 50 is a known good die (KGD). Testing structures (not separately illustrated) may be included to aid in the testing of the integrated circuit die 50. The testing structures may include, for example, testing pads that may be coupled to a CP for testing. Thus, only integrated circuit dies 50, which are KGDs, undergo subsequent processing, and other dies, which fail the CP testing, are not further processed.

FIGS. 2-21 are views of intermediate stages in the manufacturing of a die structure 100, in accordance with some embodiments. FIGS. 2-6 and 8-20 are cross-sectional views and FIGS. 7A and 7B are top-down views. The die structure 100 is formed by bonding multiple integrated circuit dies 50 together in a device region 102D. The device region 102D will be singulated to form a die structure 100. Processing of one device region 102D is illustrated, but it should be appreciated that any number of device regions 102D can be simultaneously processed to form any number of die structures 100.

The die structure 100 is a component that may be subsequently packaged to form an integrated circuit package. The integrated circuit dies 50 of the die structure 100 may be heterogeneous dies. Packaging the die structure 100 in lieu of packaging the dies individually may allow heterogeneous dies to be integrated with a smaller footprint. The die structure 100 may be an system-on-integrated-chips (SoIC) device, although other types of devices may be formed.

Figure 2:
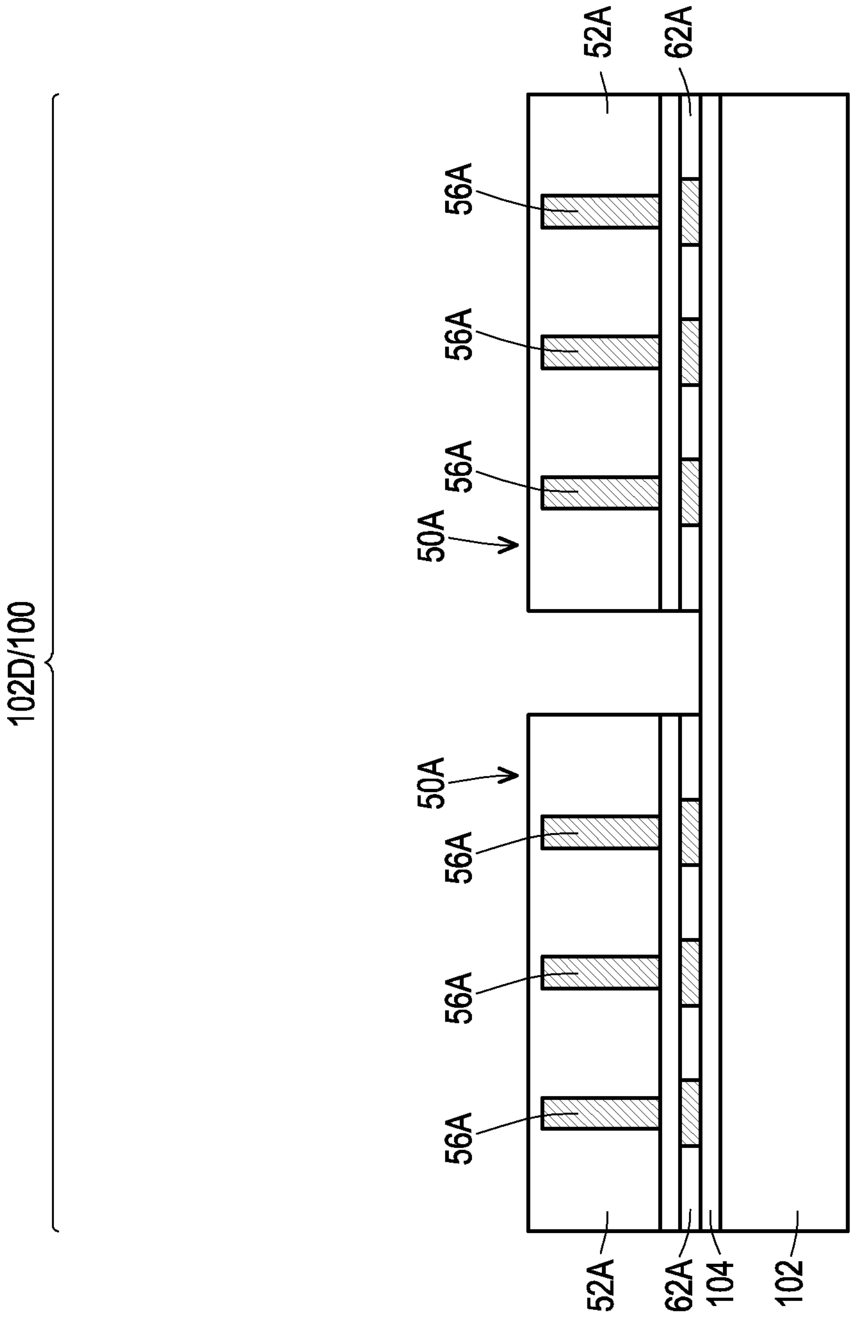
FIGS. 2-21 are views of intermediate stages in the manufacturing of a die structure, in accordance with some embodiments.

In FIG. 2, first integrated circuit dies 50 (e.g., integrated circuit dies 50A) are attached to a carrier substrate 102 in a face-down manner, such that the front sides of the integrated circuit dies 50 are attached to the carrier substrate 102. The dielectric layers 62A of the respective integrated circuit dies 50A are attached to the carrier substrate 102. The integrated circuit dies 50A may be placed by, e.g., a pick-and-place process. In the illustrated embodiment, two integrated circuit dies 50A are placed in the device region 102D, although any desired quantity of integrated circuit dies 50A may be placed in the device region 102D. The integrated circuit dies 50A may be logic devices, such as CPUs, GPUs, SoCs, microcontroller, or the like.

The carrier substrate 102 may be a glass carrier substrate, a ceramic carrier substrate, or the like. The carrier substrate 102 may be a wafer, such that multiple packages can be formed on the carrier substrate 102 simultaneously.

The integrated circuit dies 50A may be attached to the carrier substrate 102 by bonding the integrated circuit dies 50A to the carrier substrate 102 with a bonding layer 104. The bonding layer 104 is on front sides of the integrated circuit dies 50A and on a surface of the carrier substrate 102. In some embodiments, the bonding layer 104 is a release layer, such as an epoxy-based thermal-release material, which loses its adhesive property when heated, such as a light-to-heat-conversion (LTHC) release coating; an ultraviolet (UV) glue, which loses its adhesive property when exposed to UV light; or the like. In some embodiments, the bonding layer 104 is an oxide layer such as a layer of silicon oxide. The bonding layer 104 may include any desired quantity of release layers and/or adhesive films. The bonding layer 104 may be applied to front sides of the integrated circuit dies 50A, may be applied over the surface of the carrier substrate 102, and/or the like. For example, the bonding layer 104 may be applied to the front sides of the integrated circuit dies 50A before singulating to separate the integrated circuit dies 50A.

Figure 3:
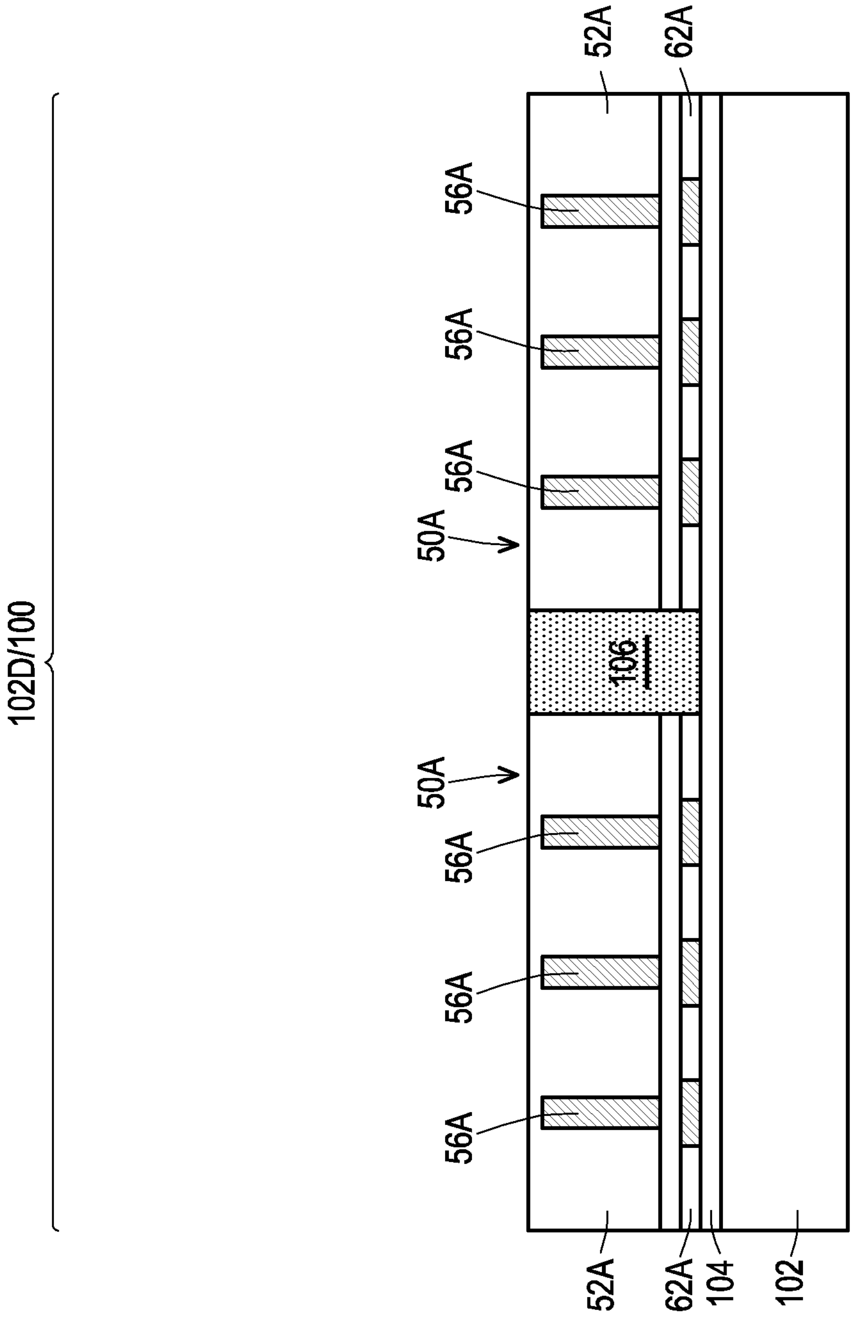

In FIG. 3, a gap-filling dielectric 106 is formed between the integrated circuit dies 50A in the device region 102D. The gap-filling dielectric 106 may be formed of a dielectric material, such as an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Initially, the gap-filling dielectric 106 may bury or cover the integrated circuit dies 50A, such that the top surface of the gap-filling dielectric 106 is above the surfaces of the integrated circuit dies 50A. A removal process may be performed to level surfaces of the gap-filling dielectric 106 with the back side surfaces of the integrated circuit dies 50A. In some embodiments, a planarization process such as a chemical mechanical polish (CMP), an etch-back process, combinations thereof, or the like is utilized. After the planarization process, surfaces of the gap-filling dielectric 106 and the integrated circuit dies 50A (including the semiconductor substrates 52A) are substantially coplanar (within process variations). The conductive vias 56A of the integrated circuit dies 50A may remain buried by the semiconductor substrates 52A after the removal process.

Figure 4:
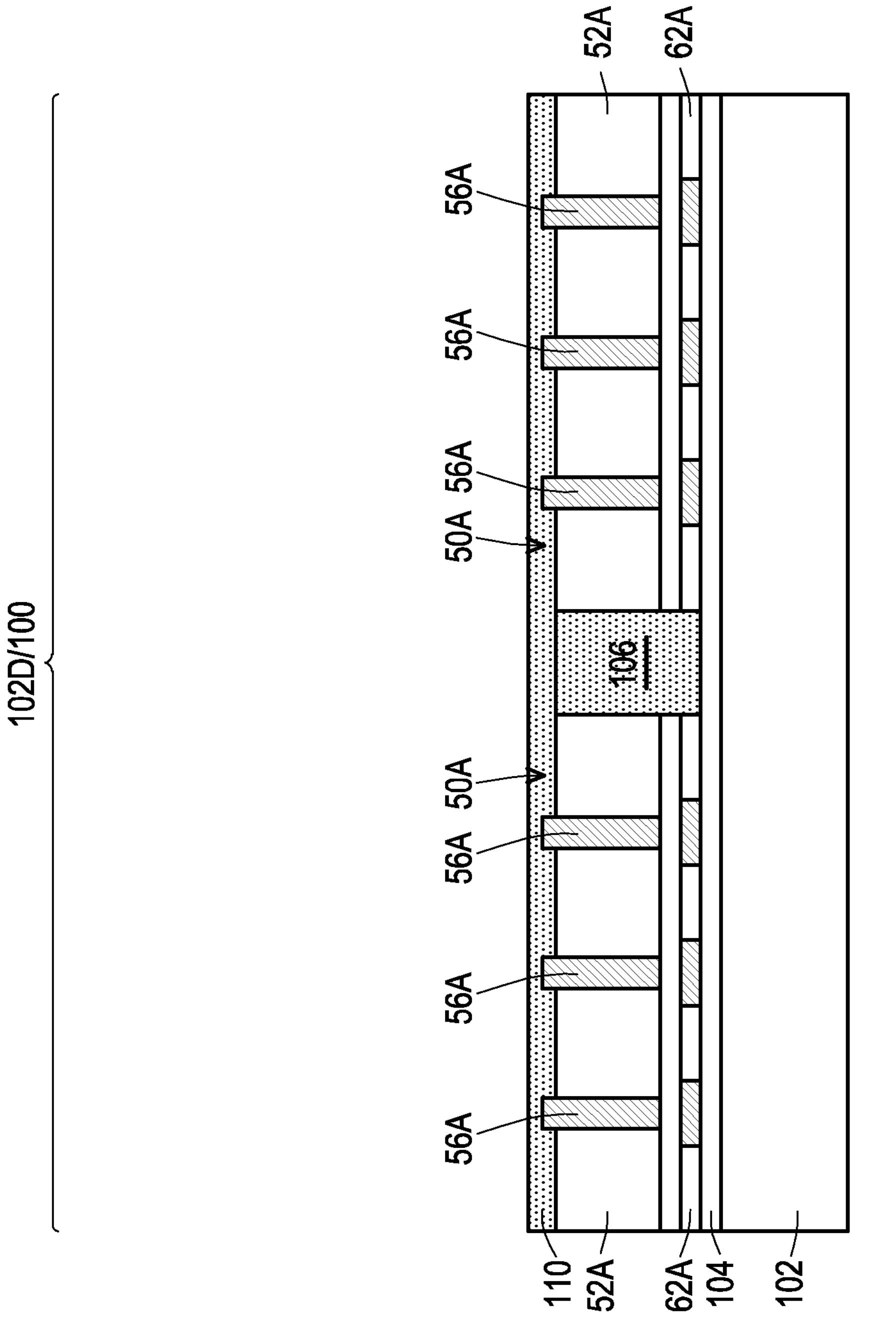

In FIG. 4, the semiconductor substrates 52A are thinned to expose the conductive vias 56A. Portions of the gap-filling dielectric 106 may also be removed by the thinning process. The thinning process may be, for example, a chemical-mechanical polish (CMP), a grinding process, an etch-back process, the like, or a combination thereof, which is performed at the back sides of the integrated circuit dies 50A. The semiconductor substrates 52A are then recessed to expose portions of the sidewalls of the conductive vias 56A. The recessing may be by an etching process, such as a dry etch, a wet etch, or combinations thereof. After the recessing, the conductive vias 56A protrude from the inactive surfaces of the semiconductor substrates 52A.

An isolation layer 110 is then formed on the gap-filling dielectric 106 and the back sides of the integrated circuit dies 50A. The isolation layer 110 is around portions of the sidewalls of the conductive vias 56A of each integrated circuit die 50A. The isolation layer 110 may bury or cover the conductive vias 56A, such that the top surface of the isolation layer 110 is above the surfaces of the integrated circuit dies conductive vias 56A. The isolation layer 110 can help electrically isolate the conductive vias 56A from one another, thus avoiding shorting, and can also be utilized in a subsequent bonding process. The isolation layer 110 is formed of a dielectric material. The dielectric material can be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Other suitable dielectric materials, such as a low temperature polyimide material, polybenzoxazole (PBO), an encapsulant, combinations thereof, or the like may also be utilized.

As subsequently described for FIGS. 5-6, a protective cap 114 (see FIG. 6) will be formed in the isolation layer 110. The protective cap 114 covers the portion of the gap-filling dielectric 106 between the integrated circuit dies 50A, and protects the gap-filling dielectric 106 during subsequent processing. The protective cap 114 is formed of a ductile material that absorbs stress in subsequent processing, such as stress from mechanical forces or thermal treatments, so as to reduce the stress exerted on the gap-filling dielectric 106. In other words, the protective cap 114 is a ductile crack-stopping structure. The gap-filling dielectric 106 may be formed of a brittle material (e.g., an oxide) and protecting the brittle material from stress can reduce the risk of cracks forming and/or propagating in the gap-filling dielectric 106 during subsequent processing. The risk of damage to the components of the die structure 100 (e.g., integrated circuit dies, subsequently formed die connectors, etc.) may be reduced, thereby increasing the reliability of the die structure 100.

Figure 5:
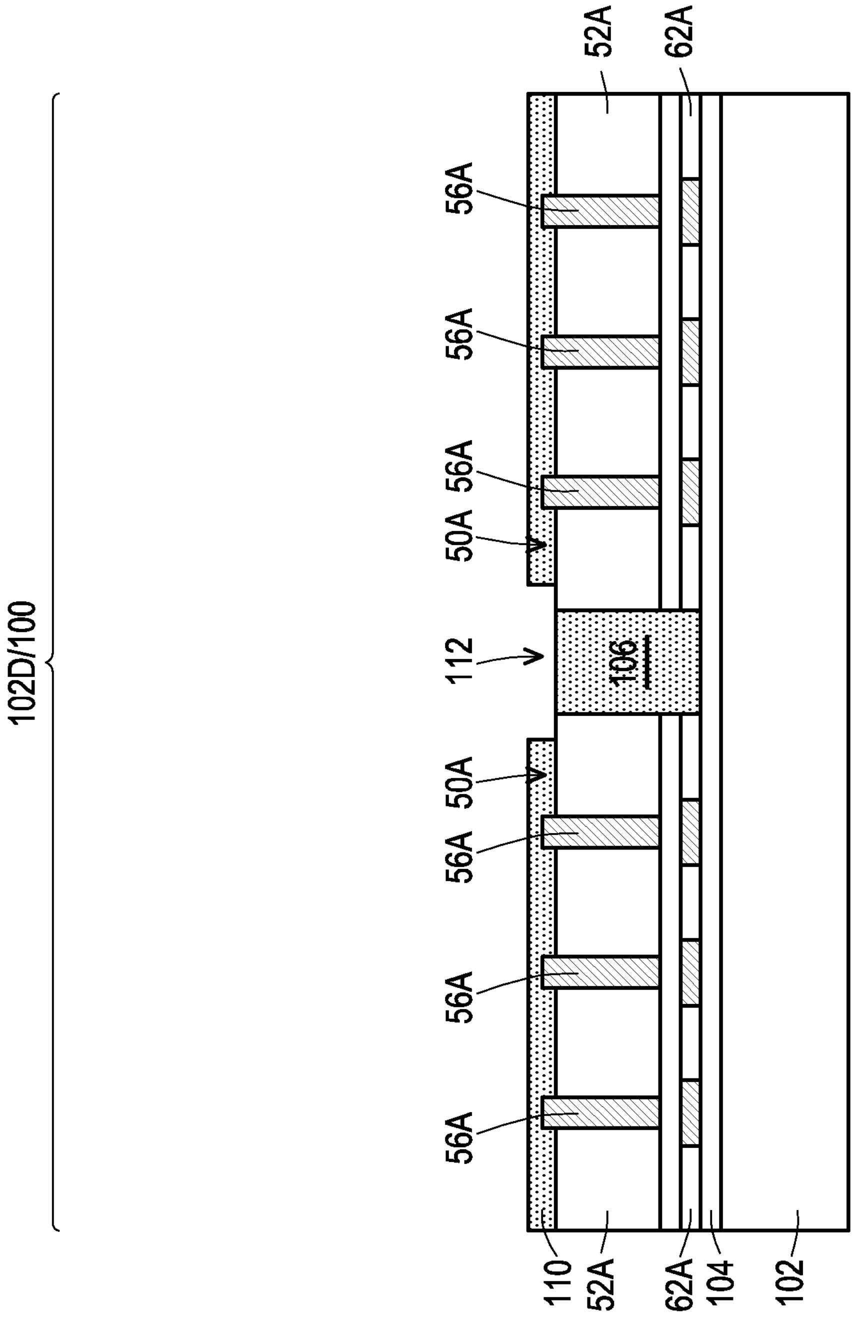

In FIG. 5, an opening 112 for the protective cap is patterned in the isolation layer 110. The opening 112 may be patterned using acceptable photolithography and etching techniques. The opening 112 exposes the gap-filling dielectric 106. The opening 112 may also expose portions of the back sides of the integrated circuit dies 50A (e.g., the inactive surfaces of the semiconductor substrates 52A).

Figure 6:
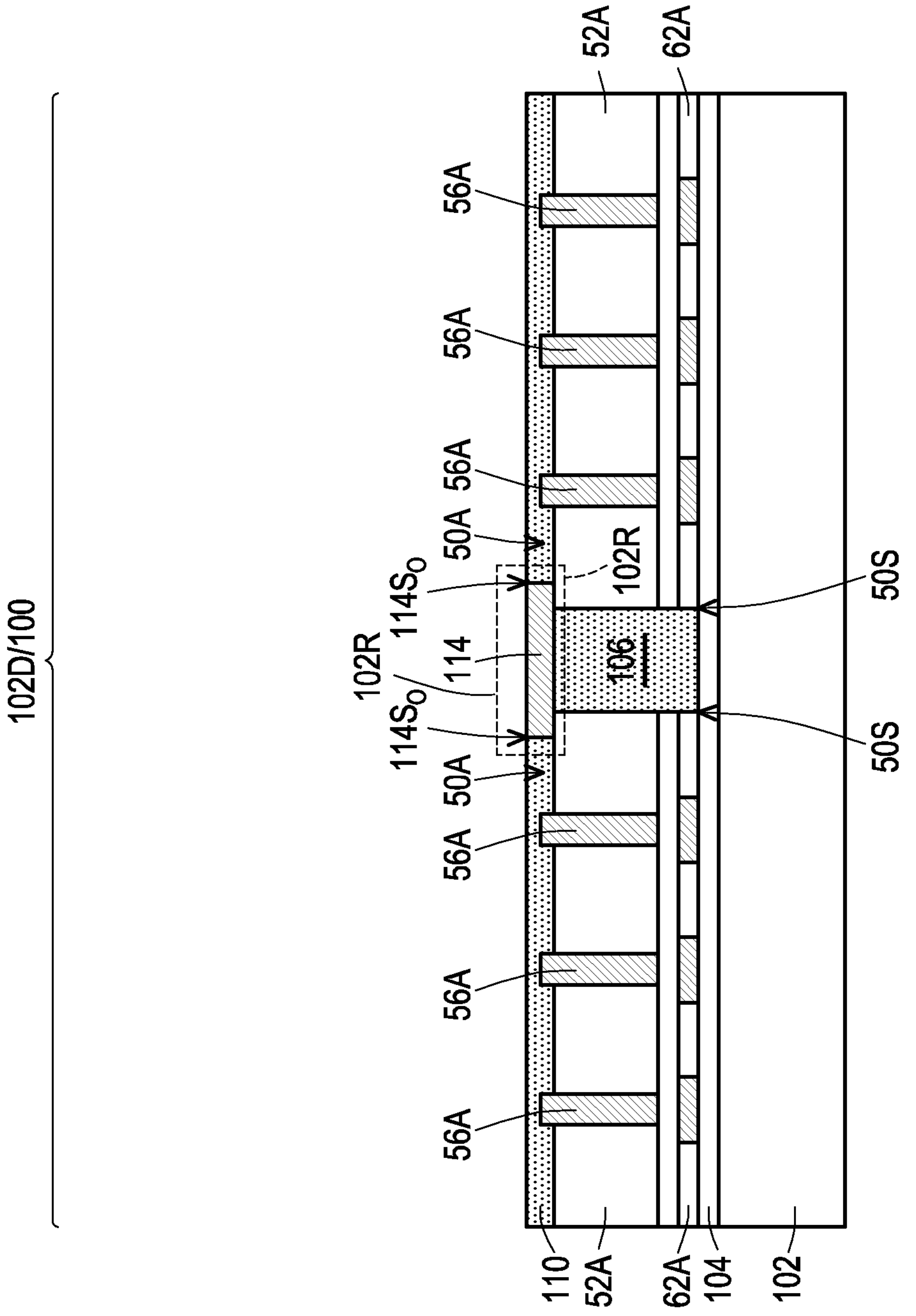
Figure 7B:
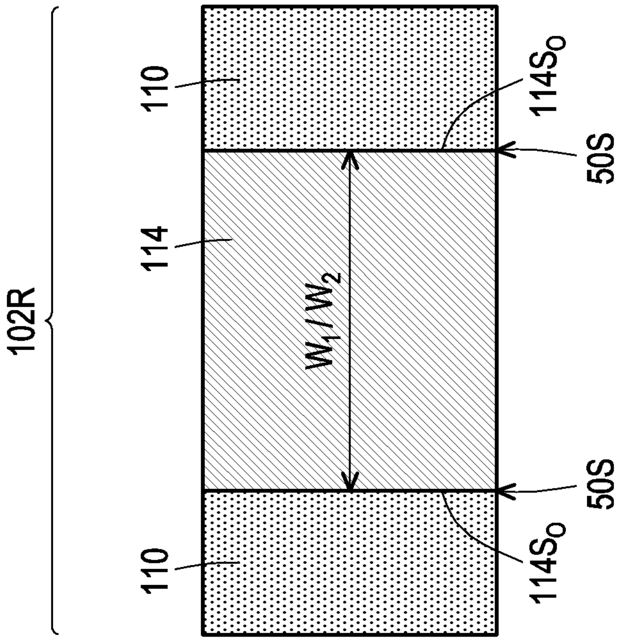
Figure 7A:
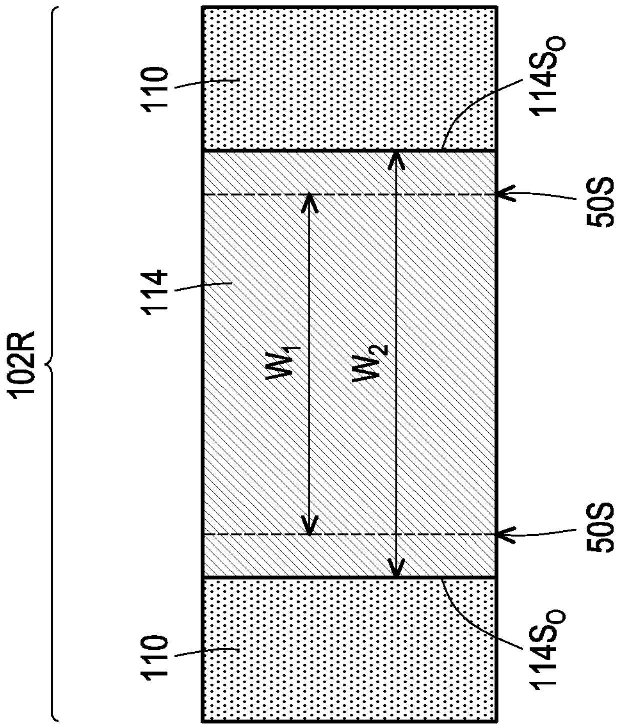

In FIG. 6, the protective cap 114 is formed in the opening 112. The isolation layer 110 is around the protective cap 114. The protective cap 114 extends through the isolation layer 110 to physically contact the gap-filling dielectric 106. The protective cap 114 may also contact the back sides of the integrated circuit dies 50A (e.g., the inactive surfaces of the semiconductor substrates 52A). The protective cap 114 is formed of a ductile material that is capable of absorbing stress. The ductile material can be a metal, such as gold, copper, aluminum, an alloy thereof, or the like, which may be formed by plating or the like. Other suitable ductile materials may also be utilized. The ductile material may have an elongation in the range of 10% to 100%.

As an example to form the protective cap 114, a seed layer (not separately illustrated) may be formed on the isolation layer 110 and in the opening 112. In some embodiments, the seed layer is a metal layer, which may be a single layer or a composite layer including a plurality of sub-layers formed of different materials. In some embodiments, the seed layer includes a tantalum layer and a copper layer over the titanium layer. The seed layer may be formed using, for example, physical vapor deposition (PVD) or the like. A ductile material, such as one of the previously described metals, is then plated on the seed layer. A removal process may be performed to remove excess material from the top surface of the isolation layer 110. In some embodiments, a planarization process such as a chemical mechanical polish (CMP), an etch-back process, combinations thereof, or the like is utilized. The remaining portions of the seed layer and ductile material in the opening 112 forms the protective cap 114. After the planarization process, surfaces of the protective cap 114 and the isolation layer 110 are substantially coplanar (within process variations). The thickness of the protective cap 114 is substantially equal (within process variations) to the thickness of the isolation layer 110.

The outer sidewalls 114$S_O$ of the protective cap 114 are disposed above the integrated circuit dies 50A and/or the gap-filling dielectric 106. The protective cap 114 overlaps the gap-filling dielectric 106 and the opposing sidewalls 50S of the integrated circuit dies 50A that face the gap-filling dielectric 106. FIGS. 7A and 7B are top-down views of a region 102R in FIG. 6, showing aspects of the isolation layer 110, the protective cap 114, and the sidewalls 50S of the integrated circuit dies 50A. The gap-filling dielectric 106 has a width $W_1$ between the sidewalls 50S of the integrated circuit dies 50A. The protective cap 114 has a width $W_2$ between the outer sidewalls 114$S_O$ of the protective cap 114. The width $W_1$ and the width $W_2$ are both measured in the same direction and in the same cross-section (e.g., the cross-section of FIG. 6). In some embodiments, the width $W_1$ of the gap-filling dielectric 106 is at least 50 μm and the width $W_2$ of the protective cap 114 is at least 50 μm. The width $W_2$ of the protective cap 114 is at least as large as the width $W_1$ of the gap-filling dielectric 106. In some embodiments, the width $W_2$ of the protective cap 114 is greater than the width $W_1$ of the gap-filling dielectric 106, as shown by FIG. 7A, such that the outer sidewalls 114$S_O$ of the protective cap 114 are offset from the sidewalls 50S of the integrated circuit dies 50A. In some embodiments, the width $W_2$ of the protective cap 114 is substantially equal (within process variations) to the width $W_1$ of the gap-filling dielectric 106, as shown by FIG. 7B, such that the outer sidewalls 114$S_O$ of the protective cap 114 are aligned with the sidewalls 50S of the integrated circuit dies 50A. Forming the protective cap 114 so that the width $W_2$ of the protective cap 114 is at least as large as the width $W_1$ of the gap-filling dielectric 106 allows the protective cap 114 to completely cover the underlying portion of the gap-filling dielectric 106 in the cross-section of FIG. 6, which helps provide a desired amount of protection to the gap-filling dielectric 106.

Figure 8:
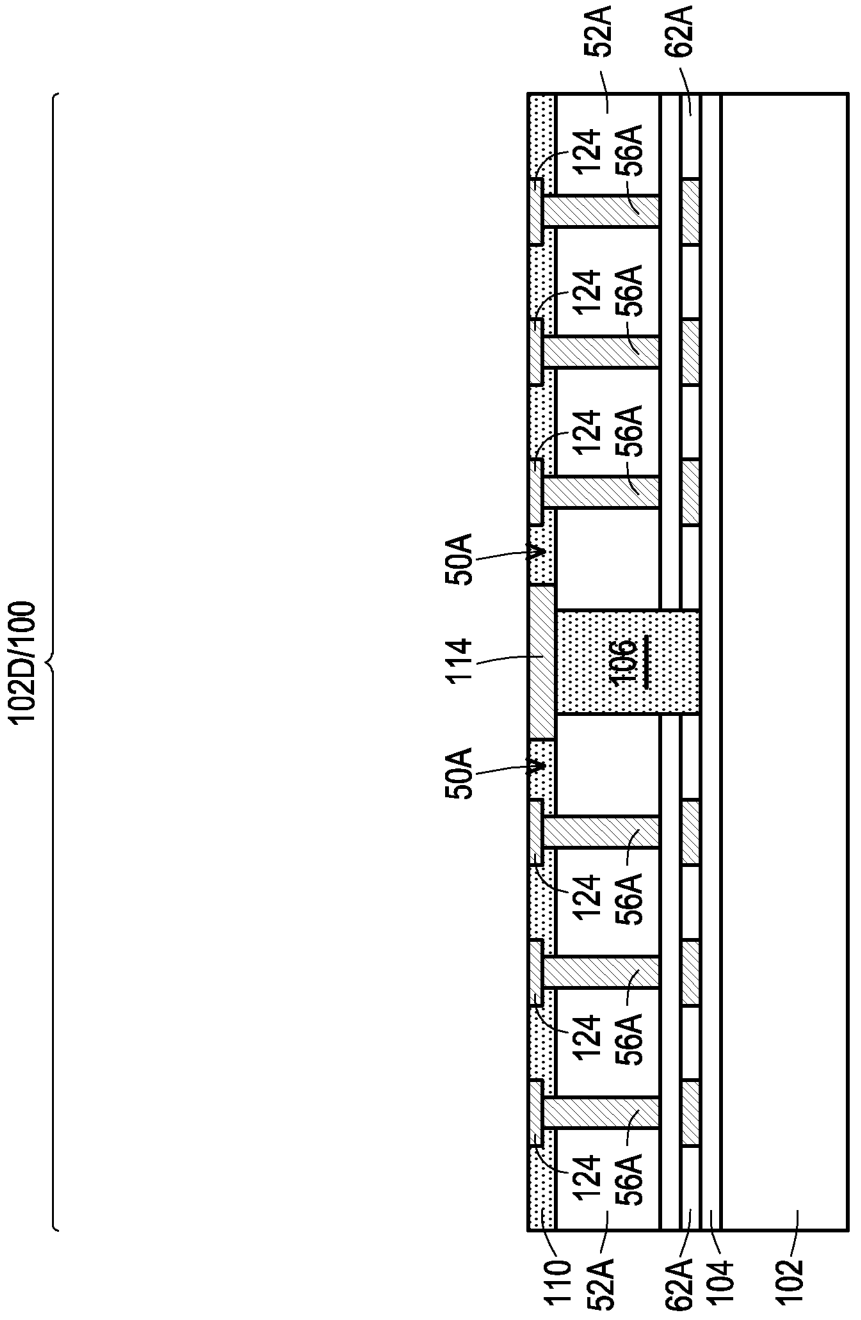

In FIG. 8, die connectors 124 are formed in the isolation layer 110. The die connectors 124 are connected to the conductive vias 56A. The die connectors 124 may be formed by a damascene process, such as a single damascene process, a dual damascene process, or the like. The die connectors 124 can be formed of a conductive material, such as a metal, such as copper, aluminum, or the like, which can be formed by, for example, plating, or the like. In some embodiments, a planarization process such as a chemical mechanical polish (CMP), an etch-back process, combinations thereof, or the like is performed on the die connectors 124, the protective cap 114, and the isolation layer 110. After the planarization process, surfaces of the die connectors 124, the protective cap 114, and the isolation layer 110 are substantially coplanar (within process variations).

Figure 9:
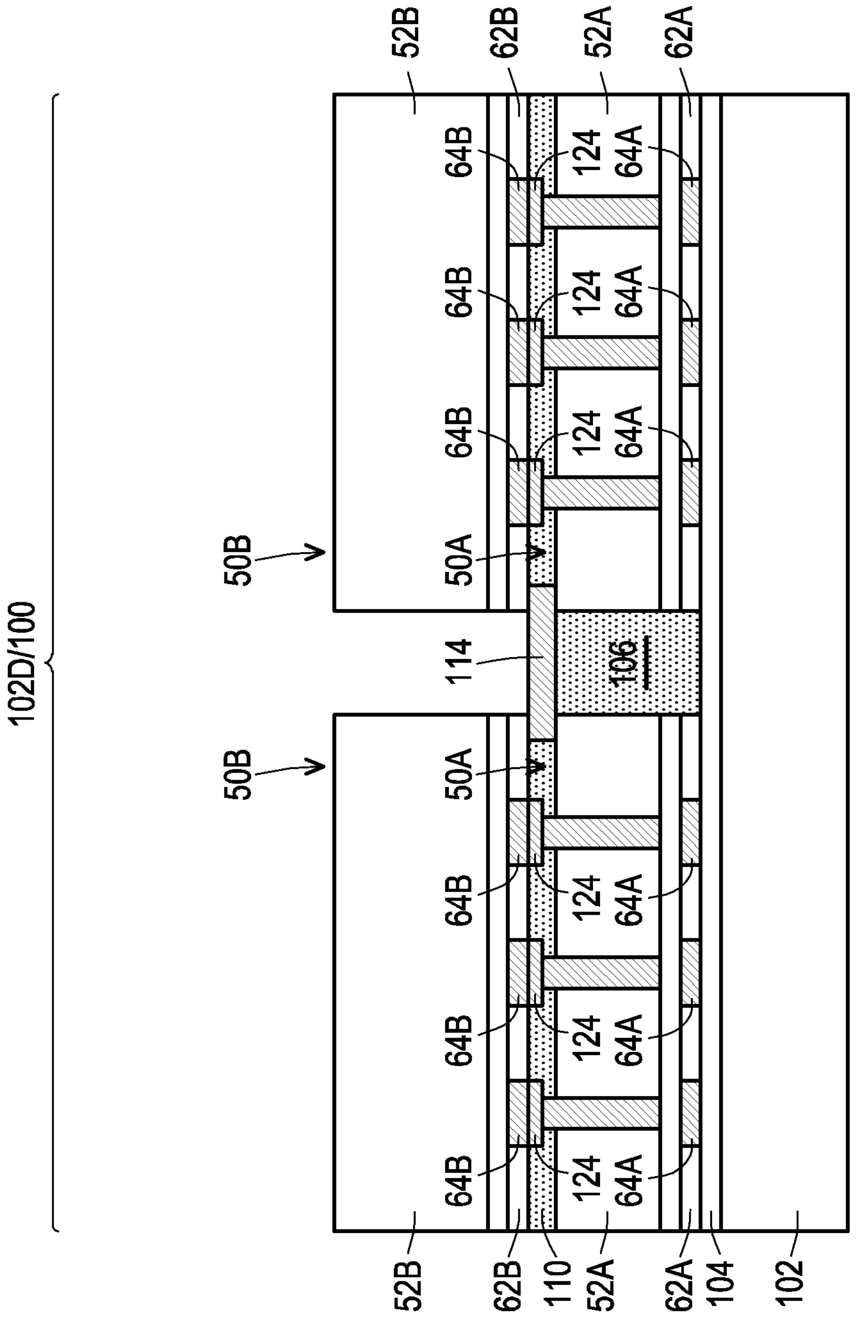

In FIG. 9, second integrated circuit dies 50 (e.g., integrated circuit dies 50B) are attached to the isolation layer 110 and the die connectors 124, such that the front-sides of the integrated circuit dies 50B face the back-sides of the integrated circuit dies 50A (see FIG. 8). In the illustrated embodiment, one integrated circuit die 50B is attached above each integrated circuit die 50A, although any desired quantity of integrated circuit dies 50B may be attached above each integrated circuit die 50A. The integrated circuit dies 50B may be memory devices, such as dynamic random access memory (DRAM) dies, static random access memory (SRAM) dies, hybrid memory cube (HMC) modules, high bandwidth memory (HBM) modules, or the like.

The integrated circuit dies 50B may be attached to the isolation layer 110 and the die connectors 124 by placing the integrated circuit dies 50B on the isolation layer 110 and the die connectors 124, then bonding the integrated circuit dies 50B to the isolation layer 110 and the die connectors 124. The integrated circuit dies 50B may be placed by, e.g., a pick-and-place process. As an example of the bonding process, the integrated circuit dies 50B may be bonded to the isolation layer 110 and the die connectors 124 by hybrid bonding. The dielectric layers 62B of the integrated circuit dies 50B are directly bonded to the isolation layer 110 through dielectric-to-dielectric bonding, without using any adhesive material (e.g., die attach film). The die connectors 64B of the integrated circuit dies 50B are directly bonded to respective die connectors 124 through metal-to-metal bonding, without using any eutectic material (e.g., solder). The bonding may include a pre-bonding and an annealing. During the pre-bonding, a small pressing force is applied to press the integrated circuit dies 50B against the isolation layer 110. The pre-bonding is performed at a low temperature, such as about room temperature, such as a temperature in the range of 15° C. to 30° C., and after the pre-bonding, the dielectric layers 62B are bonded to the isolation layer 110. The bonding strength is then improved in a subsequent annealing step, in which the isolation layer 110, the die connectors 124, the dielectric layers 62B, and the die connectors 64B are annealed. After the annealing, direct bonds such as fusion bonds are formed, bonding the isolation layer 110 to the dielectric layers 62B. For example, the bonds can be covalent bonds between the material of the isolation layer 110 and the material of the dielectric layers 62B. The die connectors 124 are connected to the die connectors 64B with a one-to-one correspondence. The die connectors 124 and the die connectors 64B may be in physical contact after the pre-bonding, or may expand to be brought into physical contact during the annealing. Further, during the annealing, the material of the die connectors 124 and the die connectors 64B (e.g., copper) intermingles, so that metal-to-metal bonds are also formed. Hence, the resulting bonds between the integrated circuit dies 50B, the isolation layer 110, the die connectors 124 are hybrid bonds that include both dielectric-to-dielectric bonds and metal-to-metal bonds.

In this embodiment, the integrated circuit dies 50B do not include conductive vias 56 (previously described for FIG. 1). The die structure 100 will include two layers of integrated circuit dies 50, and the conductive vias 56 are excluded from the integrated circuit dies 50B because the integrated circuit dies 50B are the upper layer of integrated circuit dies 50 in the die structure 100. In other embodiments, the die structure 100 includes more than two layers of integrated circuit dies 50, such as three layers of integrated circuit dies 50, and the conductive vias 56 may be formed in other layers of integrated circuit dies 50 besides the upper layer of integrated circuit dies 50.

Figure 10:
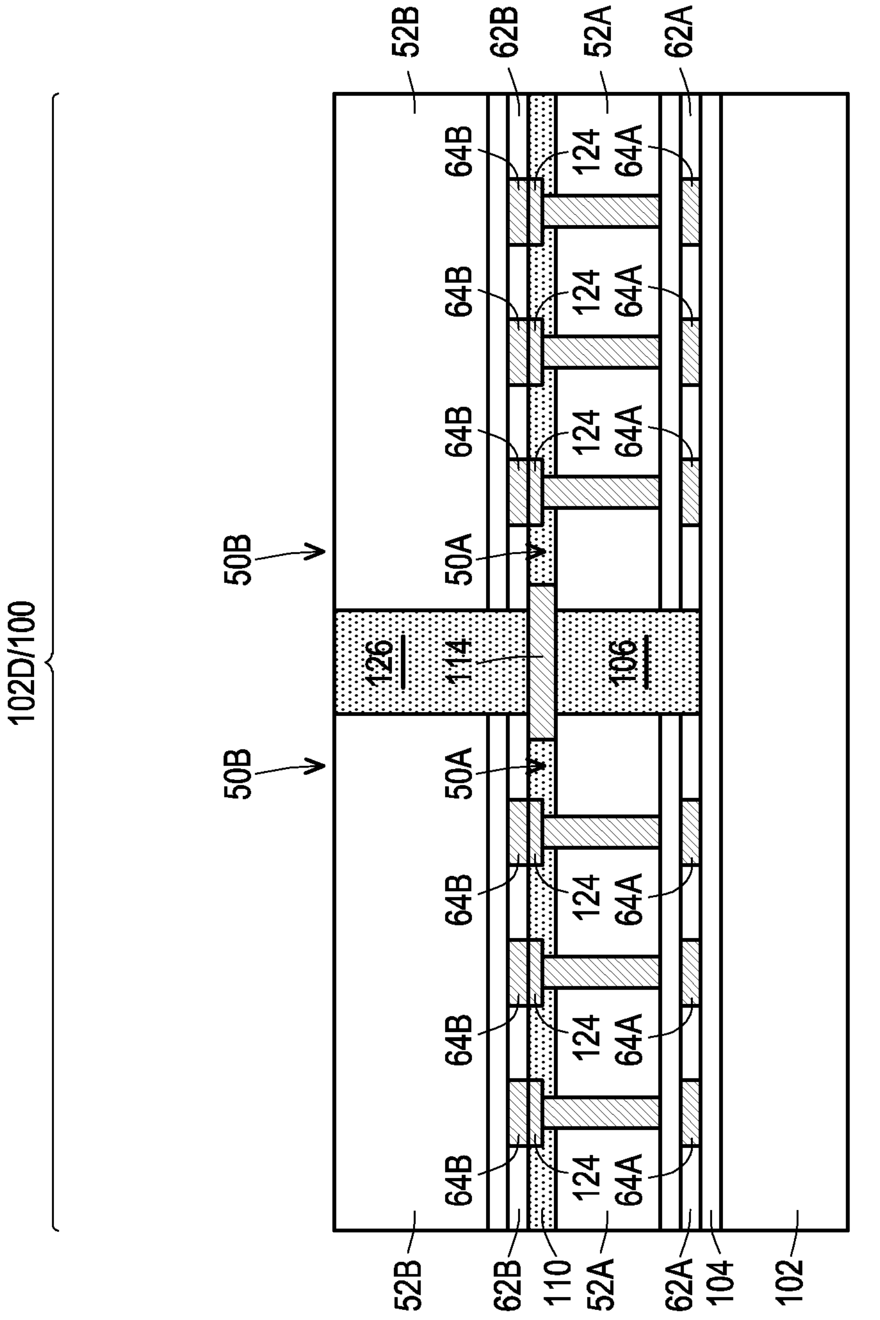

In FIG. 10, a gap-filling dielectric 126 is formed between the integrated circuit dies 50B in the device region 102D. The gap-filling dielectric 126 may be formed of a dielectric material, such as an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. In some embodiments, the gap-filling dielectric 126 is formed of the same dielectric material as the gap-filling dielectric 106. Initially, the gap-filling dielectric 126 may bury or cover the integrated circuit dies 50B, such that the top surface of the gap-filling dielectric 126 is above the surfaces of the integrated circuit dies 50B. A removal process may be performed to level surfaces of the gap-filling dielectric 126 with the back side surfaces of the integrated circuit dies 50B. In some embodiments, a planarization process such as a chemical mechanical polish (CMP), an etch-back process, combinations thereof, or the like is utilized. After the planarization process, surfaces of the gap-filling dielectric 126 and the integrated circuit dies 50B (including the semiconductor substrates 52A) are substantially coplanar (within process variations).

The gap-filling dielectric 126 formed on the protective cap 114. The gap-filling dielectric 126 overlaps the protective cap 114. As such, the protective cap 114 is disposed between the gap-filling dielectric 106 and the gap-filling dielectric 126.

Figure 11:
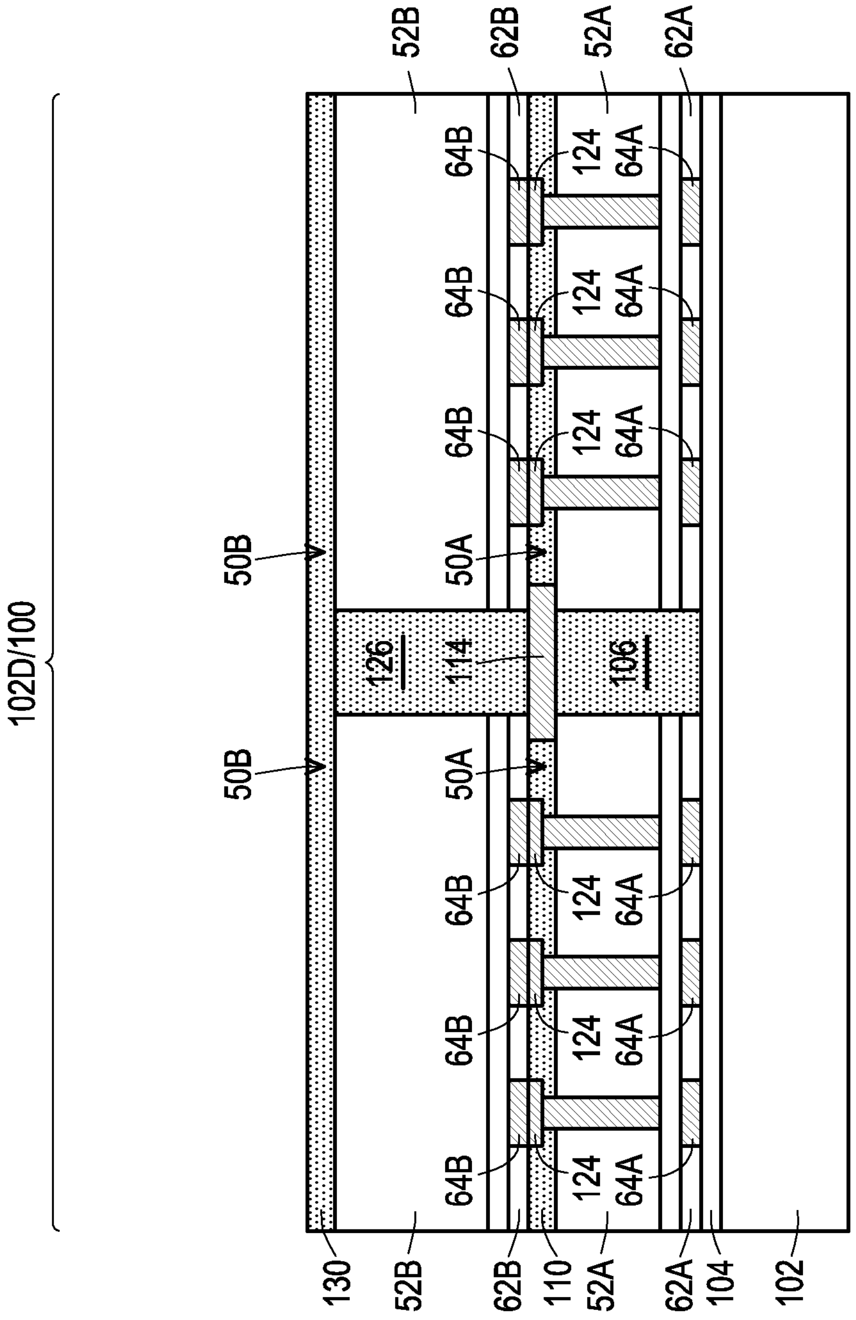

In FIG. 11, an isolation layer 130 is formed on the gap-filling dielectric 126 and the back sides of the integrated circuit dies 50B. The isolation layer 130 can be utilized in a subsequent bonding process. The isolation layer 130 is formed of a dielectric material. The dielectric material can be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Other suitable dielectric materials, such as a low temperature polyimide material, PBO, an encapsulant, combinations thereof, or the like may also be utilized. In some embodiments, the isolation layer 130 is formed of the same dielectric material as the isolation layer 110.

As subsequently described for FIGS. 12-13, a protective cap 134 (see FIG. 13) will be formed in the isolation layer 130. The protective cap 134 covers the portion of the gap-filling dielectric 126 between the integrated circuit dies 50B, and protects the gap-filling dielectric 126 during subsequent processing. The protective cap 134 is formed of a ductile material that absorbs stress in subsequent processing, in a similar manner as the protective cap 114. In other words, the protective cap 134 is a ductile crack-stopping structure.

Figure 12:
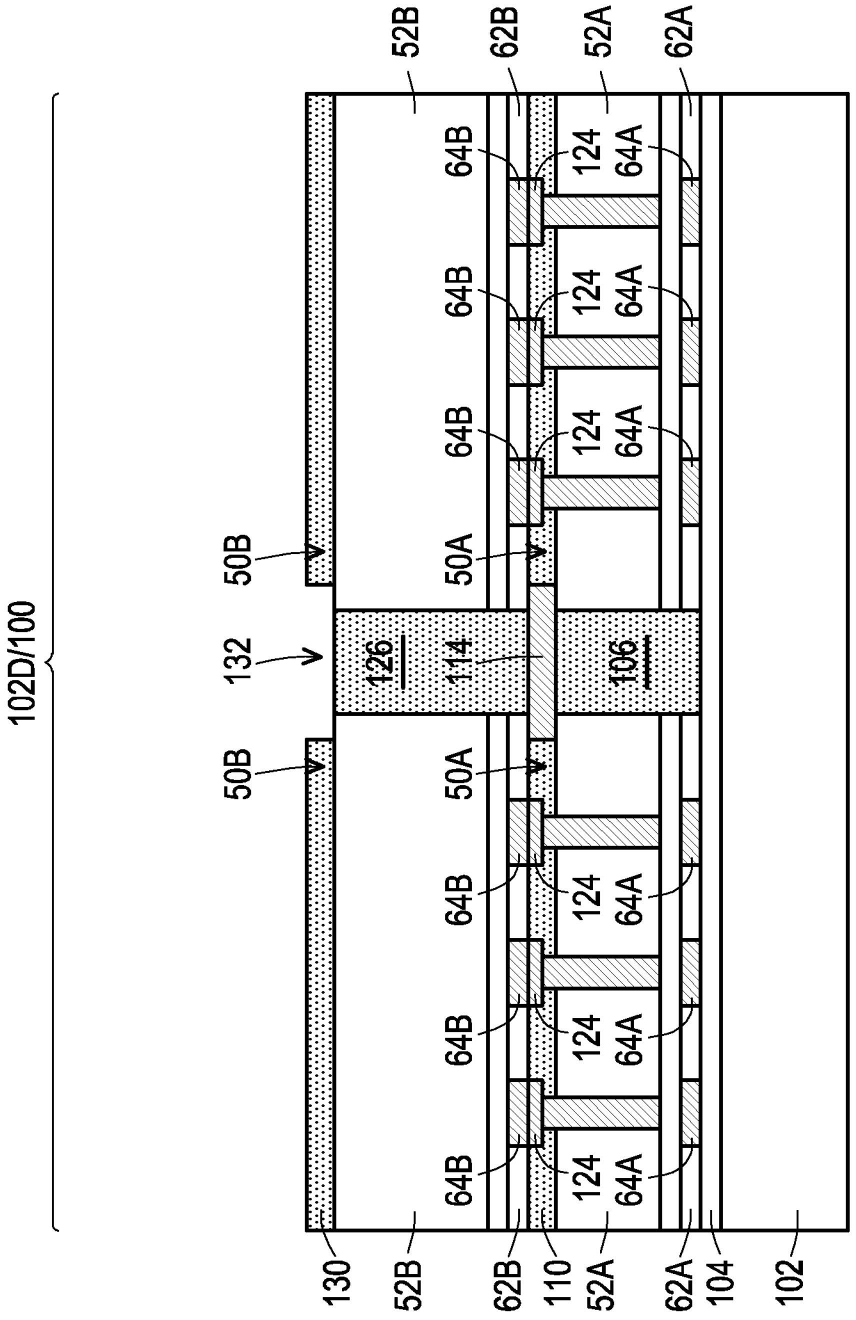

In FIG. 12, an opening 132 for the protective cap is patterned in the isolation layer 130. The opening 132 may be patterned using acceptable photolithography and etching techniques. The opening 132 exposes the gap-filling dielectric 126. The opening 132 may also expose portions of the back sides of the integrated circuit dies 50B (e.g., the inactive surfaces of the semiconductor substrates 52B).

Figure 13:
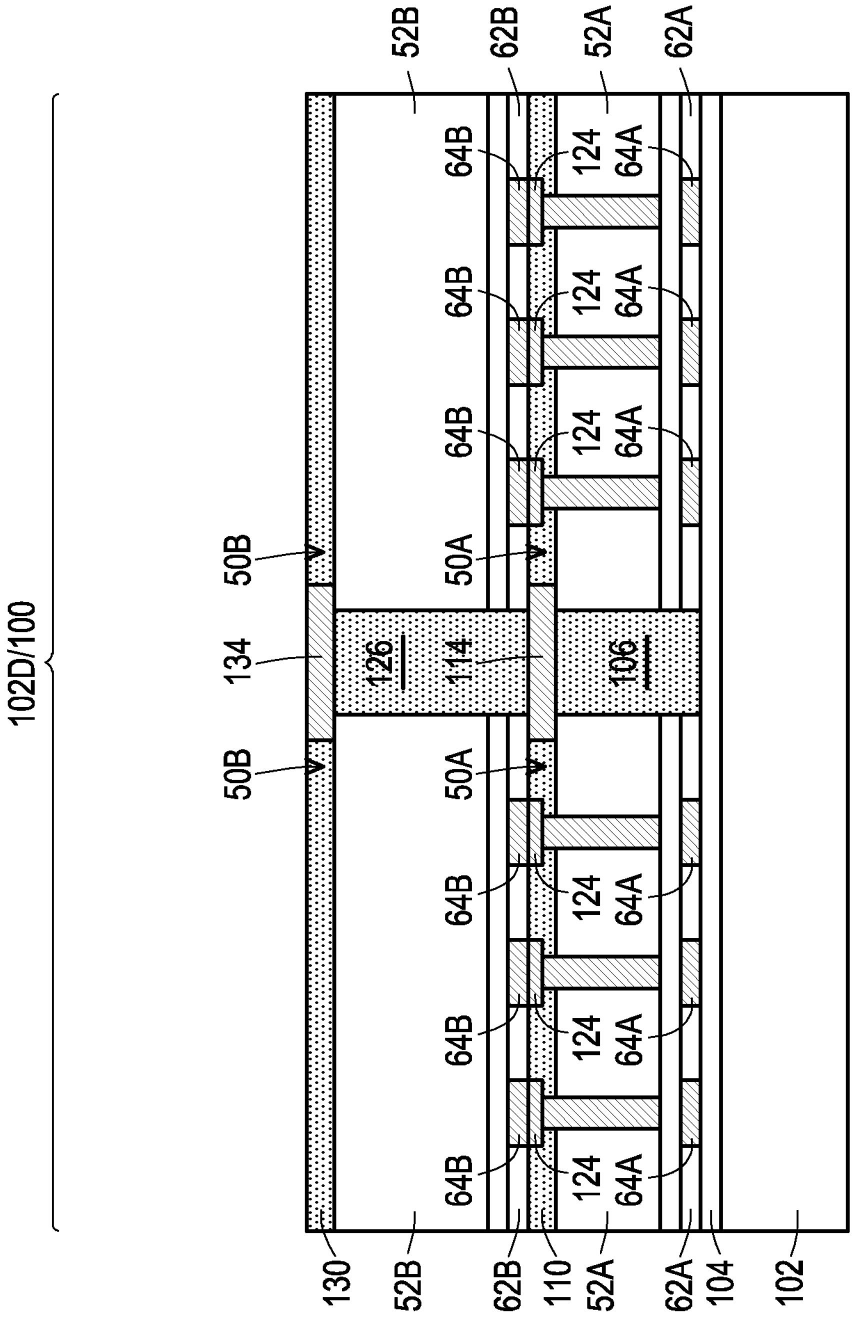

In FIG. 13, the protective cap 134 is formed in the opening 132. The isolation layer 130 is around the protective cap 134. The protective cap 134 extends through the isolation layer 130 to physically contact the gap-filling dielectric 126. The protective cap 134 may also contact the back sides of the integrated circuit dies 50B (e.g., the inactive surfaces of the semiconductor substrates 52B). The protective cap 134 is formed of a ductile material. In some embodiments, the protective cap 134 is formed of the same ductile material as the protective cap 114.

As an example to form the protective cap 134, a seed layer (not separately illustrated) may be formed on the isolation layer 130 and in the opening 132. In some embodiments, the seed layer is a metal layer, which may be a single layer or a composite layer including a plurality of sub-layers formed of different materials. In some embodiments, the seed layer includes a tantalum layer and a copper layer over the titanium layer. The seed layer may be formed using, for example, physical vapor deposition (PVD) or the like. A ductile material, such as one of the previously described metals, is then plated on the seed layer. A removal process may be performed to remove excess material from the top surface of the isolation layer 130. In some embodiments, a planarization process such as a chemical mechanical polish (CMP), an etch-back process, combinations thereof, or the like is utilized. The remaining portions of the seed layer and ductile material in the opening 132 forms the protective cap 134. After the planarization process, surfaces of the protective cap 134 and the isolation layer 130 are substantially coplanar (within process variations). The thickness of the protective cap 134 is substantially equal (within process variations) to the thickness of the isolation layer 130.

The sidewalls of the protective cap 134 are disposed above the integrated circuit dies 50B and/or the gap-filling dielectric 126. The protective cap 134 overlaps the opposing sidewalls of the integrated circuit dies 50B that face the gap-filling dielectric 126. The gap-filling dielectric 126 and the protective cap 134 may have similar widths as, respectively, the widths of the gap-filling dielectric 106 and the protective cap 114 (previously described for FIGS. 7A and 7B). The protective cap 134 completely covers the underlying portion of the gap-filling dielectric 126 in the cross-section of FIG. 13, which helps provide a desired amount of protection to the gap-filling dielectric 126.

Figure 14:
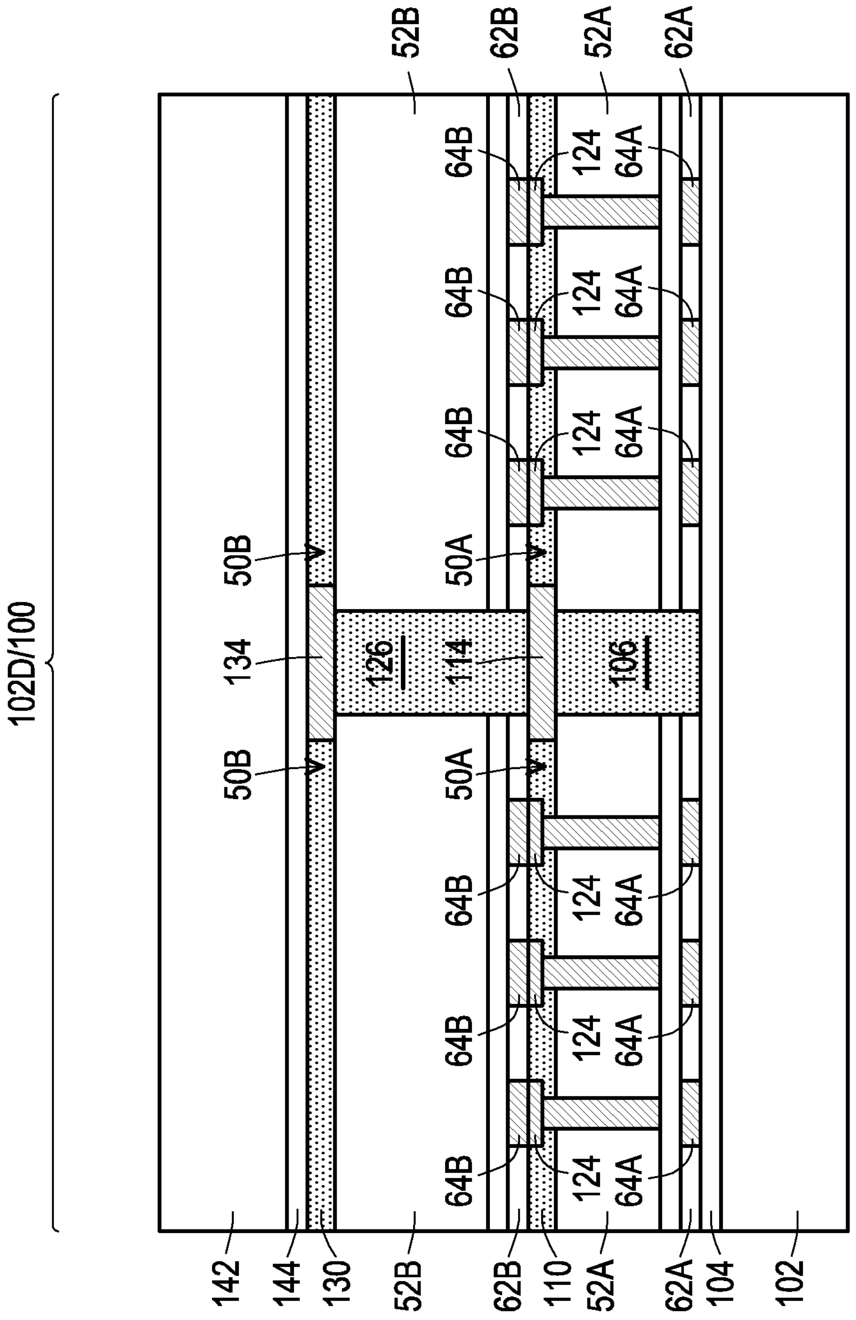

In FIG. 14, a support substrate 142 is attached to the isolation layer 130 and the protective cap 134. The support substrate 142 may be a glass support substrate, a ceramic support substrate, or the like. The support substrate 142 may be a wafer.

The support substrate 142 may be attached to the isolation layer 130 and the protective cap 134 by bonding the support substrate 142 to the isolation layer 130 and the protective cap 134 with a bonding layer 144. The bonding layer 144 is on a surface of the support substrate 142, a surface of the isolation layer 130, and a surface of the protective cap 134. In some embodiments, the bonding layer 144 is a release layer, such as an epoxy-based thermal-release material, which loses its adhesive property when heated, such as a light-to-heat-conversion (LTHC) release coating; an ultra-violet (UV) glue, which loses its adhesive property when exposed to UV light; or the like. In some embodiments, the bonding layer 144 is an oxide layer such as a layer of silicon oxide. The bonding layer 144 may include any desired quantity of release layers and/or adhesive films. The bonding layer 144 may be applied to surfaces of the isolation layer 130 and the protective cap 134, may be applied over the surface of the support substrate 142, and/or the like.

Figure 15:
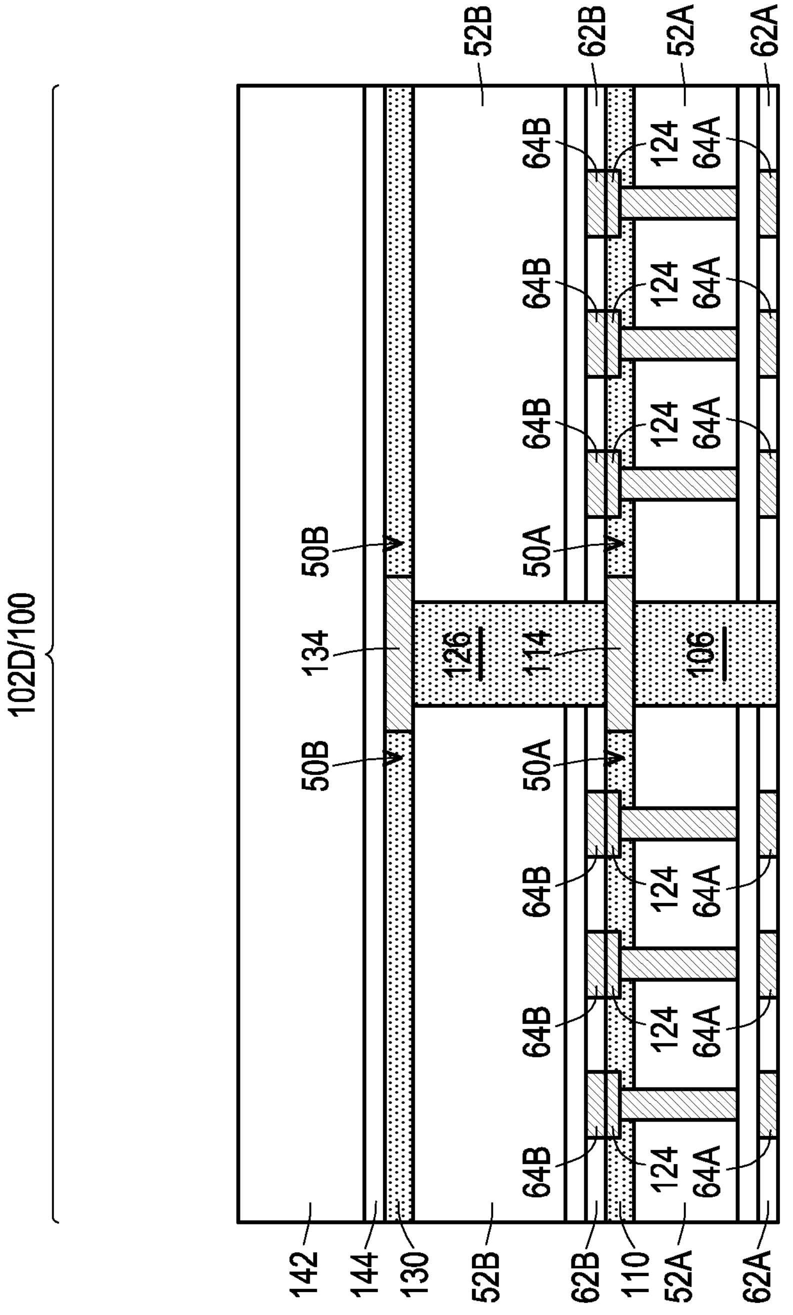

In FIG. 15, a carrier substrate de-bonding is performed to detach (or "de-bond") the carrier substrate 102 from the integrated circuit dies 50A. The gap-filling dielectric 106 and the front sides of the integrated circuit dies 50A are thus exposed. In some embodiments where the bonding layer 104 includes an oxide layer, the de-bonding includes applying a removal process, such as a grinding process, to the carrier substrate 102 and the bonding layer 104. In some embodiments where the bonding layer 104 includes a release layer, the de-bonding includes projecting a light such as a laser light or a UV light on the bonding layer 104 so that the bonding layer 104 decomposes under the heat of the light and the carrier substrate 102 can be removed. The structure is then flipped over and placed on a tape (not separately illustrated).

Figure 16:
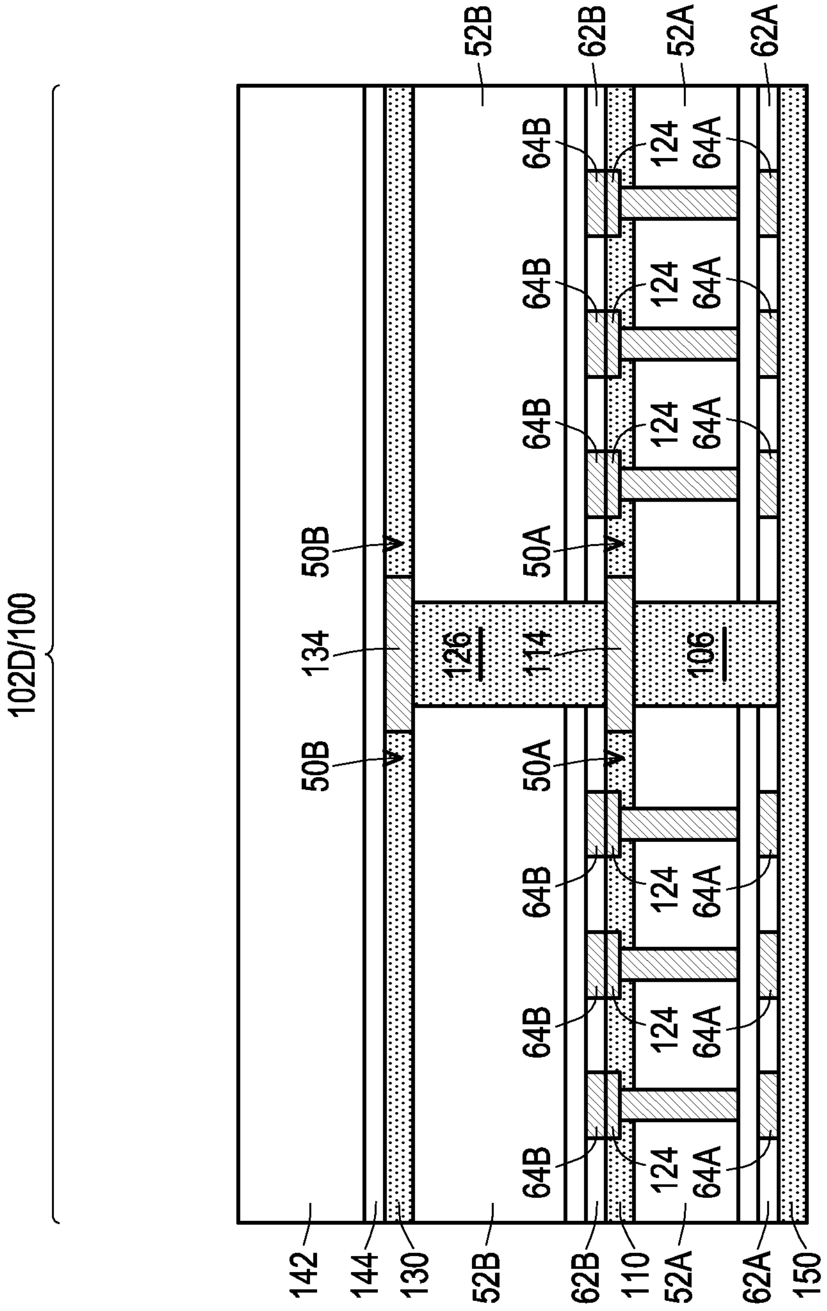

In FIG. 16, an isolation layer 150 is formed on the gap-filling dielectric 106 and the front sides of the integrated circuit dies 50A. The isolation layer 150 may be on the dielectric layers 62A and the die connectors 64A of the integrated circuit dies 50A. The isolation layer 150 can be utilized in a subsequent bonding process. The isolation layer 150 is formed of a dielectric material. The dielectric material can be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Other suitable dielectric materials, such as a low temperature polyimide material, PBO, an encapsulant, combinations thereof, or the like may also be utilized. In some embodiments, the isolation layer 150 is formed of the same dielectric material as the isolation layer 110 and/or the isolation layer 130.

As subsequently described for FIGS. 17-18, a protective cap 154 (see FIG. 18) will be formed in the isolation layer 150. The protective cap 154 covers the portion of the gap-filling dielectric 106 between the integrated circuit dies 50A, and protects the gap-filling dielectric 106 during subsequent processing. The protective cap 154 is formed of a ductile material that absorbs stress in subsequent processing, in a similar manner as the protective cap 114. In other words, the protective cap 154 is a ductile crack-stopping structure.

Figure 17:
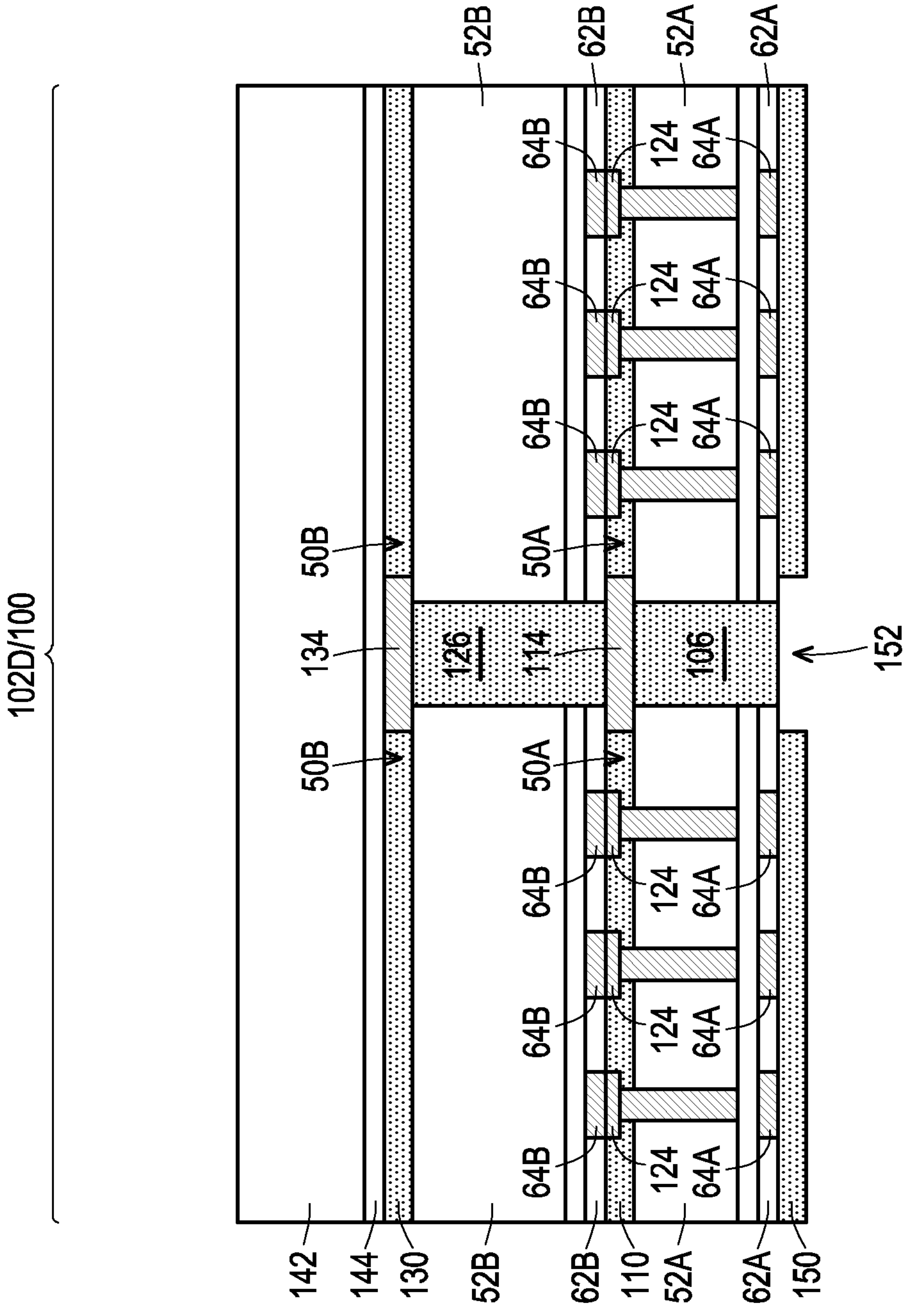

In FIG. 17, an opening 152 for the protective cap is patterned in the isolation layer 150. The opening 152 may be patterned using acceptable photolithography and etching techniques. The opening 152 exposes the gap-filling dielectric 106. The opening 152 may also expose portions of the front sides of the integrated circuit dies 50A (e.g., the inactive surfaces of the semiconductor substrates 52B).

Figure 18:
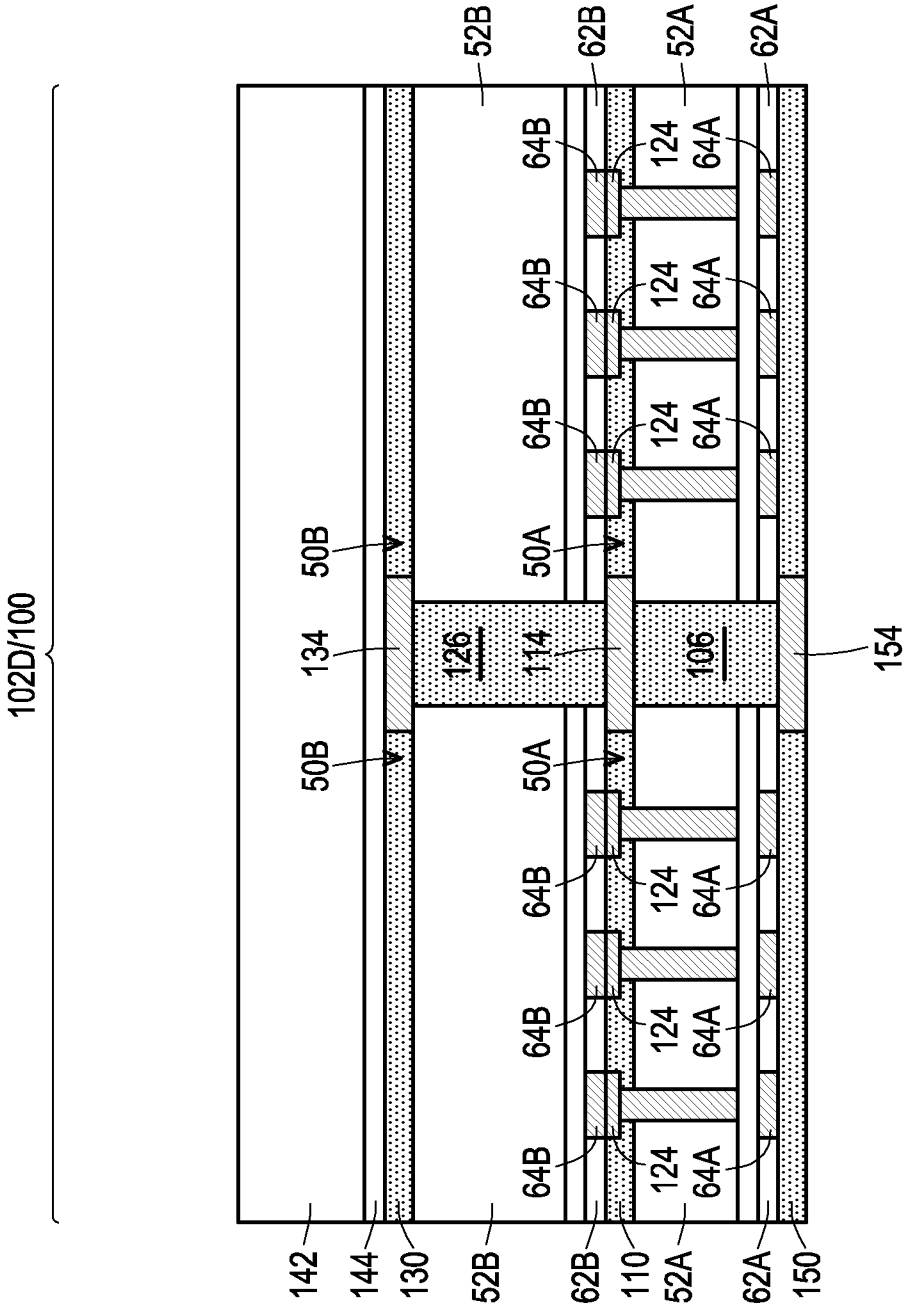

In FIG. 18, the protective cap 154 is formed in the opening 152. The isolation layer 150 is around the protective cap 154. The protective cap 154 extends through the isolation layer 150 to physically contact the gap-filling dielectric 106. The protective cap 154 may also contact the front sides of the integrated circuit dies 50A (e.g., the surfaces of the dielectric layers 62A). The protective cap 154 is formed of a ductile material. In some embodiments, the protective cap 154 is formed of the same ductile material as the protective cap 114 and/or the protective cap 134.

As an example to form the protective cap 154, a seed layer (not separately illustrated) may be formed on the isolation layer 150 and in the opening 152. In some embodiments, the seed layer is a metal layer, which may be a single layer or a composite layer including a plurality of sub-layers formed of different materials. In some embodiments, the seed layer includes a tantalum layer and a copper layer over the titanium layer. The seed layer may be formed using, for example, physical vapor deposition (PVD) or the like. A ductile material, such as one of the previously described metals, is then plated on the seed layer. A removal process may be performed to remove excess material from the bottom surface of the isolation layer 150. In some embodiments, a planarization process such as a chemical mechanical polish (CMP), an etch-back process, combinations thereof, or the like is utilized. The remaining portions of the seed layer and ductile material in the opening 152 forms the protective cap 154. After the planarization process, surfaces of the protective cap 154 and the isolation layer 150 are substantially coplanar (within process variations). The thickness of the protective cap 154 is substantially equal (within process variations) to the thickness of the isolation layer 150.

The sidewalls of the protective cap 154 are disposed below the integrated circuit dies 50A and/or the gap-filling dielectric 106. The protective cap 154 overlaps the opposing sidewalls of the integrated circuit dies 50A that face the gap-filling dielectric 106. The protective cap 154 may have a similar width as the protective caps 114, 134 (previously described for FIGS. 7A and 7B). The protective cap 154 completely covers the overlying portion of the gap-filling dielectric 106 in the cross-section of FIG. 18, which helps provide a desired amount of protection to the gap-filling dielectric 106.

Figure 19:
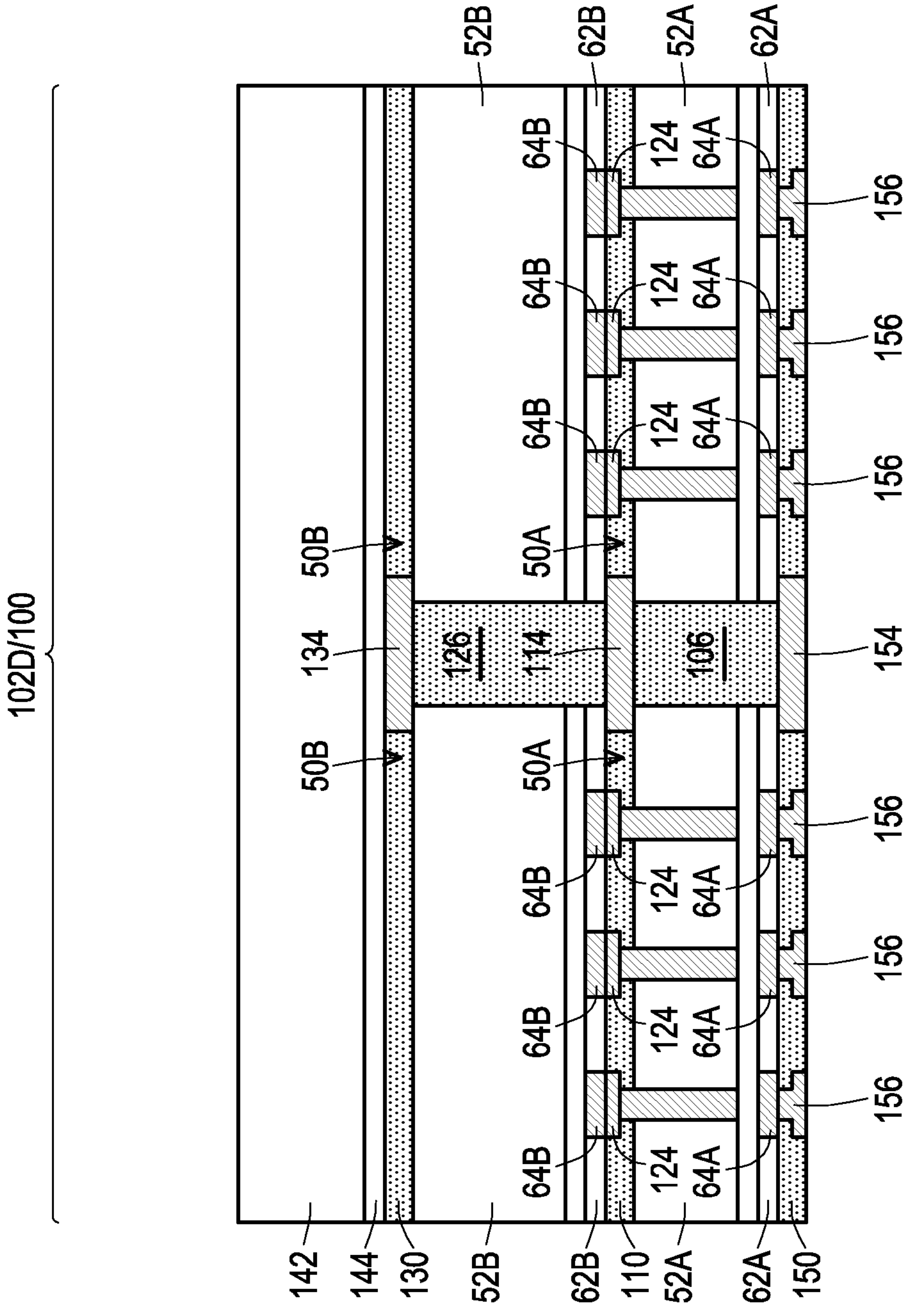

In FIG. 19, die connectors 156 are formed in the isolation layer 150. The die connectors 156 are electrically coupled to the integrated circuit dies 50A. The die connectors 156 may include conductive pillars, pads, or the like, to which external connections can be made. In some embodiments, the die connectors 156 include bond pads at a surface of the isolation layer 150, and include bond pad vias that connect the bond pads to the die connectors 64A of the integrated circuit dies 50A. In such embodiments, the die connectors 156 (including the bond pads and the bond pad vias) may be formed by a damascene process, such as a single damascene process, a dual damascene process, or the like. The die connectors 156 can be formed of a conductive material, such as a metal, such as copper, aluminum, or the like, which can be formed by, for example, plating, or the like. In some embodiments, a planarization process such as a chemical mechanical polish (CMP), an etch-back process, combinations thereof, or the like is performed on the die connectors 156, the protective cap 154, and the isolation layer 150. After the planarization process, surfaces of die connectors 156, the protective cap 154, and the isolation layer 150 are substantially coplanar (within process variations).

Figure 20:
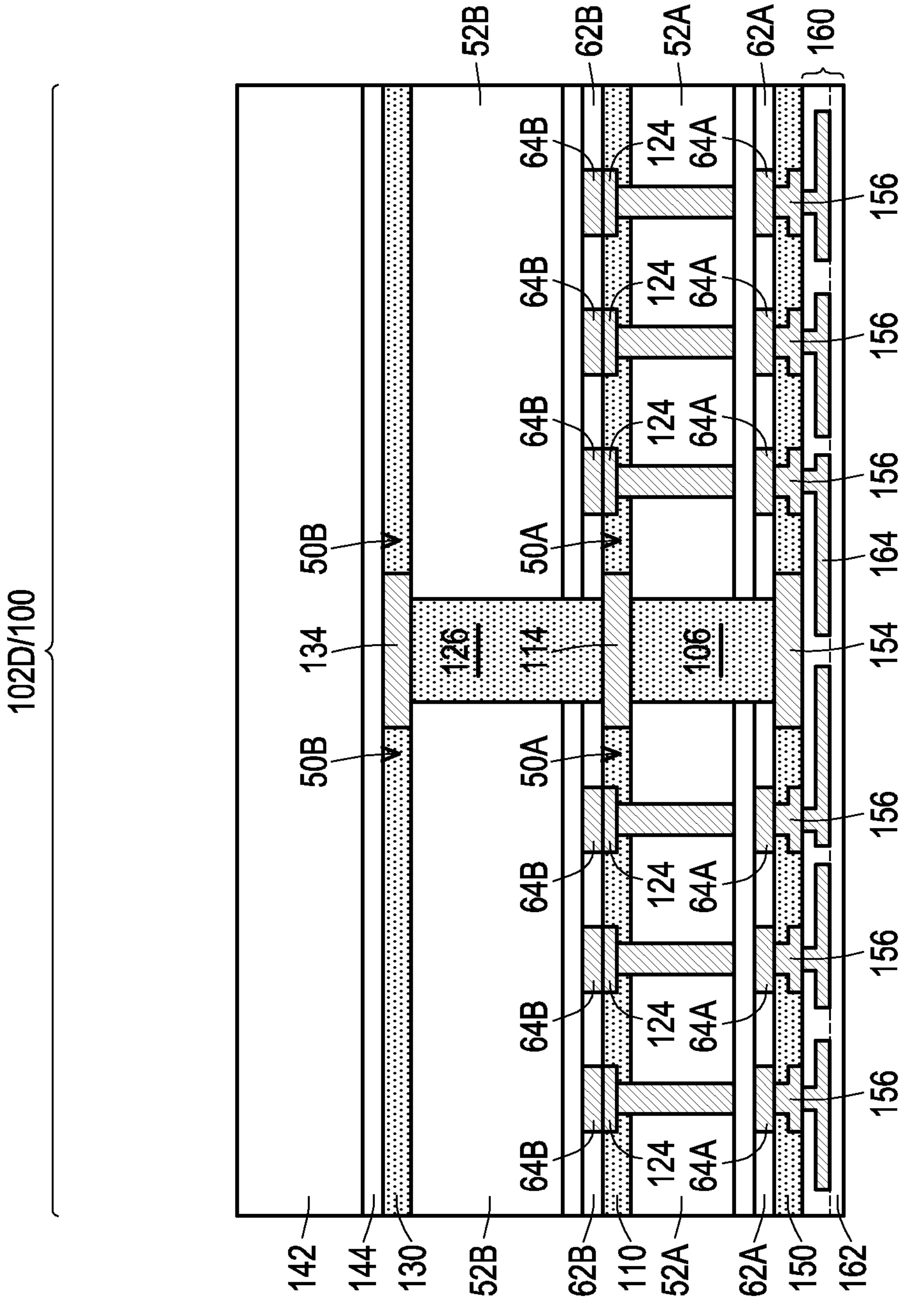

In FIG. 20, a redistribution structure 160 is formed on the isolation layer 150, the protective cap 154, and the die connectors 156. The isolation layer 150 is disposed between the redistribution structure 160 and the integrated circuit dies 50A. The protective cap 154 is disposed between the redistribution structure 160 and the gap-filling dielectric 106. The protective cap 154 may also be disposed between the redistribution structure 160 and the integrated circuit dies 50A. The redistribution structure 160 includes dielectric layers 162 and metallization layers 164 (sometimes referred to as redistribution layers or redistribution lines) among the dielectric layers 162. For example, the redistribution structure 160 may include a plurality of metallization layers 164 separated from each other by respective dielectric layers 162. The metallization layers 164 of the redistribution structure 160 are electrically coupled to the integrated circuit dies 50A by the die connectors 156.

In some embodiments, the dielectric layers 162 are formed of a polymer, which may be a photo-sensitive material such as PBO, polyimide, a BCB-based polymer, or the like. In other embodiments, the dielectric layers 162 are formed of a nitride such as silicon nitride; an oxide such as silicon oxide, PSG, BSG, BPSG; or the like. The dielectric layers 162 may be formed by spin coating, lamination, CVD, the like, or a combination thereof. After each dielectric layer 162 is formed, it is then patterned to form openings exposing underlying conductive features, such as portions of the underlying die connectors 156 or metallization layers 164. The patterning may be by an acceptable process, such as by exposing the dielectrics layers to light when the dielectric layers 162 are a photo-sensitive material, or by etching using, for example, an anisotropic etch. If the dielectric layers 162 are photo-sensitive materials, the dielectric layers 162 can be developed after the exposure.

The metallization layers 164 include conductive vias and conductive lines. The conductive vias extend through respective dielectric layers 162, and the conductive lines extend along respective dielectric layers 162. As an example to form a metallization layer 164, a seed layer (not separately illustrated) is formed over the respective underlying conductive features (e.g., portions of the underlying die connectors 156 or metallization layers 164). For example, the seed layer can be formed on a respective dielectric layer 162 and in the openings through the respective dielectric layer 162. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form a metallization layer 164 for the redistribution structure 160.

The redistribution structure 160 is illustrated as an example. More or fewer dielectric layers 162 and metallization layers 164 than illustrated may be formed in the redistribution structure 160 by performing the previously described steps a desired quantity of times.

Some portions of the metallization layers 164 overlap the protective cap 154. For example, conductive lines of the metallization layers 164 may extend across the protective cap 154 in a top-down view. The protective cap 154 may provide mechanical support to help reduce cracking of the metallization layers 164. In other words, the protective cap 154 is a support structure in addition to a ductile crack-stopping structure.

Figure 21:
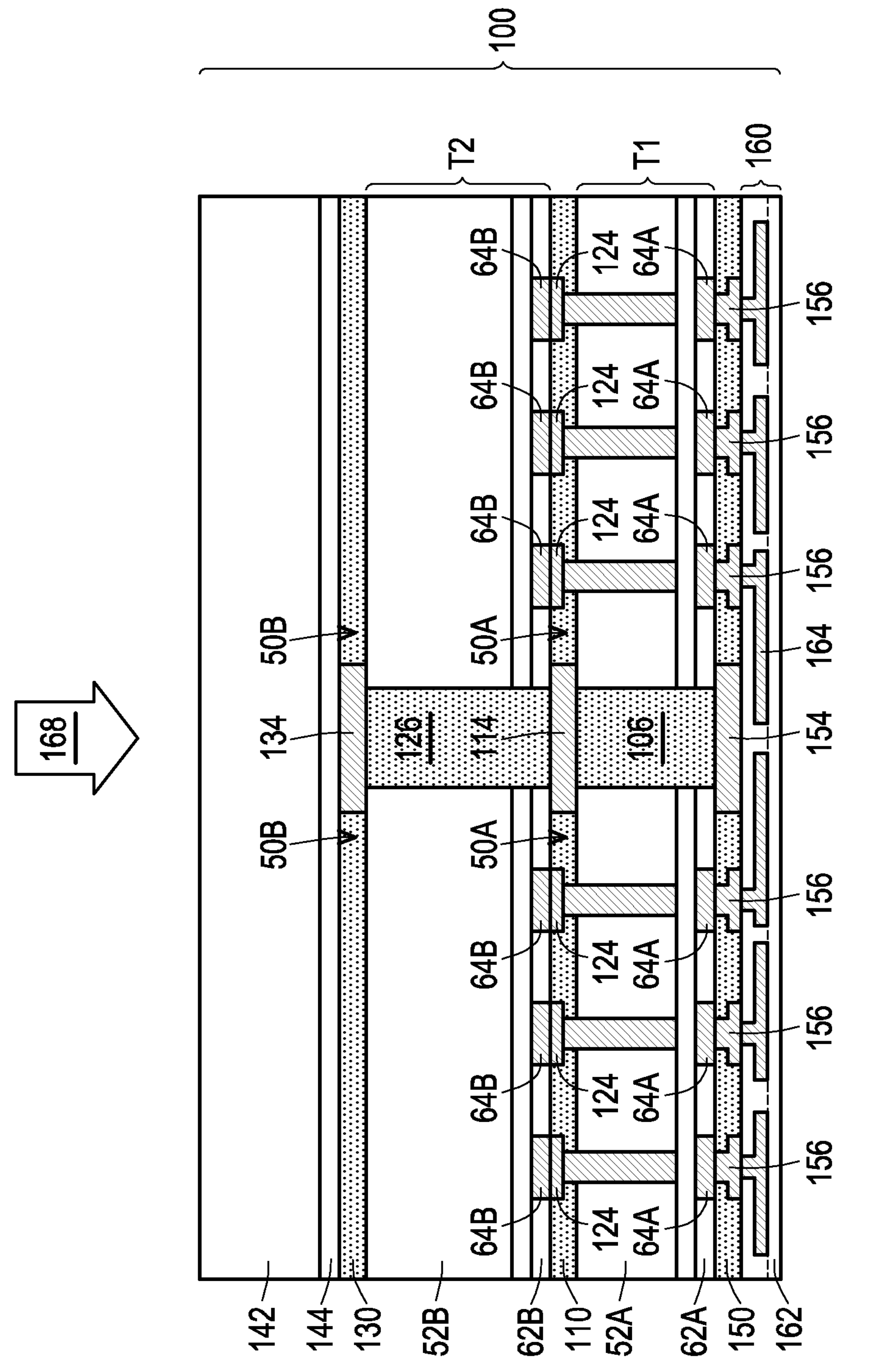

In FIG. 21, a singulation process 168 is performed along scribe line regions, e.g., between the device region 102D and adjacent device regions (not separately illustrated). The singulation process 168 may include a sawing process, a laser cutting process, or the like. The singulation process 168 singulates the device region 102D from the adjacent device regions. The resulting, singulated die structure 100 is from the device region 102D. After the singulation process 168, at least some of the integrated circuit dies 50A, 50B; the isolation layers 110, 130, 150; the support substrate 142; and the redistribution structure 160 (including the dielectric layers 162) are laterally coterminous.

The die structure 100 includes multiple tiers of integrated circuit dies 50. In the illustrated embodiment, the die structure 100 includes a first tier T1 of integrated circuit dies 50A and a second tier T2 of integrated circuit dies 50B, where the isolation layer 110 and the protective cap 114 are between the first tier T1 and the second tier T2, although any quantity of tiers of integrated circuit dies 50 may be included in the die structure 100. In this embodiment, an isolation layer and a protective cap are disposed at the front and back sides of each tier of the die structure 100. Specifically, the isolation layer 150 and the protective cap 154 are disposed at a front side of the first tier T1, and the isolation layer 110 and the protective cap 114 are disposed at a back side of the first tier T1. Similarly, the isolation layer 110 and the protective cap 114 are disposed at a front side of the second tier T2, and the isolation layer 130 and the protective cap 134 are disposed at a back side of the second tier T2. Some of the isolation layers 110, 130, 150 and/or some of the protective caps 114, 134, 154 may be omitted. For example, an isolation layer and a protective cap may be disposed at a front side but not a back side of a tier of integrated circuit dies 50 (or vice versa).

In embodiments where an isolation layer and a protective cap are disposed at the front and back sides of each tier of integrated circuit dies 50, each of the gap-filling dielectrics 106, 126 is disposed between two of the protective caps 114, 134, 154. Specifically, the gap-filling dielectric 106 is disposed between the protective caps 114, 154 such that the protective cap 114 is above the gap-filling dielectric 106 and the protective cap 154 is below the gap-filling dielectric 106. Similarly, the gap-filling dielectric 126 is disposed between the protective caps 114, 134 such that the protective cap 134 is above the gap-filling dielectric 126 and the protective cap 114 is below the gap-filling dielectric 126. As previously described for FIGS. 7A and 7B, the protective caps 114, 134, 154 may each have a greater width than the gap-filling dielectrics 106, 126, or the protective caps 114, 134, 154 and the gap-filling dielectrics 106, 126 may each have a substantially equal width (within process variations).

The protective caps 114, 134, 154 are electrically isolated from the integrated circuit dies 50 of the die structure 100. Specifically, the protective caps 114, 134, 154 are surrounded on all sides by dielectric and/or semiconductor materials. No conductive features contact the protective caps 114, 134, 154.

Figure 22:
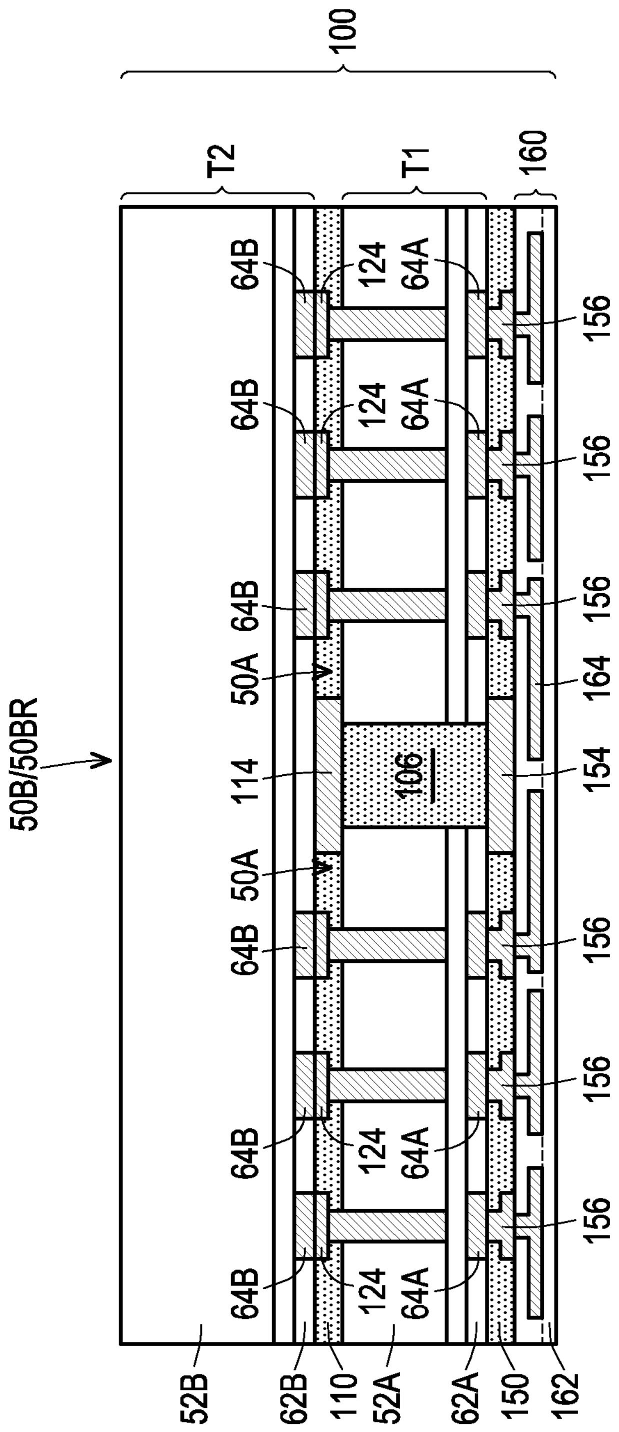
FIG. 22 is a view of a die structure, in accordance with some embodiments.

FIG. 22 is a cross-sectional view of a die structure 100, in accordance with some embodiments. This embodiment is similar to the embodiment of FIG. 21, except the support substrate 142 is omitted, and instead a single integrated circuit die 50B is included in the die structure 100. The single integrated circuit die 50B may be large enough to provide support to the die structure 100. The protective cap 114 is disposed between the integrated circuit die 50B and the gap-filling dielectric 106. The integrated circuit die 50B may be a bridge die 50BR, such as a local silicon interconnect (LSI), a large scale integration package, an interposer die, or the like. The integrated circuit die 50B may be part of a wafer that is attached to the isolation layer 110 and the die connectors 124, wherein the wafer is singulated during the singulation process 168 (see FIG. 21).

Figure 23:
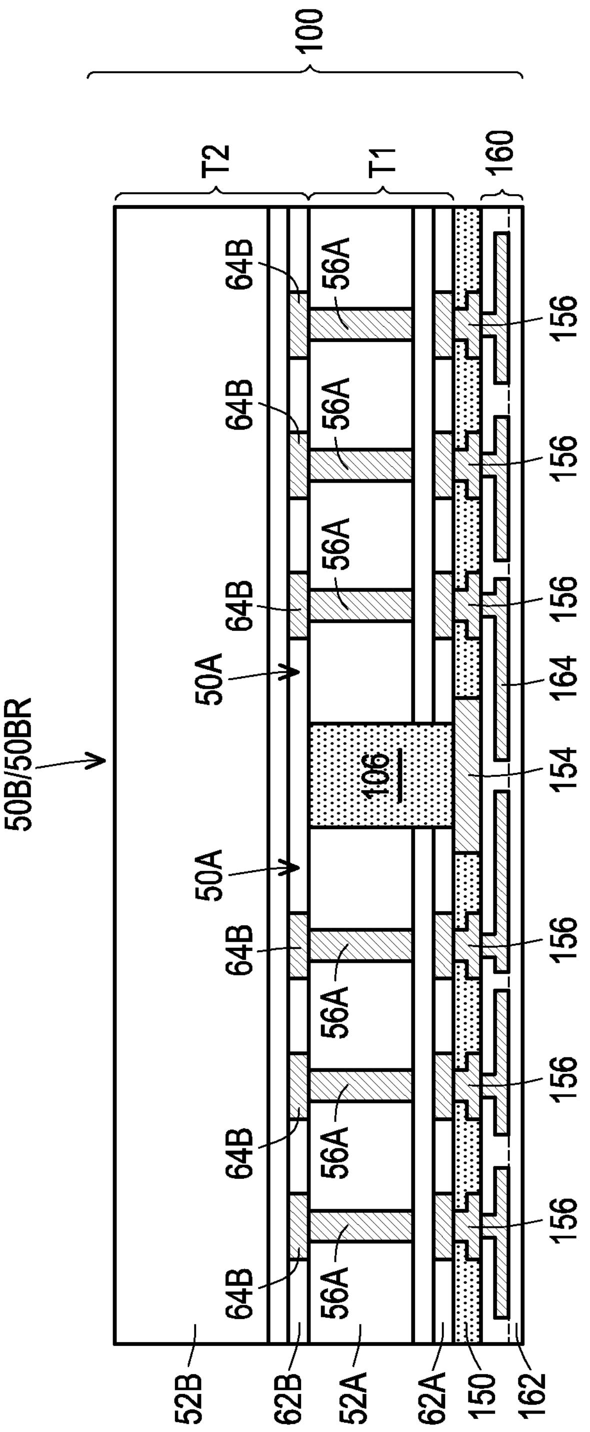
FIG. 23 is a view of a die structure, in accordance with some embodiments.

FIG. 23 is a cross-sectional view of a die structure 100, in accordance with some embodiments. This embodiment is similar to the embodiment of FIG. 22, except the isolation layer 110 and the protective cap 114 are omitted. Instead, the integrated circuit die 50B is attached to the integrated circuit dies 50A in a face-to-back manner, such that the front-side of the integrated circuit die 50B is attached to the back-sides of the integrated circuit dies 50A. For example, the bonds between the integrated circuit dies 50A, 50B may be hybrid bonds that include both dielectric-to-dielectric bonds (e.g., between the materials of the semiconductor substrate 52A and the dielectric layer 62B) and metal-to-metal bonds (e.g., between the materials of the conductive vias 56A and the die connectors 64B).

Figure 24:
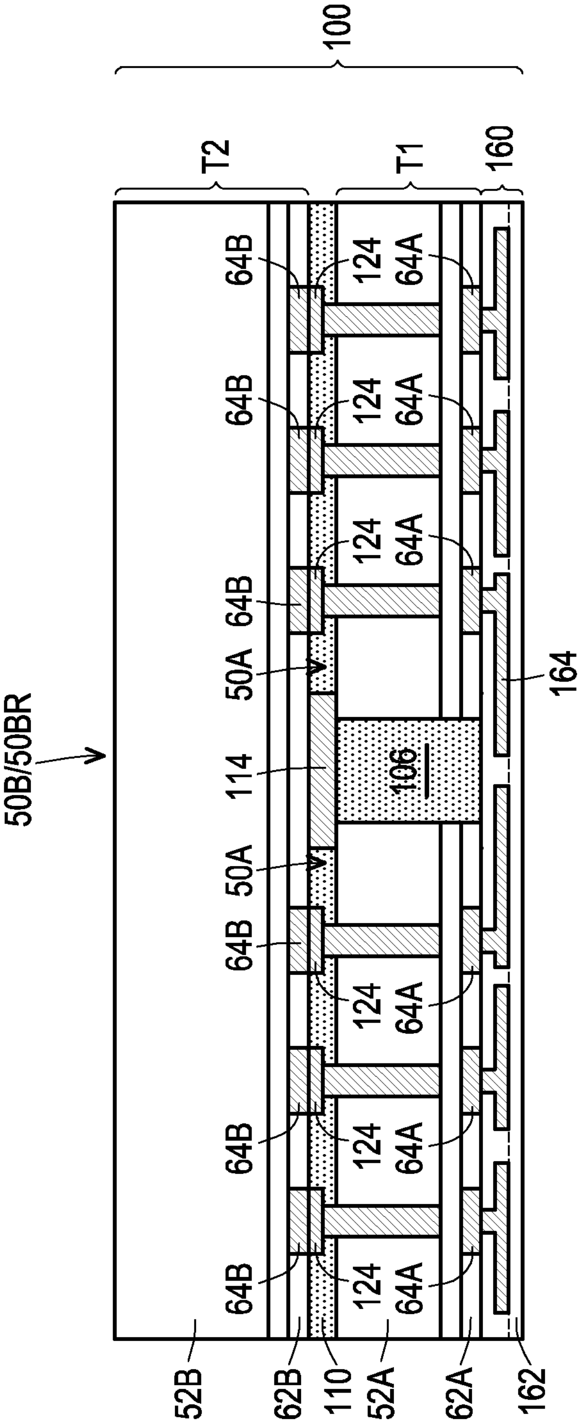
FIG. 24 is a view of a die structure, in accordance with some embodiments.

FIG. 24 is a cross-sectional view of a die structure 100, in accordance with some embodiments. This embodiment is similar to the embodiment of FIG. 22, except the isolation layer 150 and the protective cap 154 are omitted from the die structure 100. The redistribution structure 160 is formed directly on the integrated circuit dies 50A and the gap-filling dielectric 106. The metallization layers 164 are coupled to the die connectors 64A.

Figure 25:
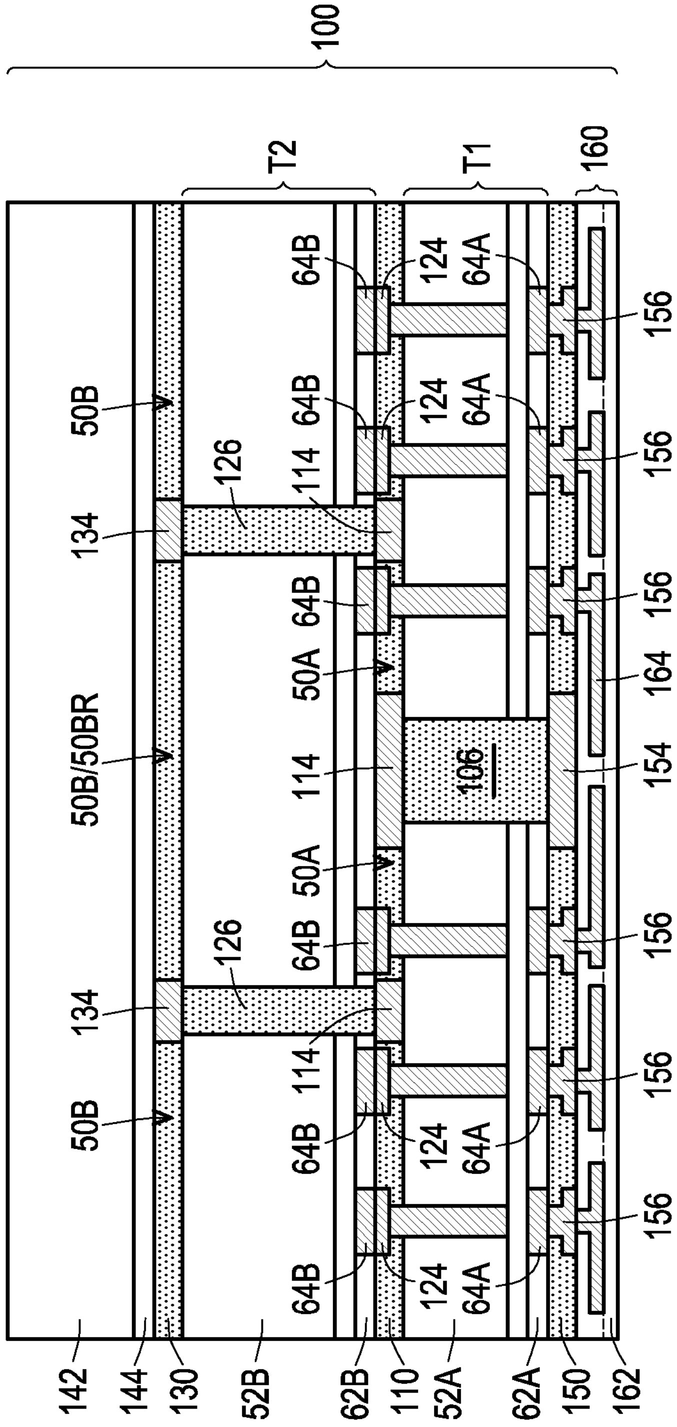
FIG. 25 is a view of a die structure, in accordance with some embodiments.

FIG. 25 is a cross-sectional view of a die structure 100, in accordance with some embodiments. This embodiment is similar to the embodiment of FIG. 21, except at least one of the integrated circuit dies 50B is a bridge die 50BR. The bridge die 50BR is disposed above and overlaps more than one of the integrated circuit dies 50A. The bridge die 50BR is electrically coupled to the multiple integrated circuit dies 50A. Additionally, the die structure 100 includes a plurality of protective caps 134, each of which are above a respective portion of the gap-filling dielectric 126, and further includes a plurality of protective caps 114, each of which are beneath a respective portion of the gap-filling dielectric 126. The bridge die 50BR may be disposed above and in contact with a protective cap 114, such as the protective cap 114 that overlaps the integrated circuit dies 50A beneath the bridge die 50BR.

Figure 26:
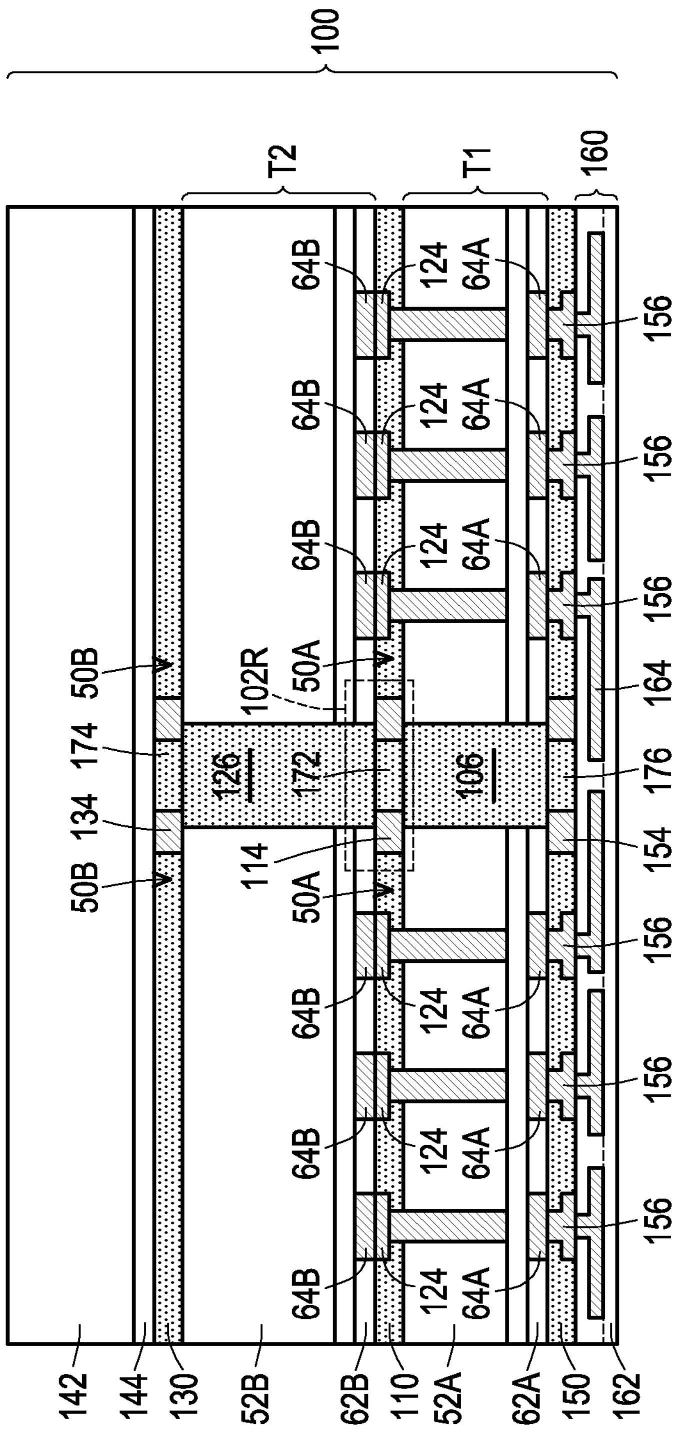
FIG. 26 is a view of a die structure, in accordance with some embodiments.

FIG. 26 is a cross-sectional view of die structure 100, in accordance with some embodiments. This embodiment is similar to the embodiment of FIG. 21, except dielectric features 172, 174, 176 extend through the protective caps 114, 134, 154, respectively. The protective caps 114, 134, 154 thus only partially cover the respective portions of the gap-filling dielectrics 106, 126. The dielectric features 172, 174, 176 may (or may not) be continuous with the isolation layers 110, 130, 150, respectively, and are formed of the same material as the isolation layers 110, 130, 150. The protective caps 114, 134, 154 may have any desired shape in a top-down view.

Figure 27B:
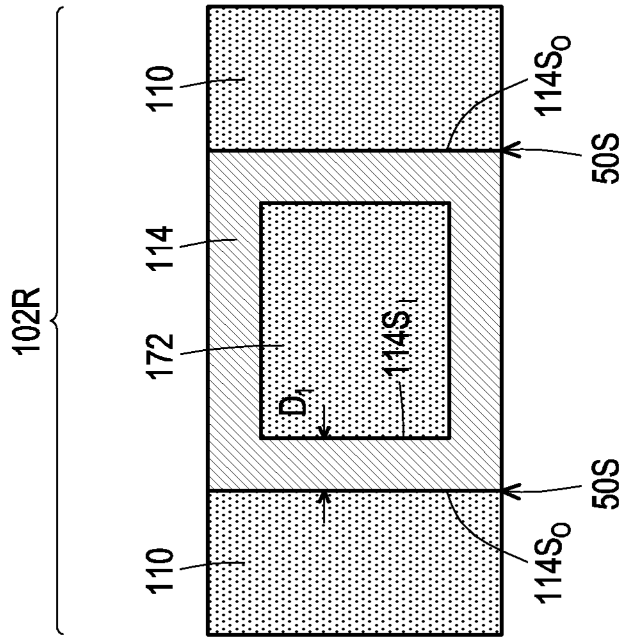
FIGS. 27A and 27B are top-down views of a region of a die structure, in accordance with some embodiments.
Figure 27A:
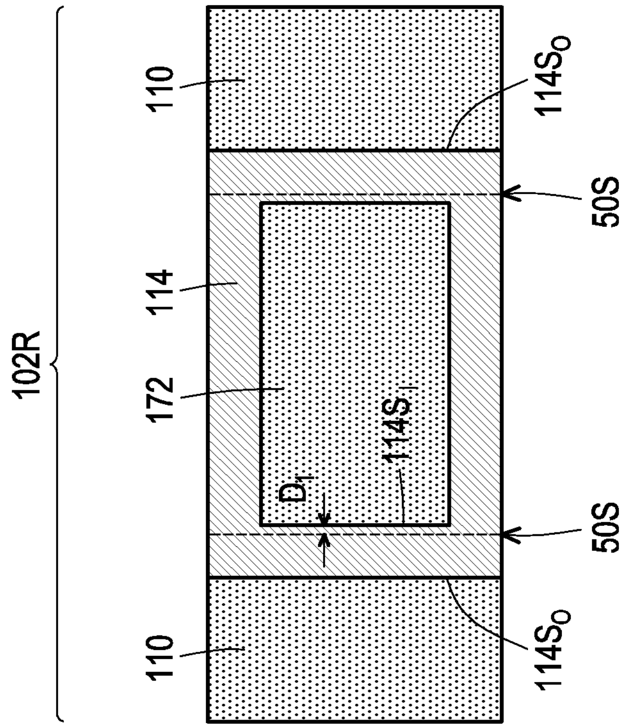

FIGS. 27A and 27B are top-down views of a region 102R in FIG. 26, showing aspects of the protective cap 114, in accordance with some embodiments. These embodiments are similar to the embodiments of FIGS. 7A and 7B, respectively, except the protective cap 114 is a metal ring in the top-down views. The dielectric feature 172 extends through the center of the metal ring. The metal ring extends completely around the dielectric feature 172 in a top-down view, such that the dielectric feature 172 is discontinuous with the isolation layer 110 (see FIG. 26). The inner sidewalls 114$S_I$ of the protective cap 114 are disposed at lease a distance Di from the sidewalls 50S of the integrated circuit dies 50A. In some embodiments, the distance Di is at least about 10 μm, such as in the range of 10 μm to 100 μm. In these embodiments, the inner sidewalls 114$S_I$ of the protective cap 114 form sharp corners. It should be appreciated that the protective caps 134, 154 may have similar shapes as the protective cap 114.

Figure 28B:
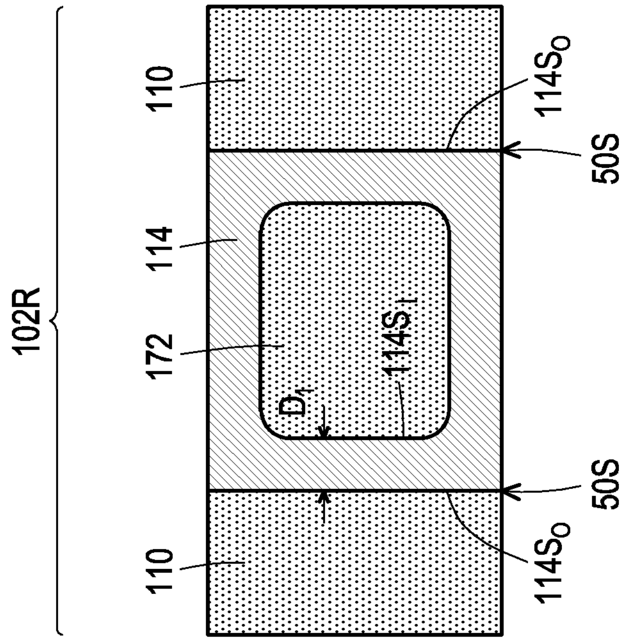
FIGS. 28A and 28B are top-down views of a region of a die structure, in accordance with some embodiments.
Figure 28A:
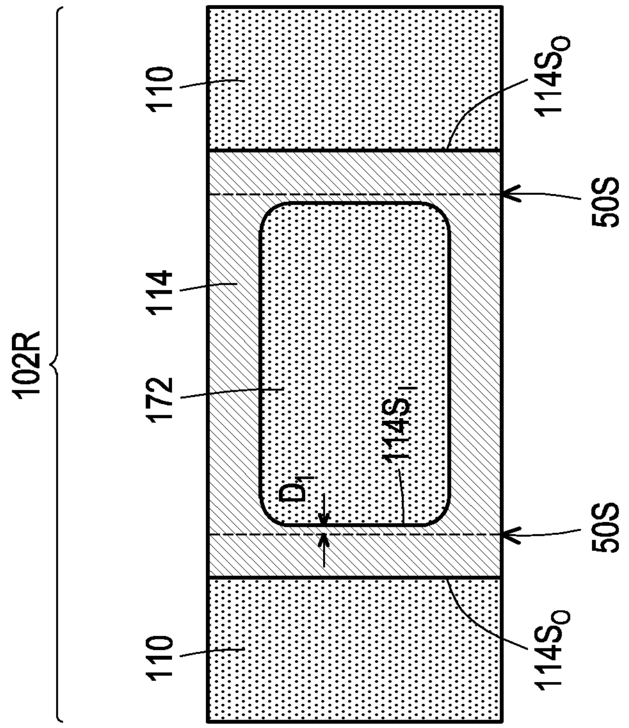

FIGS. 28A and 28B are top-down views of a region 102R in FIG. 26, showing aspects of the protective cap 114, in accordance with some embodiments.

These embodiments are similar to the embodiments of FIGS. 27A and 27B, respectively, except the inner sidewalls 114$S_I$ of the protective cap 114 form rounded corners. It should be appreciated that the protective caps 134, 154 may have similar shapes as the protective cap 114.

Figure 29B:
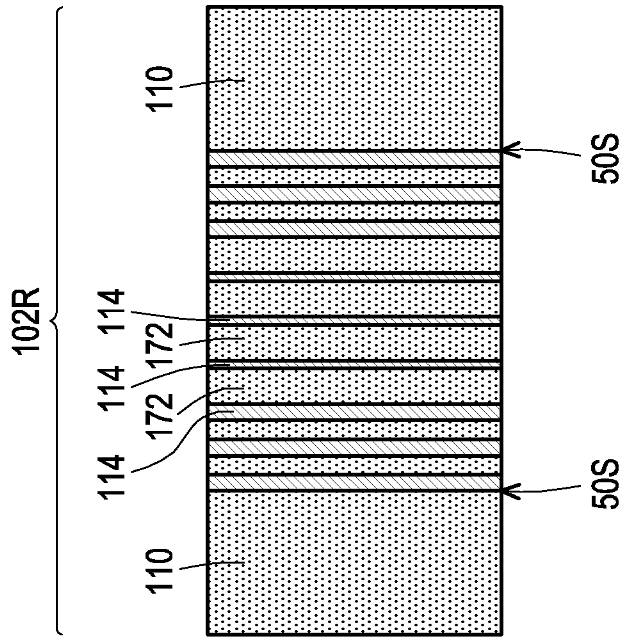
FIGS. 29A and 29B are top-down views of a region of a die structure, in accordance with some embodiments.
Figure 29A:
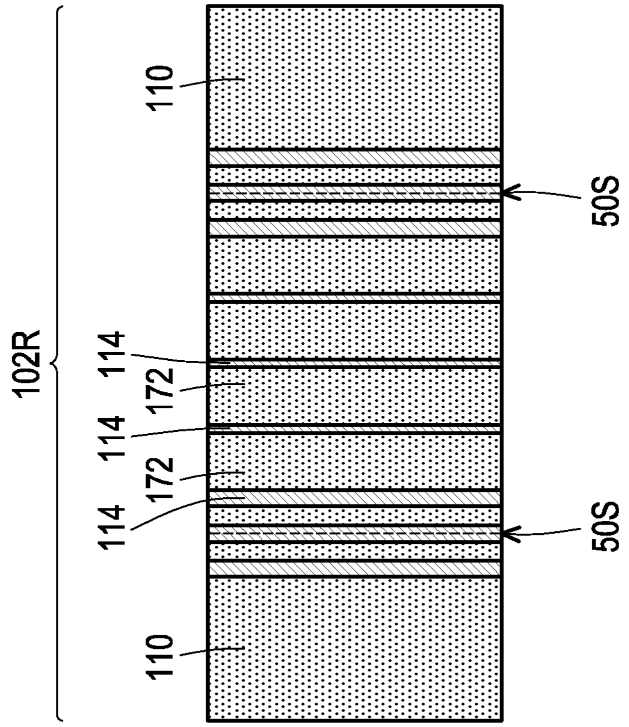

FIGS. 29A and 29B are top-down views of a region 102R in FIG. 26, showing aspects of the protective cap 114, in accordance with some embodiments. These embodiments are similar to the embodiments of FIGS. 7A and 7B, respectively, except the protective cap 114 includes a plurality of metal lines. Dielectric features 172 are disposed between the metal lines. The metal lines do not extend around the dielectric features 172 in a top-down view, such that the dielectric features 172 are continuous with the isolation layer 110 (see FIG. 26). In these embodiments, the metal lines extend parallel to the sidewalls 50S of the integrated circuit dies 50A. The metal lines may have different widths and pitches. In some embodiments, the metal lines proximate the sidewalls 50S of the integrated circuit dies 50A have a smaller pitch than the metal lines distal the sidewalls 50S of the integrated circuit dies 50A. In some embodiments, the metal lines proximate the sidewalls 50S of the integrated circuit dies 50A have a greater width than the metal lines distal the sidewalls 50S of the integrated circuit dies 50A. More generally, the metal lines with a large pitch/small width are disposed between the metal lines with a small pitch/large width.

Figure 30B:
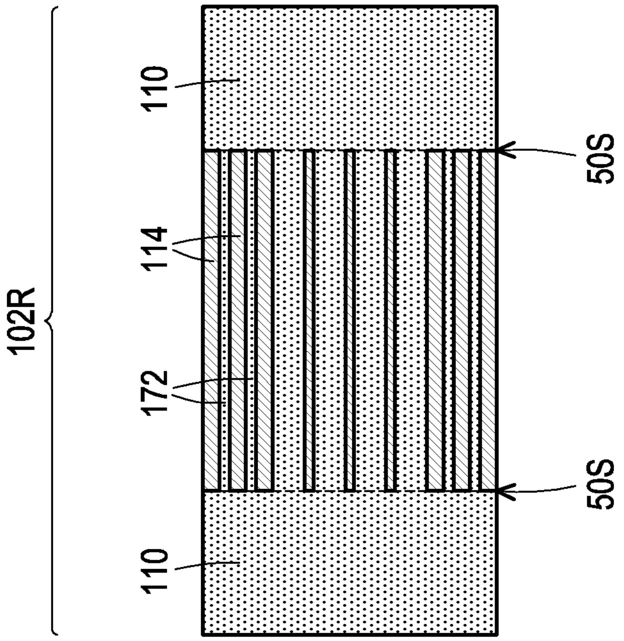
FIGS. 30A and 30B are top-down views of a region of a die structure, in accordance with some embodiments.
Figure 30A:
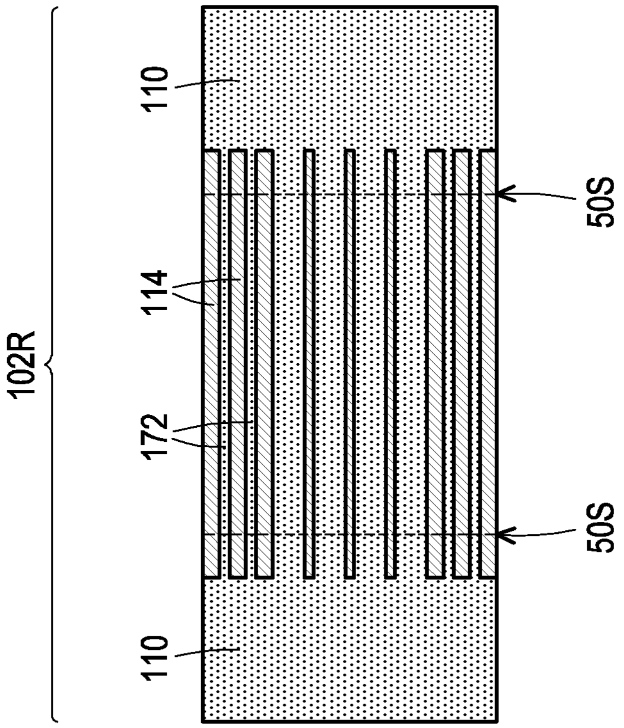

FIGS. 30A and 30B are top-down views of a region 102R in FIG. 26, showing aspects of the protective cap 114, in accordance with some embodiments. These embodiments are similar to the embodiments of FIGS. 29A and 29B, respectively, except the metal lines extend perpendicular to the sidewalls 50S of the integrated circuit dies 50A.

Figure 31B:
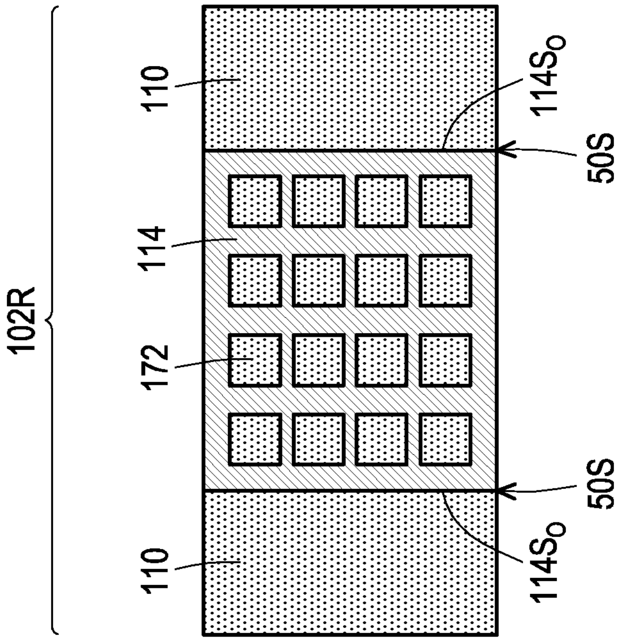
FIGS. 31A and 31B are top-down views of a region of a die structure, in accordance with some embodiments.
Figure 31A:
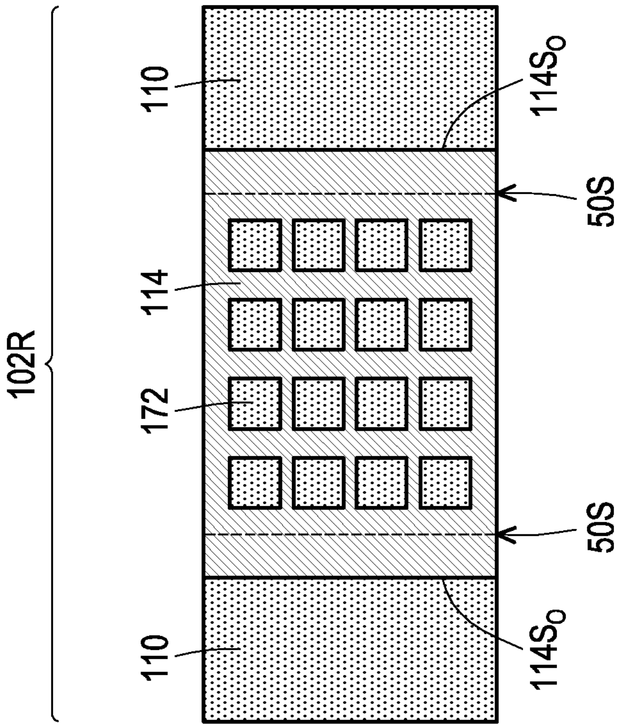

FIGS. 31A and 31B are top-down views of a region 102R in FIG. 26, showing aspects of the protective cap 114, in accordance with some embodiments. These embodiments are similar to the embodiments of FIGS. 7A and 7B, respectively, except the protective cap 114 is a metal mesh. Dielectric features 172 extend through openings in the metal mesh. The metal mesh extends completely around the dielectric features 172 in a top-down view, such that the dielectric features 172 are discontinuous with the isolation layer 110 (see FIG. 26). The dielectric features 172 are disposed between the sidewalls 50S of the integrated circuit dies 50A, and do not overlap the integrated circuit dies 50A. In these embodiments, the dielectric features 172 have quadrilateral shapes in the top-down views.

Figure 32B:
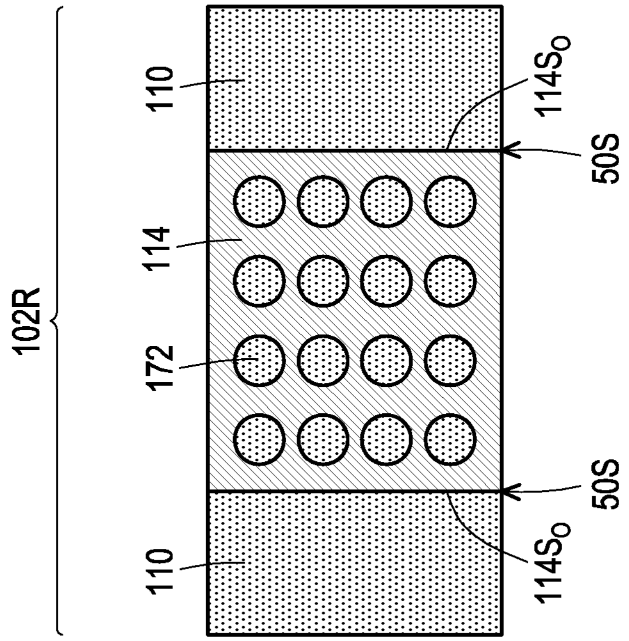
FIGS. 32A and 32B are top-down views of a region of a die structure, in accordance with some embodiments.
Figure 32A:
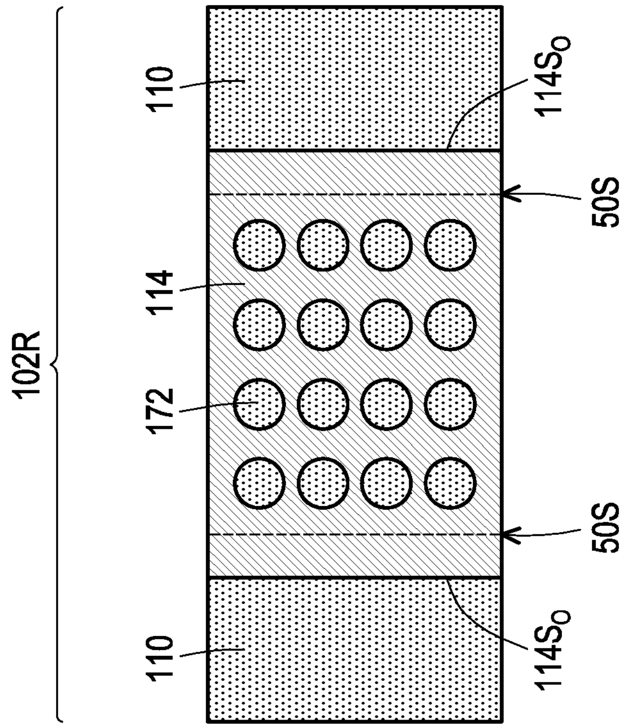

FIGS. 32A and 32B are top-down views of a region 102R in FIG. 26, showing aspects of the protective cap 114, in accordance with some embodiments. These embodiments are similar to the embodiments of FIGS. 31A and 31B, respectively, except the dielectric features 172 have circular shapes in the top-down views.

Figure 33B:
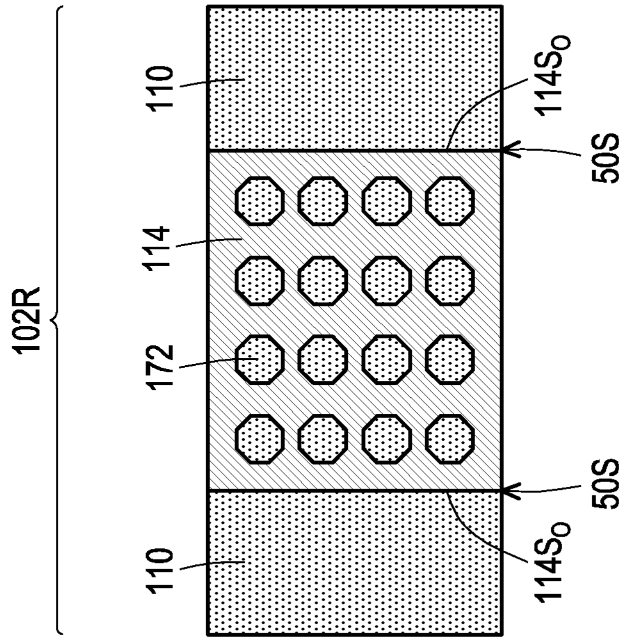
FIGS. 33A and 33B are top-down views of a region of a die structure, in accordance with some embodiments.
Figure 33A:
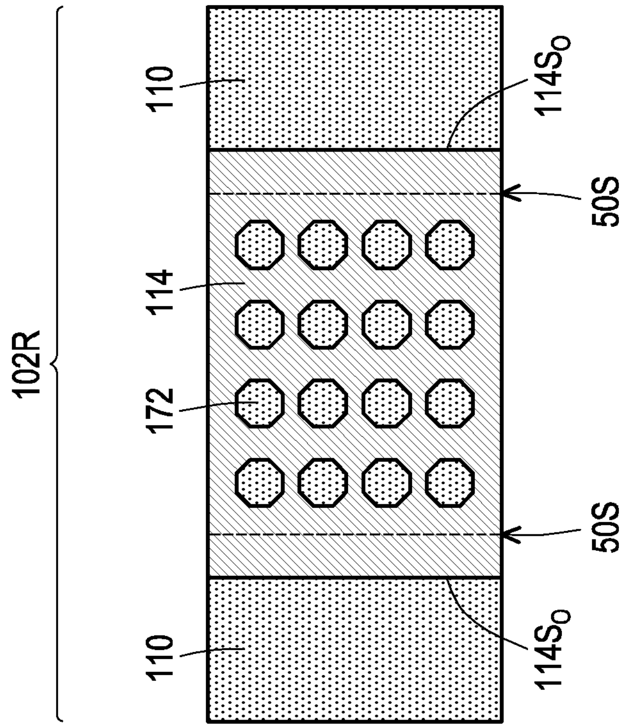

FIGS. 33A and 33B are top-down views of a region 102R in FIG. 26, showing aspects of the protective cap 114, in accordance with some embodiments. These embodiments are similar to the embodiments of FIGS. 31A and 31B, respectively, except the dielectric features 172 have octagon shapes in the top-down views.

Figure 34B:
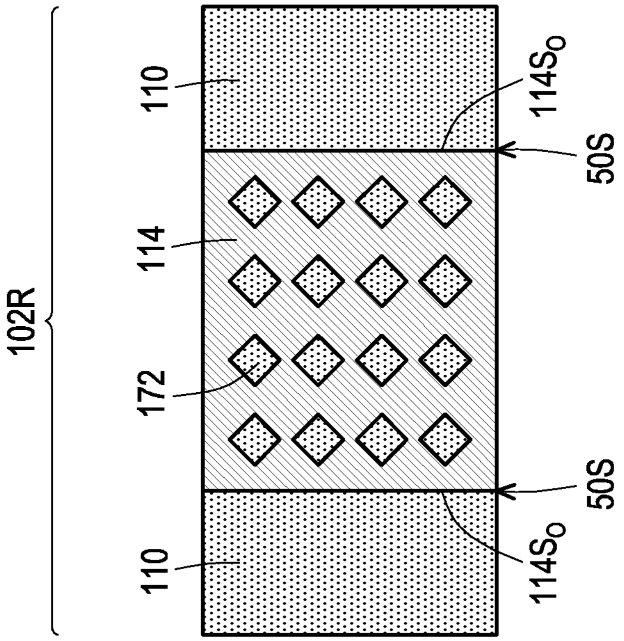
FIGS. 34A and 34B are top-down views of a region of a die structure, in accordance with some embodiments.
Figure 34A:
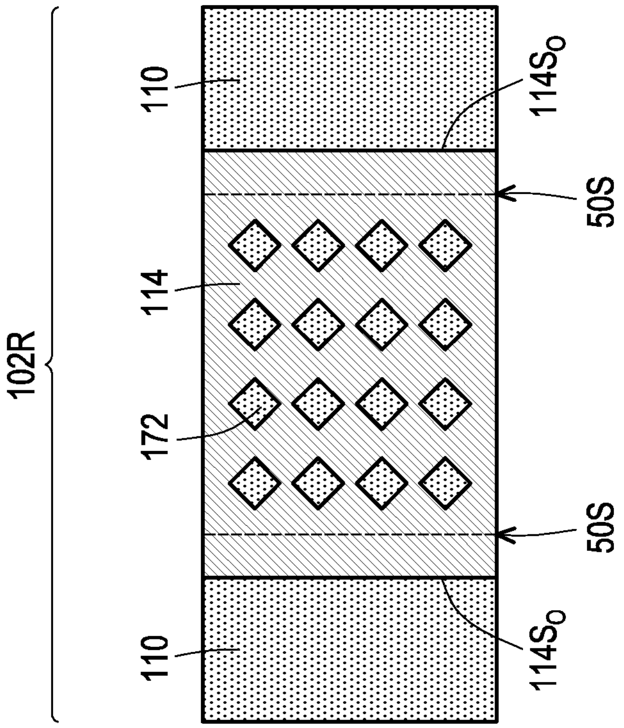

FIGS. 34A and 34B are top-down views of a region 102R in FIG. 26, showing aspects of the protective cap 114, in accordance with some embodiments. These embodiments are similar to the embodiments of FIGS. 31A and 31B, respectively, except the dielectric features 172 have diamond shapes in the top-down views.

Figure 35A:
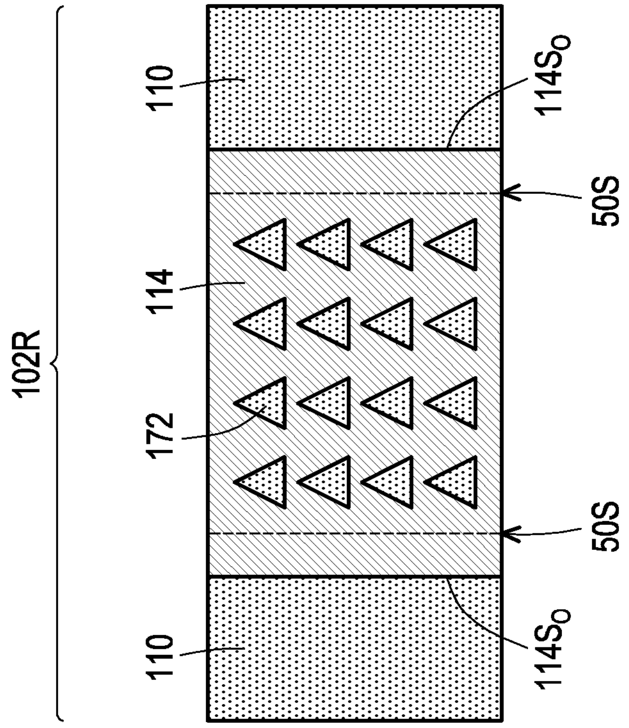
FIGS. 35A and 35B are top-down views of a region of a die structure, in accordance with some embodiments.
Figure 35B:
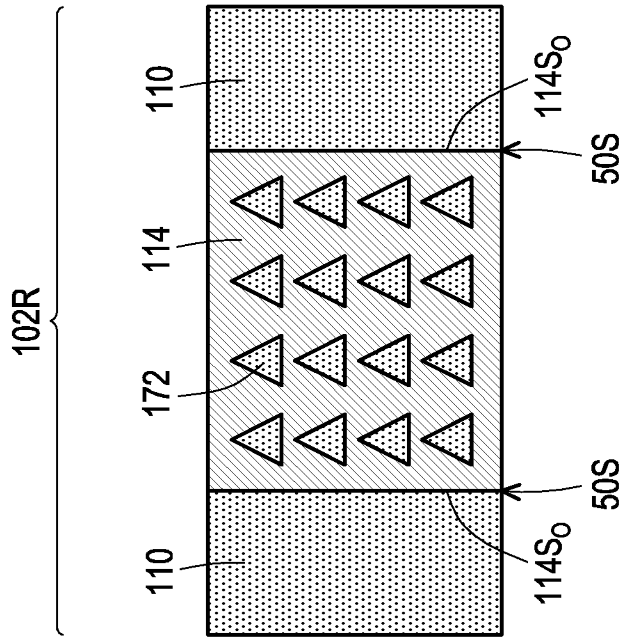

FIGS. 35A and 35B are top-down views of a region 102R in FIG. 26, showing aspects of the protective cap 114, in accordance with some embodiments. These embodiments are similar to the embodiments of FIGS. 31A and 31B, respectively, except the dielectric features 172 have triangle shapes in the top-down views.

As noted above, the die structure 100 is a component that may be packaged to form an integrated circuit package. In a packaging process, the die structure 100 is packaged as if it were an individual die. The conductive features of the redistribution structure 160 may be used for external connections, in a similar manner as the die connectors of an individual die.

Figure 36:
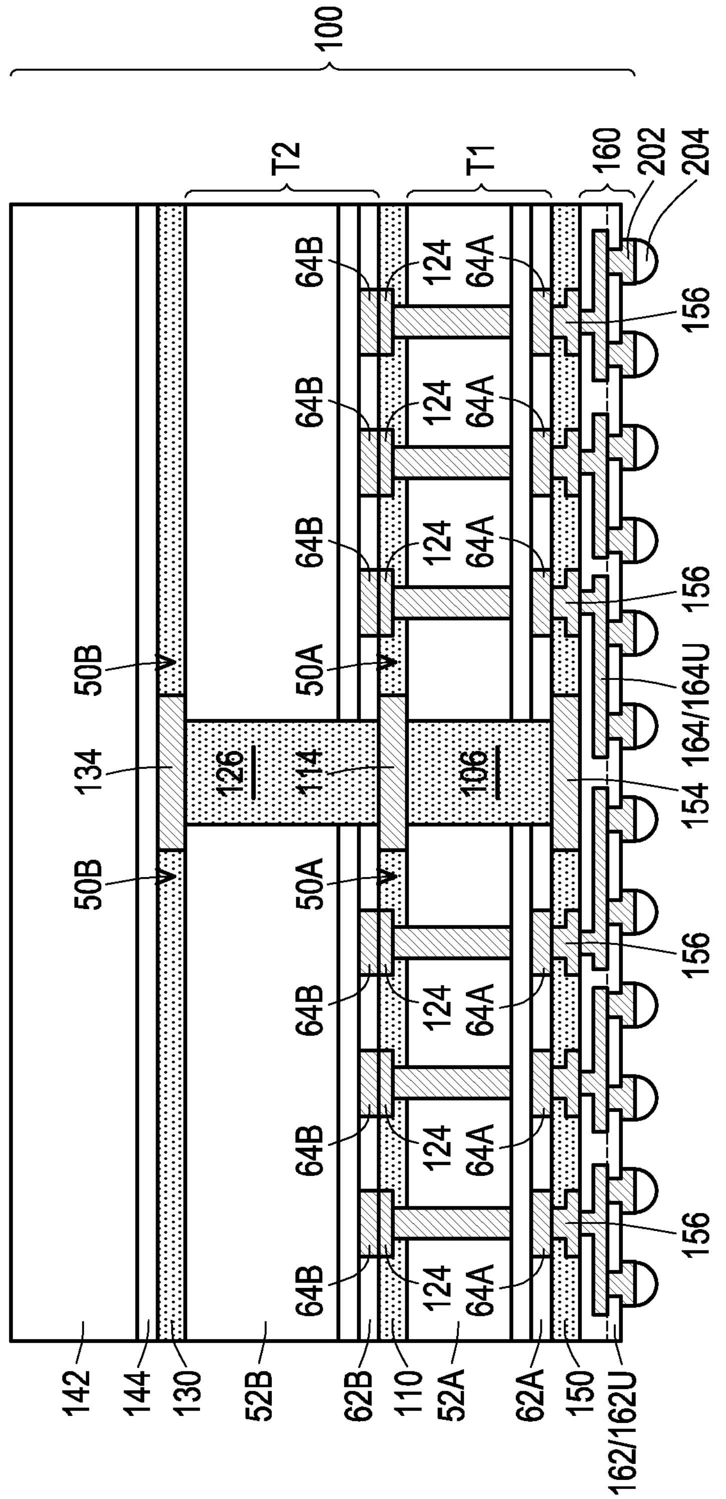
FIGS. 36-37 are cross-sectional views of intermediate stages in the manufacturing of an integrated circuit package, in accordance with some embodiments.
Figure 37:
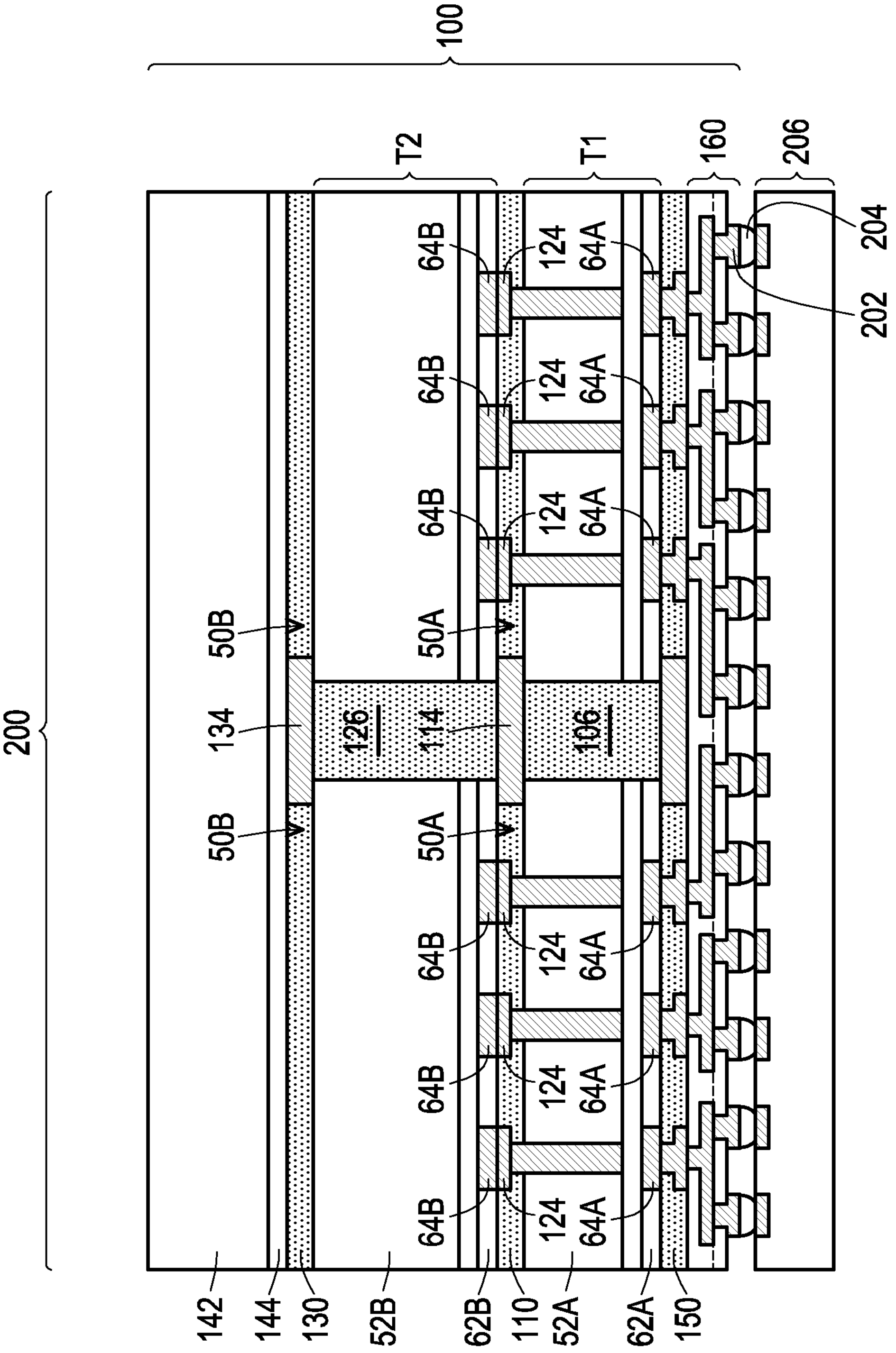

FIGS. 36-37 are cross-sectional views of intermediate stages in the manufacturing of an integrated circuit package 200, in accordance with some embodiments. The integrated circuit package 200 is formed by attaching the die structure 100 to another component, such as an interposer, a packing substrate, or the like.

In FIG. 36, under-bump metallizations (UBMs) 202 are formed for external connection to the redistribution structure 160. The UBMs 202 have bump portions on and extending along the major surface of the upper dielectric layer 162U of the redistribution structure 160, and have via portions extending through the upper dielectric layer 162U of the redistribution structure 160 to physically and electrically couple the upper metallization layer 164U of the redistribution structure 160. As a result, the UBMs 202 are electrically coupled to the integrated circuit dies 50A. The UBMs 202 may be formed of the same material as the metallization layers 164, and may be formed by a similar process as the metallization layers 164. In some embodiments, the UBMs 202 have a different (e.g., larger) size than the metallization layers 164.

Conductive connectors 204 are formed on the UBMs 202. The conductive connectors 204 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 204 may include a conductive material such as solder, copper, aluminum, gold, nickel, silver, palladium, tin, the like, or a combination thereof. In some embodiments, the conductive connectors 204 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 204 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 37, the die structure 100 is attached to another component 206, such as an interposer, a packing substrate, or the like. The die structure 100 may be attached to the component 206 using the conductive connectors 204. In some embodiments, the conductive connectors 204 are reflowed to attach the UBMs 202 to bond pads of the component 206.

FIGS. 38-45 are cross-sectional views of intermediate stages in the manufacturing of an integrated circuit package 200, in accordance with some embodiments. The integrated circuit package 200 is formed by packaging one or more die structures 100 in a package region 208A. The package region 208A will be singulated in subsequent processing to form a first integrated circuit package 200 (see FIG. 45). Processing of one package region 208A is illustrated, but it should be appreciated that any number of package regions 208A can be simultaneously processed to form any number of first integrated circuit packages 200. The first integrated circuit package 200 may be an integrated fan-out (InFO) package, although other types of packages may be formed.

Figure 38:
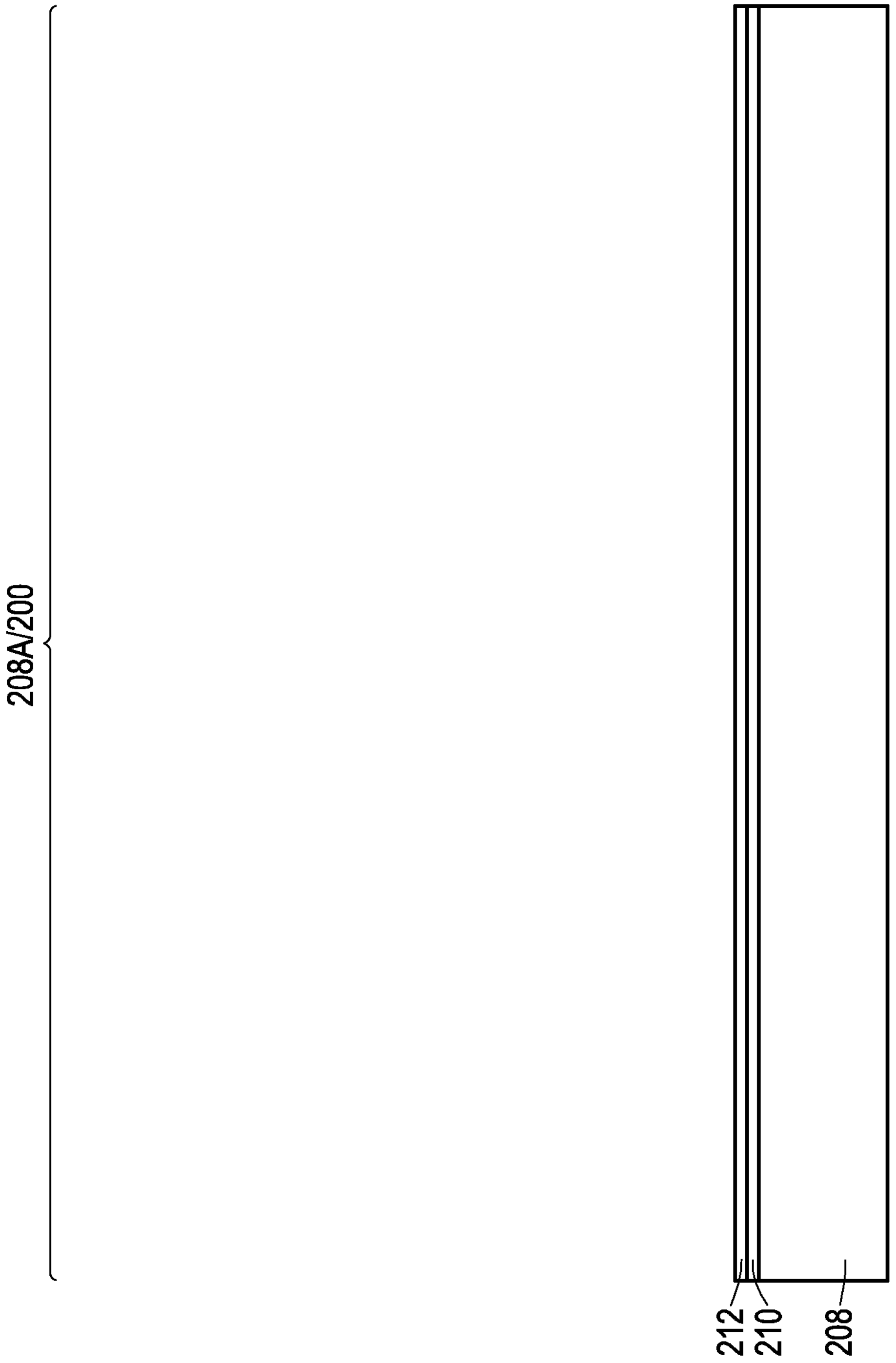
FIGS. 38-45 are cross-sectional views of intermediate stages in the manufacturing of an integrated circuit package, in accordance with some embodiments.

In FIG. 38, a carrier substrate 208 is provided, and a release layer 210 is formed on the carrier substrate 208. The carrier substrate 208 may be a glass carrier substrate, a ceramic carrier substrate, or the like. The carrier substrate 208 may be a wafer, such that multiple packages can be formed on the carrier substrate 208 simultaneously.

The release layer 210 may be formed of a polymer-based material, which may be removed along with the carrier substrate 208 from the overlying structures that will be formed in subsequent steps. In some embodiments, the release layer 210 is an epoxy-based thermal-release material, which loses its adhesive property when heated, such as a light-to-heat-conversion (LTHC) release coating. In other embodiments, the release layer 210 may be an ultra-violet (UV) glue, which loses its adhesive property when exposed to UV light. The release layer 210 may be dispensed as a liquid and cured, may be a laminate film laminated onto the carrier substrate 208, or may be the like. The top surface of the release layer 210 may be leveled and may have a high degree of planarity.

A dielectric layer 212 is formed on the release layer 210. The bottom surface of the dielectric layer 212 may be in contact with the top surface of the release layer 210. In some embodiments, the dielectric layer 212 is formed of a polymer, such as polybenzoxazole (PBO), polyimide, a benzocyclobutene (BCB) based polymer, or the like. In other embodiments, the dielectric layer 212 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 212 may be formed by any acceptable deposition process, such as spin coating, CVD, laminating, the like, or a combination thereof.

Figure 39:
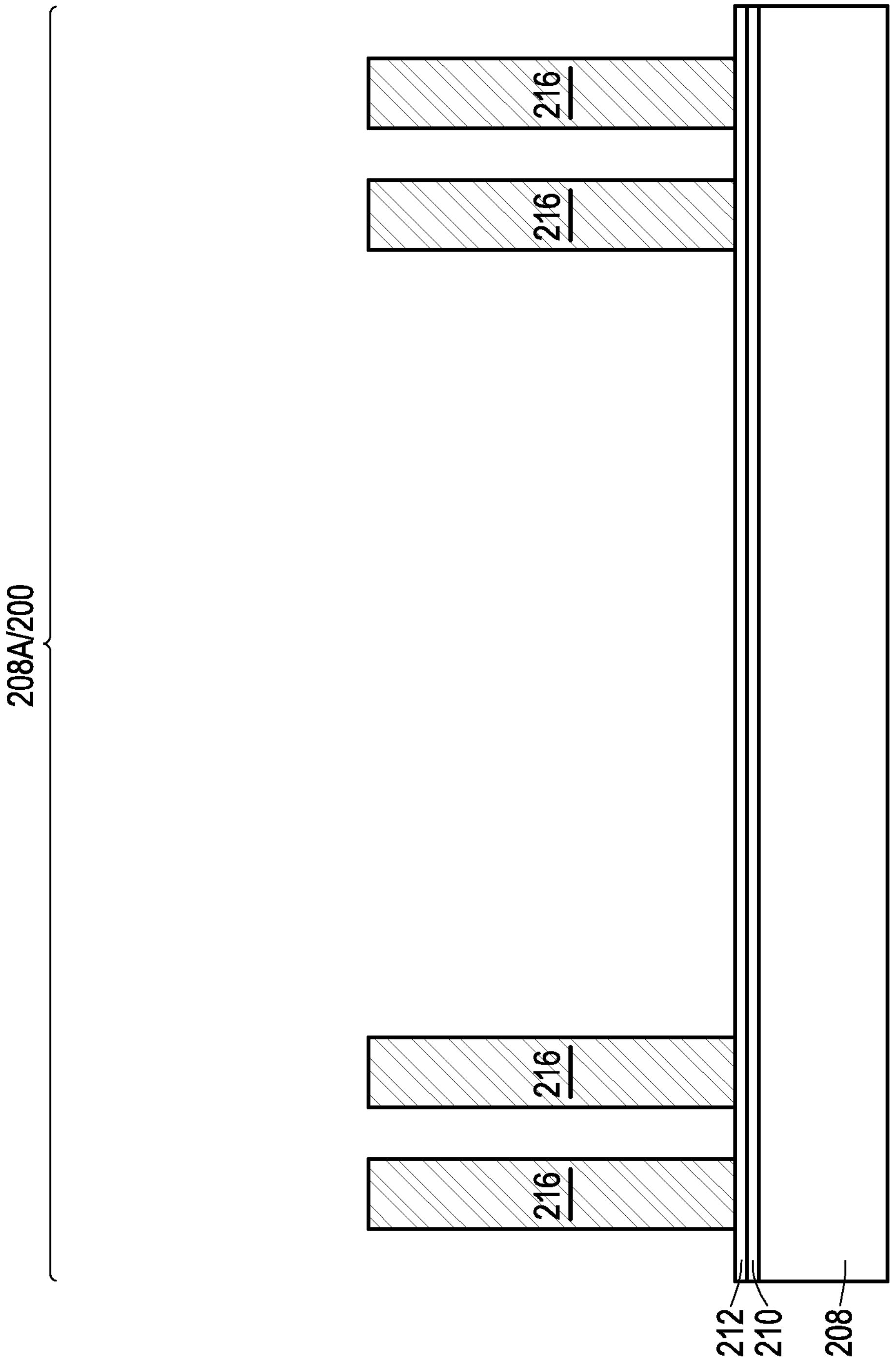

In FIG. 39, through vias 216 are formed on and extending away from the dielectric layer 212. As an example to form the through vias 216, a seed layer (not shown) is formed on the dielectric layer 212. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 216.

Figure 40:
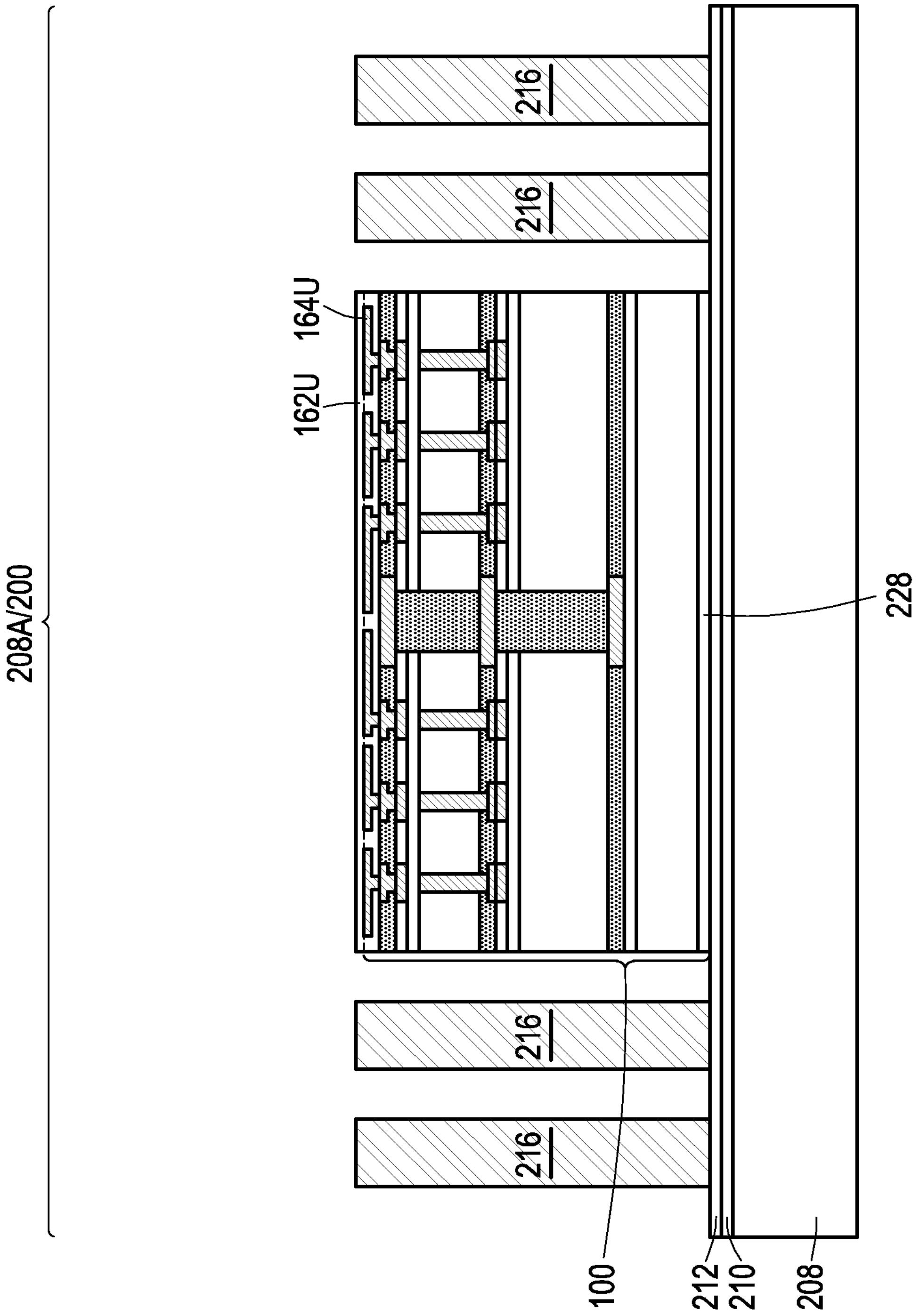

In FIG. 40, a die structure 100 is adhered to the dielectric layer 212 by an adhesive 228. Any desired type and quantity of die structures 100 may be adhered in the package region 208A. The adhesive 228 is on a back side of the die structure 100 and adheres the die structure 100 to the dielectric layer 212. The adhesive 228 may be any suitable adhesive, epoxy, die attach film (DAF), or the like. The adhesive 228 may be applied to the back side of the die structure 100 or may be applied to the top surface of the dielectric layer 212. For example, the adhesive 228 may be applied to the back side of the die structure 100 before singulating to separate the die structure 100.

Figure 41:
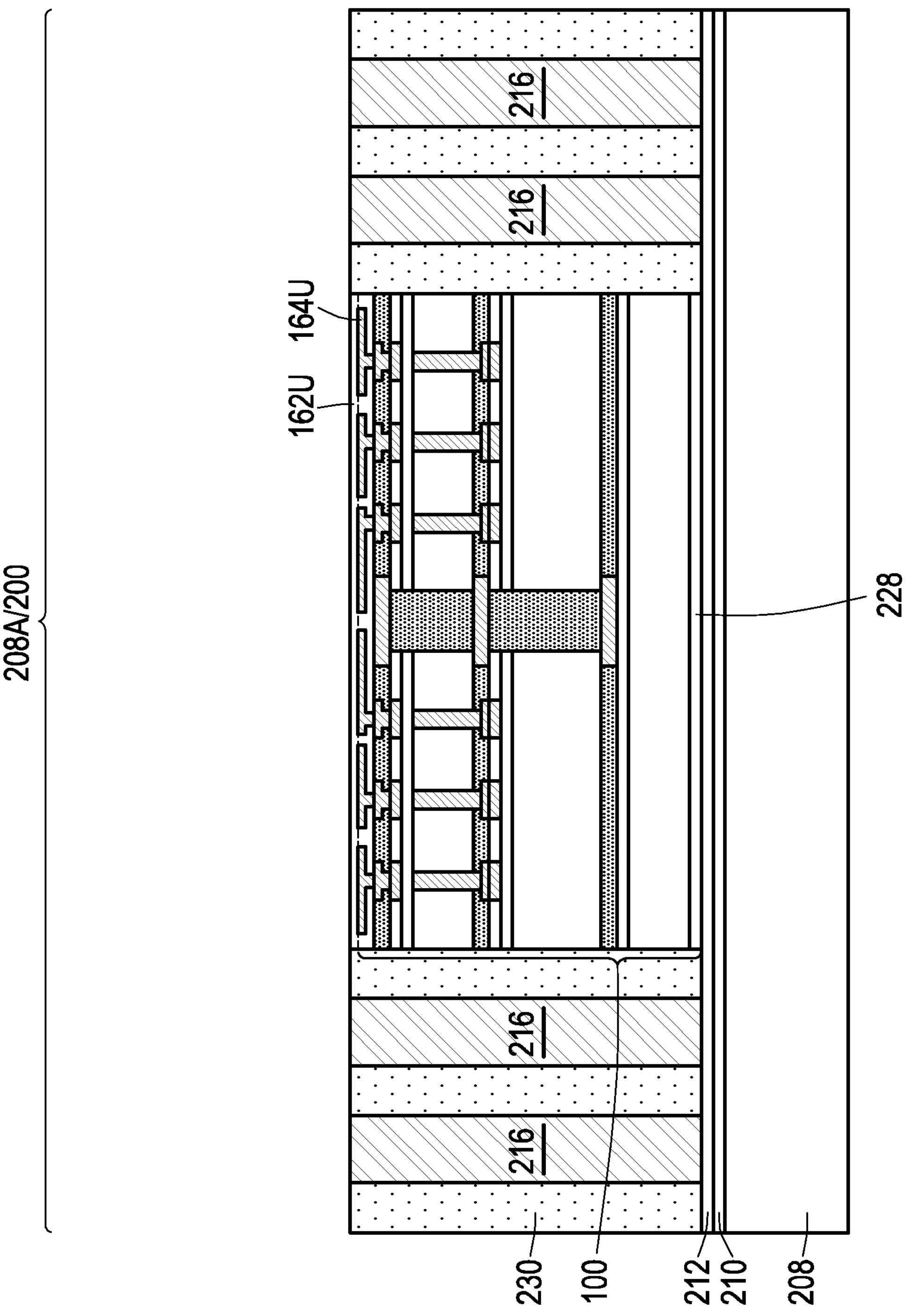

In FIG. 41, an encapsulant 230 is formed on and around the various components. After formation, the encapsulant 230 encapsulates the through vias 216 and the die structure 100. The encapsulant 230 may be a molding compound, epoxy, or the like. The encapsulant 230 may be applied by compression molding, transfer molding, or the like, and may be formed over the carrier substrate 208 such that the through vias 216 and/or the die structure 100 are buried or covered. When multiple die structures 100 are in the package region 208A, the encapsulant 230 is further formed in gap regions between the die structures 100. The encapsulant 230 may be applied in liquid or semi-liquid form and then subsequently cured.

Optionally, a removal process is performed on the encapsulant 230 to expose the through vias 216 and the die structure 100 (e.g., the upper dielectric layer 162U). The removal process may also remove the materials of the encapsulant 230, the through vias 216, and/or the upper dielectric layer 162U until the upper dielectric layer 162U and the through vias 216 are exposed. The removal process may be, for example, a planarization process such as chemical-mechanical polish (CMP), a grinding process, or the like. After the planarization process, the top surfaces of the encapsulant 230, the through vias 216, and the die structure 100 (including the upper dielectric layer 162U) are substantially coplanar (within process variations). In some embodiments, the removal process may be omitted, for example, if the through vias 216 and/or the upper dielectric layer 162U are already exposed. After the removal process, through vias 216 extend through the encapsulant 230. The through vias 216 may be referred to as through-mold vias (TMVs).

Figure 42:
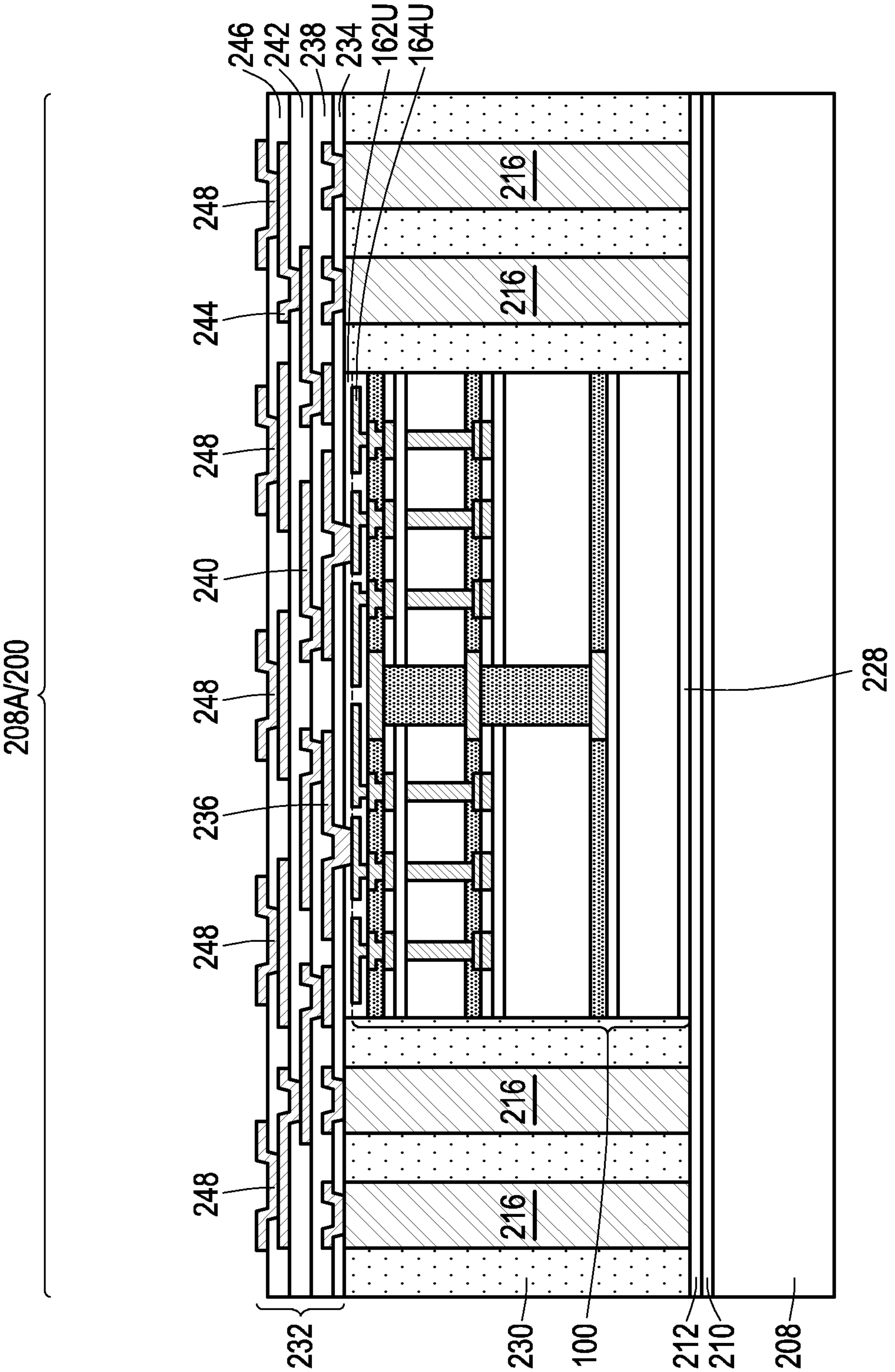

In FIG. 42, a front-side redistribution structure 232 is formed over the encapsulant 230, the through vias 216, and the die structure 100. The front-side redistribution structure 232 includes dielectric layers 234, 238, 242, 246; metallization patterns 236, 240, 244; and UBMs 248. The metallization patterns 236, 240, 244 may also be referred to as redistribution layers or redistribution lines. The front-side redistribution structure 232 is shown as an example having three layers of metallization patterns 236, 240, 244. More or fewer dielectric layers and metallization patterns may be formed in the front-side redistribution structure 232. If fewer dielectric layers and metallization patterns are to be formed, the subsequently described steps and process may be omitted. If more dielectric layers and metallization patterns are to be formed, the subsequently described steps and processes may be repeated.

As an example to form the front-side redistribution structure 232, the dielectric layer 234 is deposited on the encapsulant 230, the through vias 216, and the upper dielectric layer 162U. In some embodiments, the dielectric layer 234 is formed of a photo-sensitive material such as polybenzoxazole (PBO), polyimide, a benzocyclobutene (BCB) based polymer, or the like, which may be patterned using a lithography mask. The dielectric layer 234 may be formed by spin coating, lamination, CVD, the like, or a combination thereof. The dielectric layer 234 is then patterned. The upper dielectric layer 162U is also patterned, and may be patterned by a similar process as that used to pattern the dielectric layer 234. The patterning forms openings exposing portions of the through vias 216 and portions of the upper metallization layer 164U. The patterning may be by an acceptable process, such as by exposing and developing the dielectric layer 234 to light when the dielectric layer 234 is a photosensitive material or by etching using, for example, an anisotropic etch.

The metallization pattern 236 is then formed. The metallization pattern 236 includes line portions on and extending along the major surface of the dielectric layer 234. The metallization pattern 236 further includes via portions extending through the upper dielectric layer 162U and/or the dielectric layer 234 to physically and electrically couple the through vias 216 and the upper metallization layer 164U. As an example to form the metallization pattern 236, a seed layer is formed over the dielectric layer 234 and in the openings extending through the dielectric layer 234 and the upper dielectric layer 162U. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 236. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 236. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 238 is then deposited on the metallization pattern 236 and the dielectric layer 234. The dielectric layer 238 may be formed in a manner similar to the dielectric layer 234, and may be formed of a similar material as the dielectric layer 234.

The metallization pattern 240 is then formed. The metallization pattern 240 includes line portions on and extending along the major surface of the dielectric layer 238. The metallization pattern 240 further includes via portions extending through the dielectric layer 238 to physically and electrically couple the metallization pattern 236. The metallization pattern 240 may be formed in a similar manner and of a similar material as the metallization pattern 236. In some embodiments, the metallization pattern 240 has a different size than the metallization pattern 236. For example, the conductive lines and/or vias of the metallization pattern 240 may be wider or thicker than the conductive lines and/or vias of the metallization pattern 236. Further, the metallization pattern 240 may be formed to a greater pitch than the metallization pattern 236.

The dielectric layer 242 is then deposited on the metallization pattern 240 and the dielectric layer 238. The dielectric layer 242 may be formed in a manner similar to the dielectric layer 234, and may be formed of a similar material as the dielectric layer 234.

The metallization pattern 244 is then formed. The metallization pattern 244 includes line portions on and extending along the major surface of the dielectric layer 242. The metallization pattern 244 further includes via portions extending through the dielectric layer 242 to physically and electrically couple the metallization pattern 240. The metallization pattern 244 may be formed in a similar manner and of a similar material as the metallization pattern 236. The metallization pattern 244 is the upper metallization pattern of the front-side redistribution structure 232. As such, the intermediate metallization patterns of the front-side redistribution structure 232 (e.g., the metallization patterns 236, 240) are disposed between the metallization pattern 244 and the die structure 100. In some embodiments, the metallization pattern 244 has a different size than the metallization patterns 236, 240. For example, the conductive lines and/or vias of the metallization pattern 244 may be wider or thicker than the conductive lines and/or vias of the metallization patterns 236, 240. Further, the metallization pattern 244 may be formed to a greater pitch than the metallization pattern 240.

The dielectric layer 246 is then deposited on the metallization pattern 244 and the dielectric layer 242. The dielectric layer 246 may be formed in a manner similar to the dielectric layer 234, and may be formed of the same material as the dielectric layer 234. The dielectric layer 246 is the upper dielectric layer of the front-side redistribution structure 232. As such, the metallization patterns of the front-side redistribution structure 232 (e.g., the metallization patterns 236, 240, 244) are disposed between the dielectric layer 246 and the die structure 100. Further, the intermediate dielectric layers of the front-side redistribution structure 232 (e.g., the dielectric layers 234, 238, 242) are disposed between the dielectric layer 246 and the die structure 100.

The UBMs 248 are then formed for external connection to the front-side redistribution structure 232. The UBMs 248 include bump portions on and extending along the major surface of the dielectric layer 246. The UBMs 248 further include via portions extending through the dielectric layer 246 to physically and electrically couple the metallization pattern 244. As a result, the UBMs 248 are electrically coupled to the through vias 216 and the upper metallization layer 164U. The UBMs 248 may be formed of the same material as the metallization pattern 236, or may include a different material than the metallization pattern 236. In some embodiments, the UBMs 248 include multiple layers of conductive materials, such as a layer of titanium, a layer of copper, and a layer of nickel. Any suitable materials or layers of material may be used for the UBMs 248. In some embodiments, the UBMs 248 have a different (e.g., larger) size than the metallization patterns 236, 240, 244.

Figure 43:
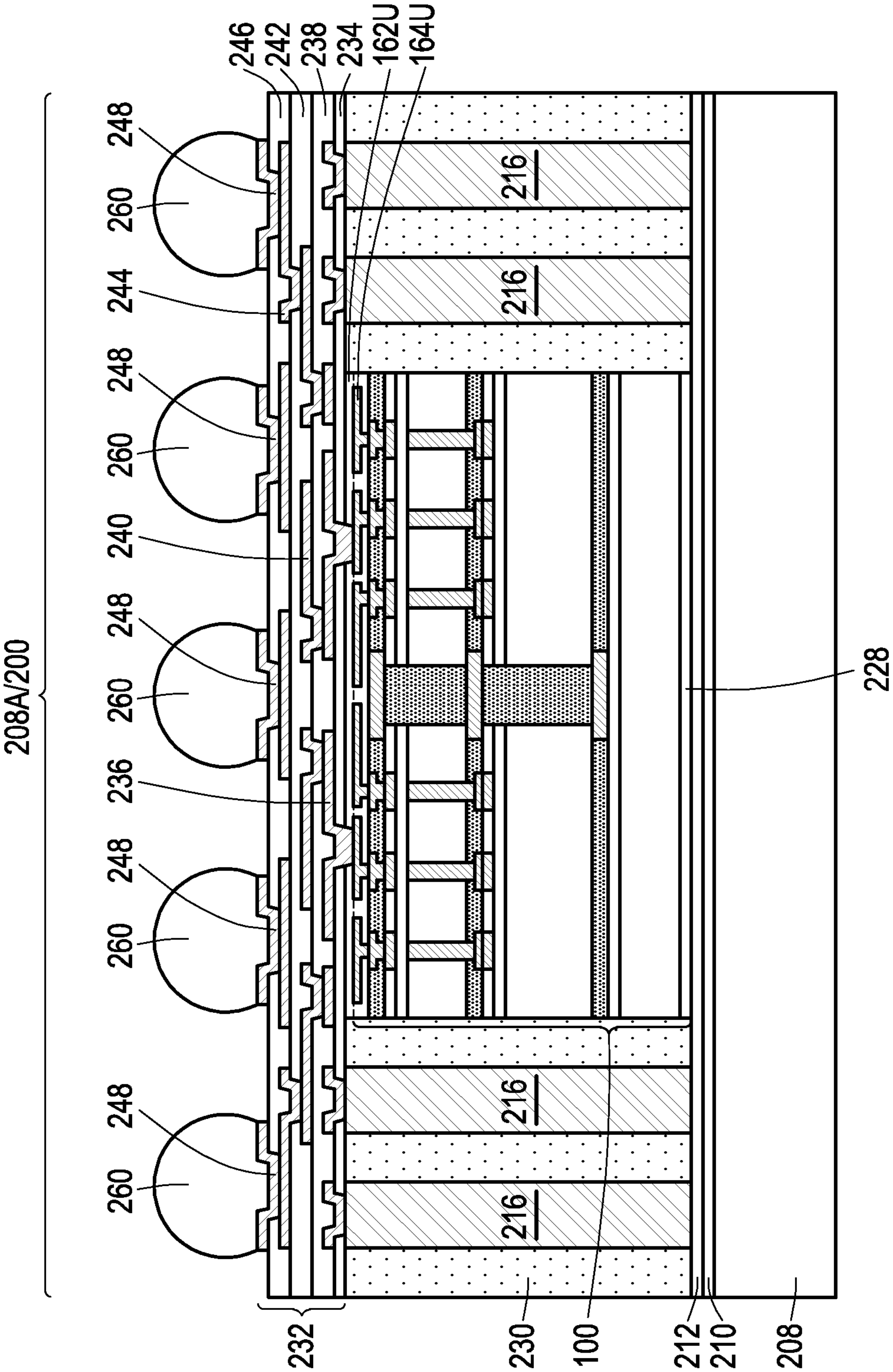

In FIG. 43, conductive connectors 260 are formed on the UBMs 248. The conductive connectors 260 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 260 may include a conductive material such as solder, copper, aluminum, gold, nickel, silver, palladium, tin, the like, or a combination thereof. In some embodiments, the conductive connectors 260 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 260 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 44:
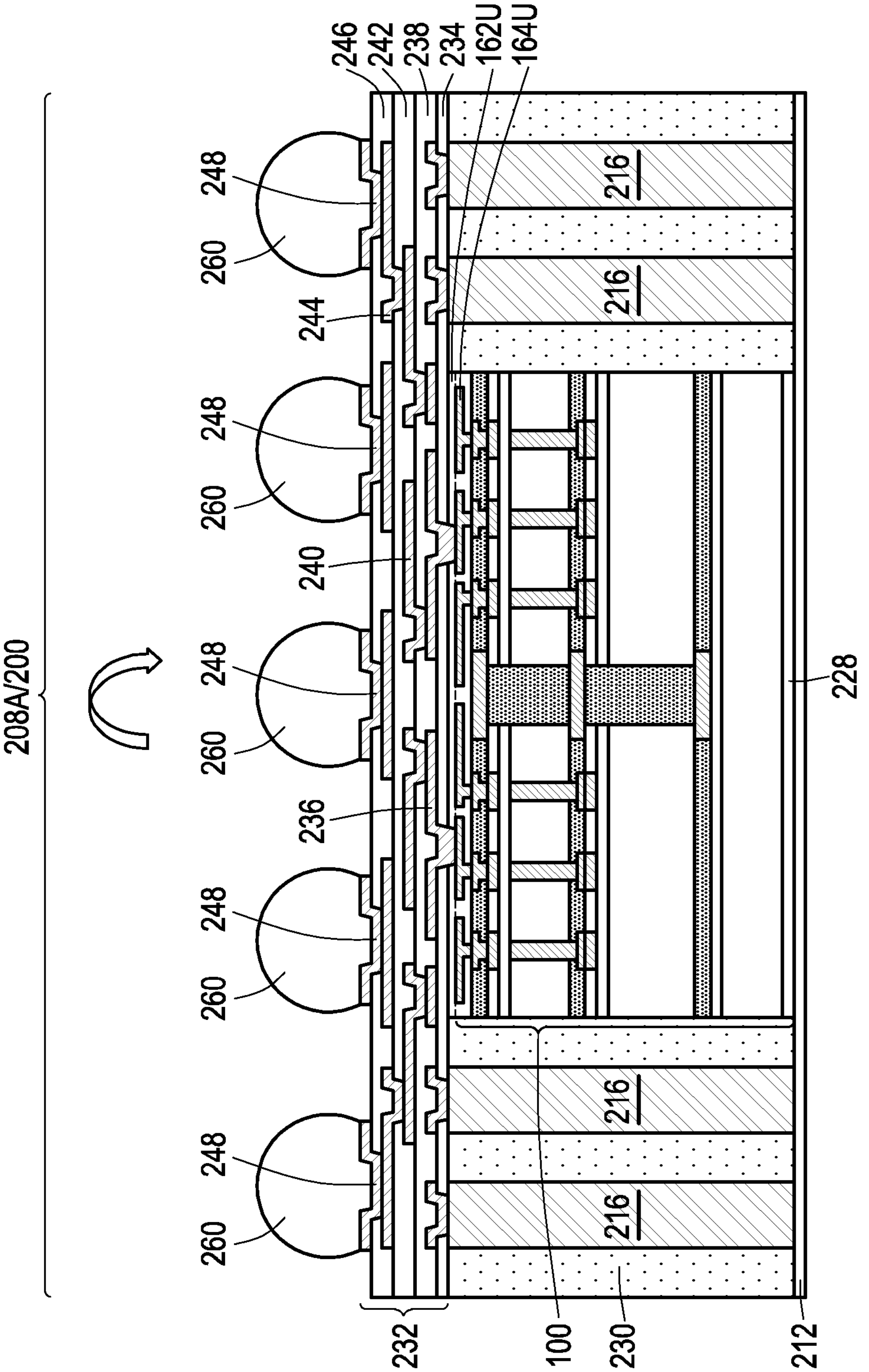

In FIG. 44, a carrier substrate de-bonding is performed to detach (or "de-bond") the carrier substrate 208 from the dielectric layer 212. In some embodiments, the de-bonding includes projecting a light such as a laser light or a UV light on the release layer 210 so that the release layer 210 decomposes under the heat of the light and the carrier substrate 208 can be removed. The structure may then be flipped over and placed on a tape (not separately illustrated).

Figure 45:
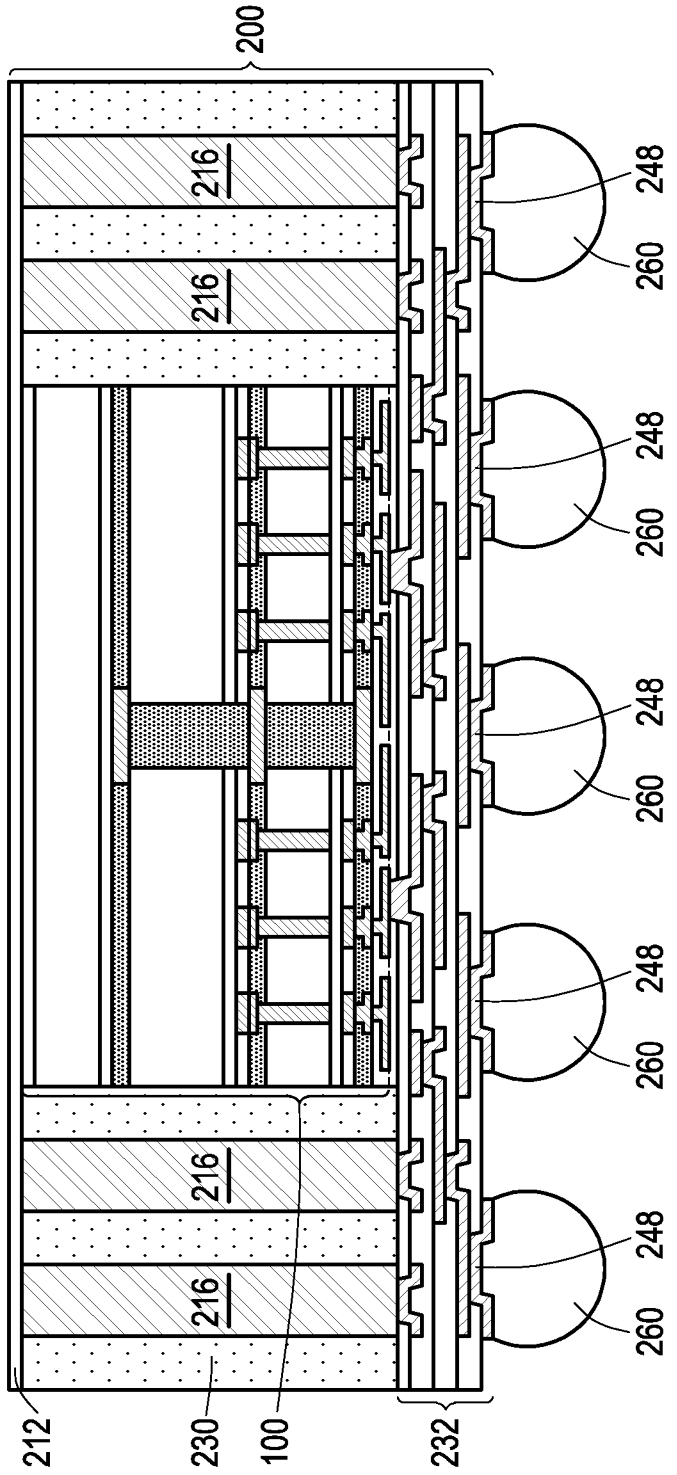

In FIG. 45, a singulation process is performed by sawing along scribe line regions, e.g., around the package region 208A. The sawing singulates the package region 208A from adjacent package regions (not separately illustrated). The resulting, singulated first integrated circuit package 200 is from the package region 208A. After singulation, the dielectric layer 212, the encapsulant 230, and the front-side redistribution structure 232 are laterally coterminous.

The first integrated circuit packages 200 of FIGS. 37 and 45 may be implemented in an integrated circuit device. For example, the first integrated circuit packages 200 may be implemented in a Package-on-Package (PoP) structure, a Flip Chip Ball Grid Array (FCBGA) device, or the like.

Figure 46:
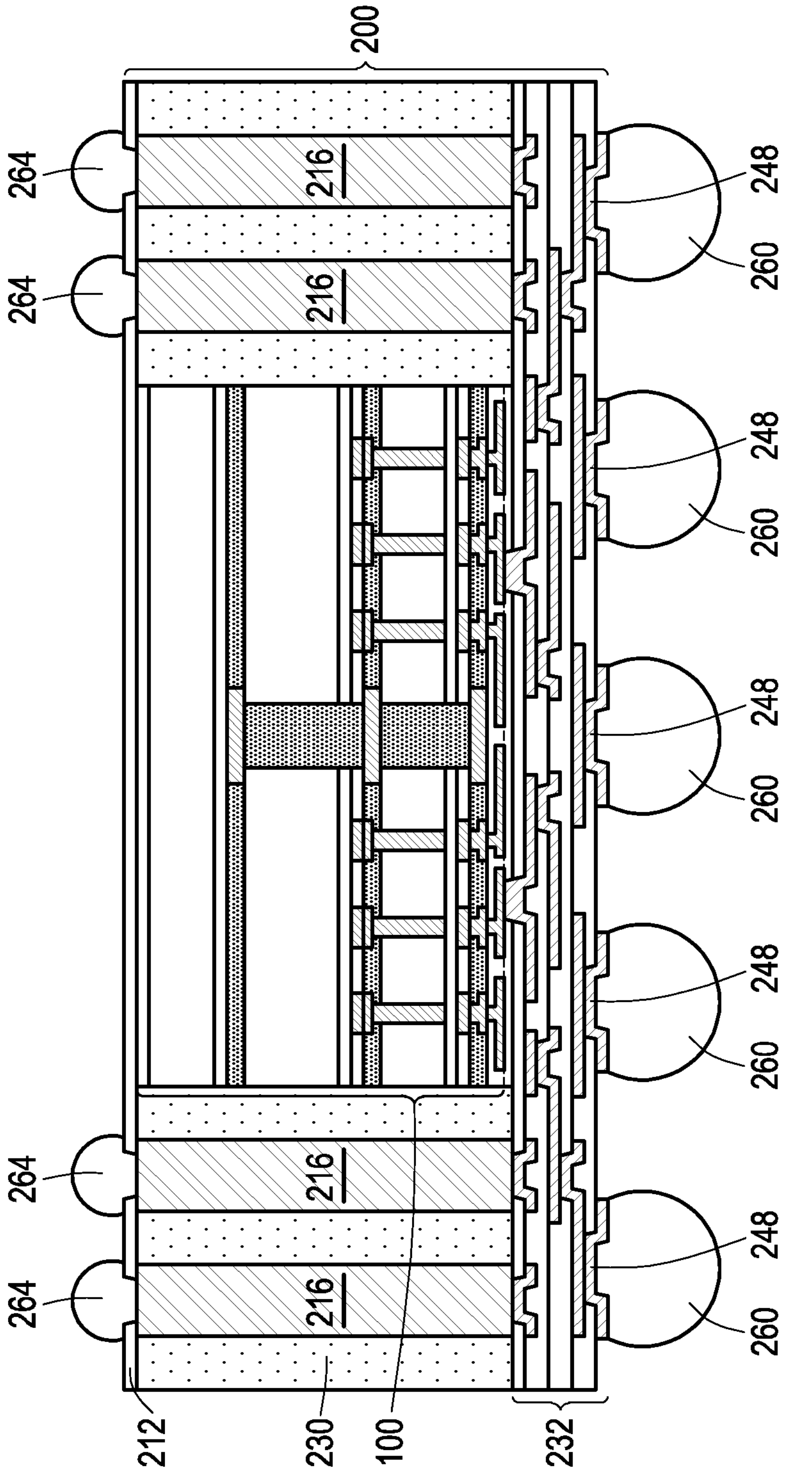
FIGS. 46-48 are cross-sectional views of intermediate stages in the manufacturing of an integrated circuit device, in accordance with some embodiments.
Figure 47:
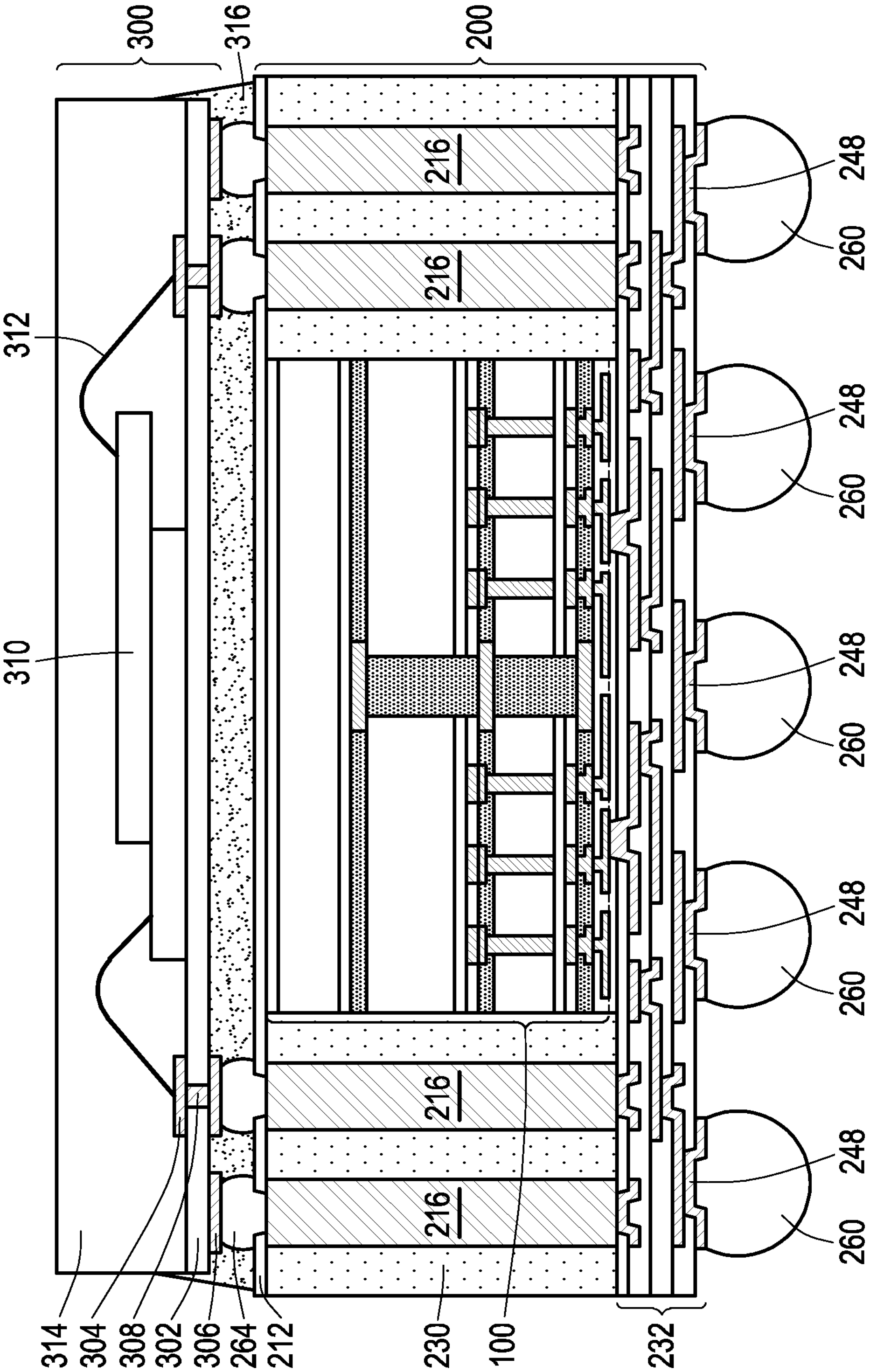
Figure 48:
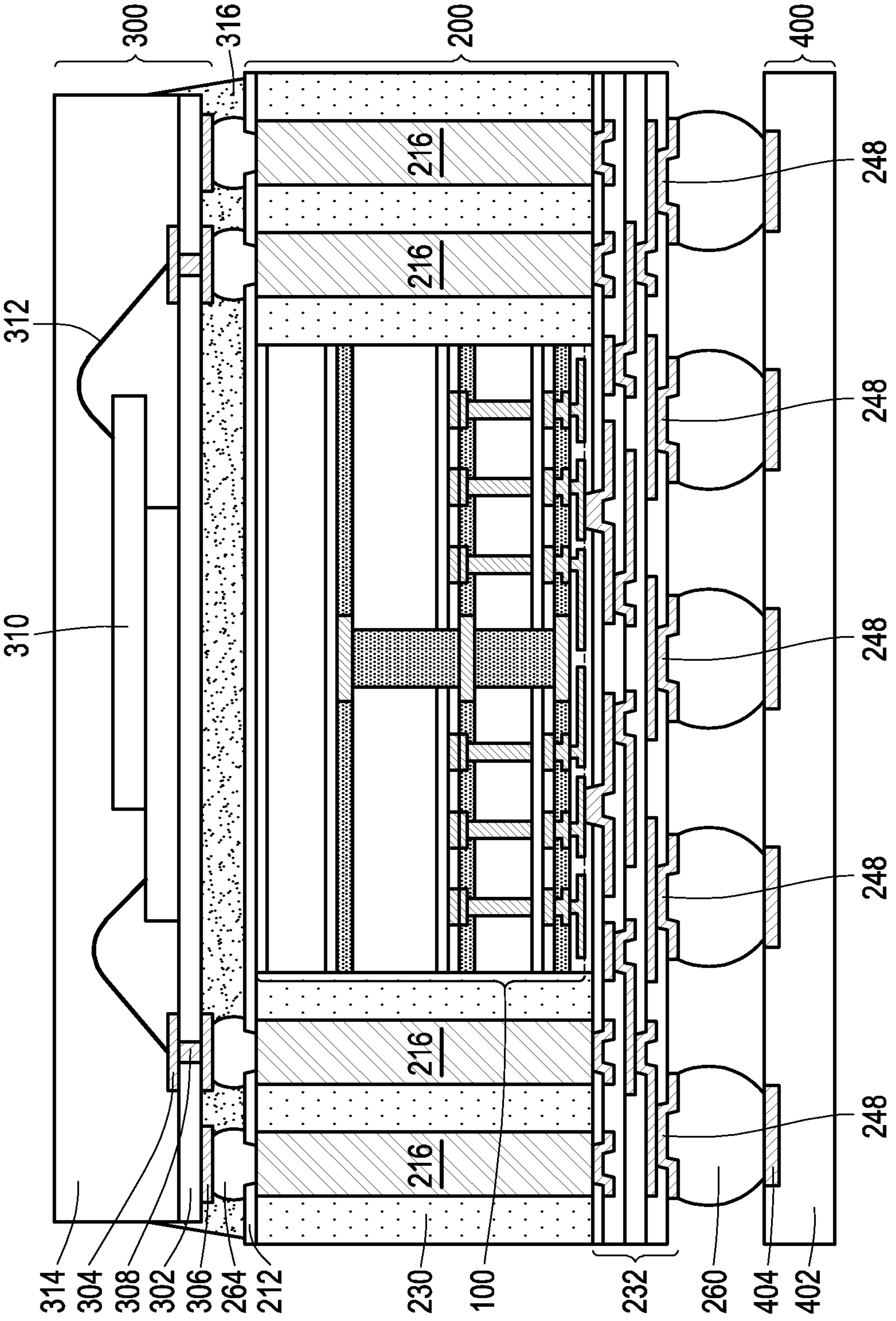

FIGS. 46-48 are cross-sectional views of intermediate stages in the manufacturing of an integrated circuit device, in accordance with some embodiments. Specifically, the integrated circuit device is formed by coupling a second integrated circuit package 300 (see FIG. 47) to the first integrated circuit package 200 of FIG. 45 to form a device stack. The second integrated circuit package 300 can be attached to the first integrated circuit package 200 before or after the first integrated circuit package 200 is singulated. The device stack be a package-on-package (PoP) structure. The device stack will then be mounted to a package substrate 400 (see FIG. 48) to form the resulting integrated circuit device.

In FIG. 46, conductive connectors 264 are formed extending through the dielectric layer 212 to contact the through vias 216. Openings are formed through the dielectric layer 212 to expose portions of the through vias 216. The openings may be formed, for example, using laser drilling, etching, or the like. The conductive connectors 264 are formed in the openings. In some embodiments, the conductive connectors 264 comprise flux and are formed in a flux dipping process. In some embodiments, the conductive connectors 264 comprise a conductive paste such as solder paste, silver paste, or the like, and are dispensed in a printing process. In some embodiments, the conductive connectors 264 are formed in a manner similar to the conductive connectors 260, and may be formed of a similar material as the conductive connectors 260.

In FIG. 47, a second integrated circuit package 300 can be attached to the first integrated circuit package 200 to form a package-on-package structure. The second integrated circuit package 300 may be a memory device package.

The second integrated circuit package 300 includes, for example, a substrate 302 and one or more stacked dies 310 coupled to the substrate 302. Although one set of stacked dies 310 is illustrated, in other embodiments, a plurality of stacked dies 310 (each having one or more stacked dies) may be disposed side-by-side coupled to a same surface of the substrate 302. The substrate 302 may be formed of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 302.

The substrate 302 may include active and passive devices (not separately illustrated). A wide variety of devices such as transistors, capacitors, resistors, combinations of these, and the like may be used to generate the structural and functional requirements of the design for the second integrated circuit package 300. The devices may be formed using any suitable methods.

The substrate 302 may also include metallization layers (not separately illustrated) and conductive vias 308. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, dual damascene, or the like). In some embodiments, the substrate 302 is substantially free of active and passive devices.

The substrate 302 may have bond pads 304 on a first side of the substrate 302 to couple to the stacked dies 310, and bond pads 306 on a second side of the substrate 302, the second side being opposite the first side of the substrate 302, to couple to the conductive connectors 264. In some embodiments, the bond pads 304, 306 are formed by forming recesses (not separately illustrated) into dielectric layers (not separately illustrated) on the first and second sides of the substrate 302. The recesses may be formed to allow the bond pads 304, 306 to be embedded into the dielectric layers. In other embodiments, the recesses are omitted as the bond pads 304, 306 may be formed on the dielectric layer. In some embodiments, the bond pads 304, 306 include a thin seed layer (not separately illustrated) formed of copper, titanium, nickel, gold, palladium, the like, or a combination thereof. The conductive material of the bond pads 304, 306 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 304, 306 is copper, tungsten, aluminum, silver, gold, the like, or a combination thereof.

In some embodiments, the bond pads 304, 306 are UBMs that include multiple layers of conductive materials, such as a layer of titanium, a layer of copper, and a layer of nickel. Any suitable materials or layers of material may be used for the bond pads 304, 306. In some embodiments, the conductive vias 308 extend through the substrate 302 and couple at least one of the bond pads 304 to at least one of the bond pads 306.

In the illustrated embodiment, the stacked dies 310 are coupled to the substrate 302 by wire bonds 312, although other connections may be used, such as conductive bumps. In an embodiment, the stacked dies 310 are stacked memory dies. For example, the stacked dies 310 may be memory dies such as low-power (LP) double data rate (DDR) memory modules, such as LPDDR1, LPDDR2, LPDDR3, LPDDR4, or the like.

The stacked dies 310 and the wire bonds 312 may be encapsulated by a molding material 314. The molding material 314 may be molded on the stacked dies 310 and the wire bonds 312, for example, using compression molding. In some embodiments, the molding material 314 is a molding compound, a polymer, an epoxy, silicon oxide filler material, the like, or a combination thereof. A curing process may be performed to cure the molding material 314; the curing process may be a thermal curing, a UV curing, the like, or a combination thereof.

In some embodiments, the stacked dies 310 and the wire bonds 312 are buried in the molding material 314, and after the curing of the molding material 314, a removal process, such as a planarization process or a grinding process, is performed to remove excess portions of the molding material 314 and provide a substantially planar surface for the second integrated circuit package 300.

After the second integrated circuit package 300 is formed, the second integrated circuit package 300 is mechanically and electrically bonded to the first integrated circuit package 200 by way of the conductive connectors 264. In some embodiments, the stacked dies 310 may be coupled to the die structure 100 through the wire bonds 312, the bond pads 304, 306, the conductive vias 308, the conductive connectors 264, the through vias 216, and the front-side redistribution structure 232.

In some embodiments, a solder resist (not separately illustrated) is formed on the side of the substrate 302 opposing the stacked dies 310. The conductive connectors 264 may be disposed in openings in the solder resist to be electrically and mechanically coupled to conductive features (e.g., the bond pads 306) in the substrate 302. The solder resist may be used to protect areas of the substrate 302 from external damage.

In some embodiments, an underfill 316 is formed between the first integrated circuit package 200 and the second integrated circuit package 300, surrounding the conductive connectors 264. The underfill 316 may reduce stress and protect the joints resulting from the reflowing of the conductive connectors 264. The underfill 316 may be formed by a capillary flow process after the second integrated circuit package 300 are attached, or may be formed by a suitable deposition method before the second integrated circuit package 300 are attached.

In some embodiments, the conductive connectors 264 have an epoxy flux (not separately illustrated) formed thereon before they are reflowed with at least some of the epoxy portion of the epoxy flux remaining after the second integrated circuit package 300 are attached to the first integrated circuit package 200. In embodiments where the epoxy flux is formed, it may act as the underfill 316. The underfill 316 may be formed in addition to or in lieu of the epoxy flux.

In FIG. 48, the package-on-package structure is mounted to a package substrate 400 using the conductive connectors 260. The package substrate 400 includes a substrate core 402 and bond pads 404 over the substrate core 402. The substrate core 402 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 402 may be an SOI substrate. Generally, an SOI substrate includes a layer of a semiconductor material such as epitaxial silicon, germanium, silicon germanium, SOI, SGOI, or combinations thereof. The substrate core 402 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 402.

The substrate core 402 may include active and passive devices (not separately illustrated). A wide variety of devices such as transistors, capacitors, resistors, combinations of these, and the like may be used to generate the structural and functional requirements of the design for the device stack. The devices may be formed using any suitable methods.

The substrate core 402 may also include metallization layers and vias, with the bond pads 404 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 402 is substantially free of active and passive devices.

In some embodiments, the conductive connectors 260 are reflowed to attach the first integrated circuit package 200 to the bond pads 404. The conductive connectors 260 electrically and/or physically couple the package substrate 400, including metallization layers in the substrate core 402, to the first integrated circuit package 200, including redistribution lines in the front-side redistribution structure 232. In some embodiments, a solder resist (not separately illustrated) is formed on the substrate core 402. The conductive connectors 260 may be disposed in openings in the solder resist to be electrically and mechanically coupled to the bond pads 404. The solder resist may be used to protect areas of the substrate core 402 from external damage.

The conductive connectors 260 may have an epoxy flux (not separately illustrated) formed thereon before they are reflowed with at least some of the epoxy portion of the epoxy flux remaining after the first integrated circuit package 200 is attached to the package substrate 400. This remaining epoxy portion may act as an underfill to reduce stress and protect the joints resulting from reflowing the conductive connectors 260. In some embodiments, an underfill (not separately illustrated) is formed between the first integrated circuit package 200 and the package substrate 400 and surrounding the conductive connectors 260. The underfill may be formed by a capillary flow process after the first integrated circuit package 200 is attached or may be formed by a suitable deposition method before the first integrated circuit package 200 is attached.

In some embodiments, passive devices (e.g., surface mount devices (SMDs), not separately illustrated) may also be attached to the package substrate 400 (e.g., to the bond pads 404). For example, the passive devices may be bonded to a same surface of the package substrate 400 as the conductive connectors 260. The passive devices may be attached to the package substrate 400 prior to or after mounting the first integrated circuit package 200 on the package substrate 400.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. The protective caps 114, 134, 154 covers the portions of the gap-filling dielectrics 106, 126 between the integrated circuit dies 50A, 50B. The protective caps 114, 134, 154 are formed of a ductile material that helps protect the gap-filling dielectrics 106, 126 during processing by absorbing stress, such as stress from mechanical forces or thermal treatments, so as to reduce the stress exerted on the gap-filling dielectrics 106, 126. The gap-filling dielectrics 106, 126 may be formed of a brittle material (e.g., an oxide) and protecting the brittle material from stress can reduce the risk of cracks forming and/or propagating in the gap-filling dielectrics 106, 126 during processing. The risk of damage to the components of the die structure 100 may be reduced, thereby increasing the reliability of the die structure 100.

In an embodiment, a device includes: a first integrated circuit die; a second integrated circuit die; a gap-fill dielectric between a first sidewall of the first integrated circuit die and a second sidewall of the second integrated circuit die; a protective cap overlapping the gap-fill dielectric, the first sidewall of the first integrated circuit die, and the second sidewall of the second integrated circuit die; and an isolation layer around the protective cap, the isolation layer disposed on the first integrated circuit die, and the second integrated circuit die. In some embodiments of the device, the gap-fill dielectric has a first width between the first sidewall of the first integrated circuit die and the second sidewall of the second integrated circuit die, the protective cap has a second width between a first outer sidewall and a second outer sidewall of the protective cap, and the second width is greater than the first width. In some embodiments of the device, the gap-fill dielectric has a first width between the first sidewall of the first integrated circuit die and the second sidewall of the second integrated circuit die, the protective cap has a second width between a first outer sidewall and a second outer sidewall of the protective cap, and the second width is substantially equal to the first width. In some embodiments of the device, the protective cap and the isolation layer are disposed at front sides of the first integrated circuit die and the second integrated circuit die. In some embodiments of the device, the protective cap and the isolation layer are disposed at back sides of the first integrated circuit die and the second integrated circuit die. In some embodiments, the device further includes: die connectors in the isolation layer, the die connectors electrically coupled to the first integrated circuit die and the second integrated circuit die. In some embodiments, the device further includes: a redistribution structure on the isolation layer, the redistribution structure including metallization layers electrically coupled to the die connectors. In some embodiments of the device, the protective cap includes a ductile material.

In an embodiment, a device includes: a first tier of first integrated circuit dies; a second tier of second integrated circuit dies; an isolation layer between the first tier of the first integrated circuit dies and the second tier of the second integrated circuit dies; a crack-stopping structure extending through the isolation layer, the crack-stopping structure electrically isolated from the first integrated circuit dies and the second integrated circuit dies; and a dielectric feature extending through the crack-stopping structure, the crack-stopping structure extending completely around the dielectric feature in a top-down view, the dielectric feature including a same material as the isolation layer. In some embodiments of the device, the crack-stopping structure is a metal ring in the top-down view. In some embodiments of the device, inner sidewalls of the metal ring form sharp corners in the top-down view. In some embodiments of the device, inner sidewalls of the metal ring form rounded corners in the top-down view. In some embodiments of the device, the crack-stopping structure is a metal mesh in the top-down view.

In an embodiment, a method includes: forming a first gap-filling dielectric between a first integrated circuit die and a second integrated circuit die; depositing an isolation layer on the first gap-filling dielectric, the first integrated circuit die, and the second integrated circuit die; patterning an opening in the isolation layer, the opening exposing the first gap-filling dielectric, the first integrated circuit die, and the second integrated circuit die; and forming a protective cap in the opening, a surface of the protective cap being substantially coplanar with a surface of the isolation layer. In some embodiments of the method, forming the first gap-filling dielectric includes: depositing silicon oxide between the first integrated circuit die and the second integrated circuit die. In some embodiments of the method, forming the protective cap in the opening includes: plating a ductile material in in the opening; and planarizing the ductile material and the isolation layer. In some embodiments, the method further includes: forming die connectors in the isolation layer; and bonding a third integrated circuit die and a fourth integrated circuit die to the isolation layer and the die connectors. In some embodiments, the method further includes: forming a second gap-filling dielectric between the third integrated circuit die and the fourth integrated circuit die, the protective cap disposed between the first gap-filling dielectric and the second gap-filling dielectric. In some embodiments, the method further includes: forming die connectors in the isolation layer; and bonding a bridge die to the isolation layer and the die connectors. In some embodiments, the method further includes: forming die connectors in the isolation layer, the die connectors electrically coupled to the first integrated circuit die and the second integrated circuit die; and forming a redistribution structure on the isolation layer, the redistribution structure including metallization layers electrically coupled to the die connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first gap-filling dielectric between a first integrated circuit die and a second integrated circuit die;

depositing an isolation layer on the first gap-filling dielectric, the first integrated circuit die, and the second integrated circuit die;

patterning an opening in the isolation layer, the opening exposing the first gap-filling dielectric, the first integrated circuit die, and the second integrated circuit die; and after patterning the opening in the isolation layer, forming a protective cap in the opening, a surface of the protective cap being substantially coplanar with a surface of the isolation layer.

2. The method of claim 1, wherein forming the first gap-filling dielectric comprises:

depositing silicon oxide between the first integrated circuit die and the second integrated circuit die.

3. The method of claim 1, wherein forming the protective cap in the opening comprises:

plating a ductile material in the opening; and planarizing the ductile material and the isolation layer.

4. The method of claim 1 further comprising:

forming die connectors in the isolation layer; and bonding a third integrated circuit die and a fourth integrated circuit die to the isolation layer and the die connectors.

5. The method of claim 4 further comprising:

forming a second gap-filling dielectric between the third integrated circuit die and the fourth integrated circuit die, the protective cap disposed between the first gap-filling dielectric and the second gap-filling dielectric.

6. The method of claim 1 further comprising:

forming die connectors in the isolation layer; and bonding a bridge die to the isolation layer and the die connectors.

7. The method of claim 1 further comprising:

forming die connectors in the isolation layer, the die connectors electrically coupled to the first integrated circuit die and the second integrated circuit die; and forming a redistribution structure on the isolation layer, the redistribution structure comprising metallization layers electrically coupled to the die connectors.

8. The method of claim 1, wherein the protective cap is a crack-stopping structure.

9. A method comprising:

forming a gap-fill dielectric between a first sidewall of a first integrated circuit die and a second sidewall of a second integrated circuit die;

depositing an isolation layer on the first integrated circuit die and the second integrated circuit die;

patterning an opening in the isolation layer exposing the gap-fill dielectric; and forming a protective cap in the opening, wherein the protective cap extends continuously across the gap-fill dielectric, the first sidewall of the first integrated circuit die, and the second sidewall of the second integrated circuit die.

10. The method of claim 9, wherein the gap-fill dielectric has a first width between the first sidewall of the first integrated circuit die and the second sidewall of the second integrated circuit die, the protective cap has a second width between a first sidewall and a second sidewall of the opening, and the second width is greater than the first width.

11. The method of claim 9, wherein the gap-fill dielectric has a first width between the first sidewall of the first integrated circuit die and the second sidewall of the second integrated circuit die, the protective cap has a second width between a first sidewall and a second sidewall of the opening, and the second width is substantially equal to the first width.

12. The method of claim 9, wherein the isolation layer is deposited at front sides of the first integrated circuit die and the second integrated circuit die.

13. The method of claim 9, wherein the isolation layer is deposited at back sides of the first integrated circuit die and the second integrated circuit die.

14. The method of claim 9 further comprising:

forming die connectors in the isolation layer, the die connectors electrically coupled to the first integrated circuit die and the second integrated circuit die.

15. The method of claim 14 further comprising:

forming a redistribution structure on the isolation layer, the redistribution structure comprising metallization layers electrically coupled to the die connectors.

16. A method comprising:

placing first integrated circuit dies;

depositing an isolation layer on the first integrated circuit dies;

forming a crack-stopping structure extending through the isolation layer, the crack-stopping structure extending completely around a portion of the isolation layer in a top-down view, the crack-stopping structure electrically isolated from the first integrated circuit dies; and forming second integrated circuit dies on the isolation layer, the crack-stopping structure electrically isolated from the second integrated circuit dies.

17. The method of claim 16, wherein the crack-stopping structure is a metal mesh in the top-down view.

18. The method of claim 17, wherein inner sidewalls of the metal mesh form sharp corners in the top-down view.

19. The method of claim 17, wherein inner sidewalls of the metal mesh form rounded corners in the top-down view.

20. The method of claim 16, wherein the crack-stopping structure is a metal ring in the top-down view.

* * * * *